United States Patent [19]
Anderson et al.

[11] Patent Number: 5,406,279
[45] Date of Patent: Apr. 11, 1995

[54] GENERAL PURPOSE, HASH-BASED TECHNIQUE FOR SINGLE-PASS LOSSLESS DATA COMPRESSION

[75] Inventors: Kent D. Anderson, Arvada; Neal Glover, Broomfield, both of Colo.

[73] Assignee: Cirrus Logic, Inc., Fremont, Calif.

[21] Appl. No.: 939,895

[22] Filed: Sep. 2, 1992

[51] Int. Cl.$^6$ ............................................. H03M 7/30
[52] U.S. Cl. ........................................ 341/51; 341/65
[58] Field of Search .................... 341/51, 50, 55, 65, 341/87, 95, 106; 364/260.6

[56] References Cited

U.S. PATENT DOCUMENTS

| | | |
|---|---|---|
| 4,464,650 | 8/1984 | Eastman et al. |
| 4,531,200 | 7/1985 | Whitley ............................... 364/900 |
| 4,558,302 | 12/1985 | Welch |
| 4,562,577 | 12/1985 | Glover et al. |
| 4,564,941 | 1/1986 | Woolley et al. |
| 4,564,945 | 1/1986 | Glover et al. |
| 4,695,949 | 9/1987 | Thatte et al. ........................ 364/200 |
| 4,701,745 | 10/1987 | Waterworth |
| 4,730,348 | 3/1988 | MacCrisken |
| 4,763,332 | 8/1988 | Glover |
| 4,906,991 | 3/1990 | Fiala et al. |
| 5,003,307 | 3/1991 | Whiting et al. |
| 5,016,009 | 5/1991 | Whiting et al. |
| 5,049,881 | 9/1991 | Gibson et al. |
| 5,051,745 | 9/1991 | Katz |
| 5,058,144 | 10/1991 | Fiala et al. |
| 5,140,321 | 8/1992 | Jung |

OTHER PUBLICATIONS

*Dictionary Techniques*, Bell, Timothy C., Cleary, John G., and Witten, Ian H., *Text Compression*, pp. 214–226, pub. by Prentice Hall, Englewood Cliffs, N.J. (1990).

"New Asymptotic Bounds and Improvements on the Lempel–Ziv Data Compression Algorithm" IEEE Tractions on Information Theory vol. 27, No. 3, pp. 721–729 by Paul E. Beneder, et al., May 1981.

"Data Compression via Textual Substitution" Journal of the Association for Computing Machinery vol. 29, No. 4, pp. 928–951 by Storer et al. Oct. 1982.

"A Universal Algorithm for Sequential Data Compression" IEEE Transactions on Information Theory, vol. IT–23, No. 3, pp. 337–343 by Ziv et al., Jul. 1986.

"A Technique for High–Performance Data Compression" IEEE, pp. 8–19, by Welch et al., 1984.

*A Method for the Construction of Minimum–Redundancy Codes*, by David A. Huffman, Proceedings of the IRE, vol. 40, Sep. 1952, pp. 1098–1101.

*An Introduction to Arithmetic Coding*, Langdon, Jr., Glen G., IBM Journal of Resarch and Development, vol. 28, No. 2, pp. 135–349, Mar. 1984.

*Better OPM/L Text Compression*, Bell, Timothy C., IEEE Transactions on Communications, vol. COM–34, No. 12, Dec. 1986, pp. 1176–1182.

*Linear Algorithm for Data Compression via String Matching*, Rodeh, Michael, Pratt, Vaughan R., and Even, Shimon, Journal of the Association for Computing Machinery, vol. 28, No. 1, Jan. 1981, pp. 16–24.

*Primary Examiner*—Brian K. Young
*Attorney, Agent, or Firm*—Roger W. Blakely, Jr.; William E. Alford; Gary B. Goates

[57] ABSTRACT

A general-purpose, single-pass, adaptive, and lossless data compression invention implements an LZ1-like method using a hash-based architecture. It is suitable for use in data storage and data communications applications. Implementation efficiency, in terms of required memory and logic gates relative to the typical compression ratio achieved, is highly optimized. An easy-to-implement and quick-to-verify hash function is used. Differential copy lengths may be used to reduce the number of bits required to encode the copy-length field within copy tokens. That is, if multiple matches to a sequence of input bytes are found in the current window, then the length of the copy may be encoded as the difference between the lengths of the longest and the second-longest match, which results in a smaller copy length which likely has a shorter encoded representation. To further increase the compression achieved, literals are not used, but rather input bytes without window matches are mapped into alphabet tokens of variable length using a unary-length code. Other unary-length codes are used to represent the copy-length field and the displacement field within copy tokens.

96 Claims, 33 Drawing Sheets

| STEP NUMBER | COMPRESSION WINDOW BEFORE STEP | | | | INPUT BYTE STREAM REMAINING BEFORE STEP | OUTPUT TOKEN PRODUCED IN STEP |
|---|---|---|---|---|---|---|
| 100 | | | | | x y x y y y x y z z z z z x x x x x y z z z y | Lx |
| 101 | | | | x | y x y y y x y z z z z z x x x x x y z z z y | Ly |
| 102 | | | x | y | x y y y x y z z z z z x x x x x y z z z y | C2,2 |
| 103 | | x | y | y | y x y y z z z z z x x x x x y z z z y | C3,5 |
| 104 | x | y | y | y | z z z z z x x x x x y z z z y | Lz |
| 105 | y | y | y | x | z z z z x x x x x y z z z y | C1,4 |
| 106 | y | y | x | z | x x x x x y z z z y | Lx |
| 107 | y | x | z | z | x x x x y z z z y | C1,6 |
| 108 | x | z | z | x | y z z z y | Ly |
| 109 | z | z | x | x | z z z y | Lz |
| 110 | z | x | x | y | z z y | C1,2 |
| 111 | x | x | y | z | y | Ly or C4,1 |
| DISPLACEMENT | 4 | 3 | 2 | 1 | | |

INPUT BYTE STREAM: x y x y y y x y z z z z z x x x x x y z z z y
OUTPUT TOKEN STREAM: Lx Ly C2,2 C3,5 Lz C1,4 Lx C1,6 Ly Lz C1,2 Ly

FIG. 1 (Prior Art)

| CURRENT INPUT BYTE | PREVIOUS INPUT BYTE | ACTION TAKEN BY COMPRESSOR | OUTPUT TOKEN GENERATED | PACKED OUTPUT BYTE | BITS REMAINING TO BE PACKED |
|---|---|---|---|---|---|
| 1) 55 | | Update window. | | | |
| 2) aa | 55 | Update window and reference table (done for each subsequent input byte received). Current and previous bytes do not match window, so compress and output previous input byte. | 0, 1111010101 | 1) 75 | 01 |
| 3) 00 | aa | Compress and output previous input byte. | 0, 111101010 | 2) 5e | 1010 |
| 4) fe | 00 | Compress and output previous input byte. | 0, 0100000 | 3) a2 | 0000 |
| 5) fe | fe | Compress and output previous input byte. | 0, 0011110 | 4) 01 | 1110 |
| 6) 55 | fe | Compress and output previous input byte. | 0, 0011110 | 5) e1 | 1110 |
| 7) aa | 55 | Current and previous bytes match window, so enter search-in-progress state. | | | 1110 |
| 8) fe | aa | Current byte does not match window, so enter no-search-in-progress state (done whenever copy token is output) and output copy token of displacement 4 and length 2. | 1, 00001, 0 | 6) e8 | 010 |
| 9) fe | fe | Enter search-in-progress state. | | | 010 |
| 10) 7d | fe | Output copy token: displacement 3, length 2. | 1, 00110, 0 | 7) 53 | 00 |
| 11) 55 | 7d | Compress and output previous input byte. | 0, 10011101 | 8) 13 | 101 |
| 12) aa | 55 | Enter search-in-progress state. | | | 101 |

FIG. 8 (a)

| CURRENT INPUT BYTE | PREVIOUS INPUT BYTE | ACTION TAKEN BY COMPRESSOR | OUTPUT TOKEN GENERATED | PACKED OUTPUT BYTE | BITS REMAINING TO BE PACKED |
|---|---|---|---|---|---|
| 13) 00 | aa | Current byte matches window, so remain in search-in-progress state. | | | 101 |
| 14) fe | 00 | Remain in search-in-progress state. | | | 101 |
| 15) fe | fe | Remain in search-in-progress state. | | | 101 |
| 16) 7c | fe | Output copy token: displacement 9, length 5. | 1, 011001, 1101 | 9) b6 | 011101 |
| 17) 55 | 7c | Compress and output previous input byte. | 0, 10011100 | 10) 75 | 0011100 |
| 18) aa | 55 | Enter search-in-progress state. | | | 0011100 |
| 19) 00 | aa | Remain in search-in-progress state. | | | 0011100 |
| 20) fe | 00 | Remain in search-in-progress state. | | | 0011100 |
| 21) fe | fe | Remain in search-in-progress state. | | | 0011100 |
| 22) 7b | fe | Output copy token: displacement 5, length 5. | 1, 00101, 1101 | 11) 39<br>12) 2e | 1 |
| 23) fe | 7b | Compress and output previous input byte. | 0, 10011011 | 13) a6 | 11 |
| 24) 55 | fe | Enter search-in-progress state. | | | 11 |
| 25) aa | 55 | Remain in search-in-progress state. | | | 11 |
| 26) fe | aa | Remain in search-in-progress state. | | | 11 |
| 27) fe | fe | Remain in search-in-progress state. | | | 11 |
| 28) 7d | fe | Remain in search-in-progress state. | | | 11 |
| 29) 55 | 7d | Remain in search-in-progress state. | | | 11 |
| 30) aa | 55 | Remain in search-in-progress state. | | | 11 |

FIG. 8 (b)

| CURRENT INPUT BYTE | PREVIOUS INPUT BYTE | ACTION TAKEN BY COMPRESSOR | OUTPUT TOKEN GENERATED | PACKED OUTPUT BYTE | BITS REMAINING TO BE PACKED |
|---|---|---|---|---|---|
| 31) 50 | aa | Output copy token: displacement 17, length 8. | 1, 011000, 111000 | 14) ec | 0111000 |
| 32) fe | 50 | Compress and output previous input byte. | 0, 111010000 | 15) 70<br>16) e8 | 0 |
| None | fe | Compress and output previous input byte. | 0, 0011110 | 17) 0f | 0 |
| None | None | Pad bits remaining to make whole final byte. | | 18) 00 | |

INPUT BYTE STREAM: 55 aa 00 fe fe 55 aa fe fe 7d 55 aa 00 fe fe 7c 55 aa 00 fe fe 7b fe 55 aa fe fe 7d 55 aa 50 fe
OUTPUT BYTE STREAM: 75 5e a2 01 e1 e8 53 13 b6 75 39 2e a6 ec 70 e8 0f 00
COMPRESSION RATIO: 32 bytes to 18 bytes, or 1.778 to

FIG. 8 (c)

| CURRENT INPUT BYTE | PREVIOUS INPUT BYTE | ACTION TAKEN BY COMPRESSOR | OUTPUT TOKEN GENERATED | PACKED OUTPUT BYTE | BITS REMAINING TO BE PACKED |
|---|---|---|---|---|---|
| 1) 55 | | Update window. | | | |
| 2) aa | 55 | Update window and reference table (done for each subsequent input byte received). Current and previous bytes do not match window, so compress and output previous input byte. | 0, 1111010101 | 1) 75 | 01 |
| 3) 00 | aa | Compress and output previous input byte. | 0, 111101010 | 2) 5e | 1010 |
| 4) fe | 00 | Compress and output previous input byte. | 0, 0100000 | 3) a2 | 0000 |
| 5) fe | fe | Compress and output previous input byte. | 0, 0011110 | 4) 01 | 1110 |
| 6) 55 | fe | Compress and output previous input byte. | 0, 0011110 | 5) e1 | 1110 |
| 7) aa | 55 | Current and previous bytes match window, so enter search-in-progress state. | | | 1110 |
| 8) fe | aa | Current byte does not match window, so enter no-search-in-progress state (done whenever copy token is output) and output copy token of displacement 4 and length 2. | 1, 00001, 0 | 6) e8 | 010 |
| 9) fe | fe | Enter search-in-progress state. | | | 010 |
| 10) 7d | fe | Output copy token: displacement 3, length 2. | 1, 00110, 0 | 7) 53 | 00 |
| 11) 55 | 7d | Compress and output previous input byte. | 0, 10011101 | 8) 13 | 101 |
| 12) aa | 55 | Enter search-in-progress state with two candidates for a longest match starting with the first and sixth input bytes | | | 101 |

FIG. 14 (a)

| CURRENT INPUT BYTE | PREVIOUS INPUT BYTE | ACTION TAKEN BY COMPRESSOR | OUTPUT TOKEN GENERATED | PACKED OUTPUT BYTE | BITS REMAINING TO BE PACKED |
|---|---|---|---|---|---|
| 13) 00 | aa | Current byte matches window, but only for the older of the two longest match candidates. Second longest match has length 2. Remain in search in progress state. | | | 101 |
| 14) fe | 00 | Remain in search-in-progress state. | | | 101 |
| 15) fe | fe | Remain in search-in-progress state. | | | 101 |
| 16) 7c | fe | Output copy token: displacement 9, differential length 3 (which is 5 - 2). | 1, 011001, 10 | 9) b6 | 0110 |
| 17) 55 | 7c | Compress and output previous input byte. | 0, 10011100 | 10) 64 | 11100 |
| 18) aa | 55 | Enter search-in-progress state. | | | 11100 |
| 19) 00 | aa | Remain in search-in-progress state. | | | 11100 |
| 20) fe | 00 | Remain in search-in-progress state. | | | 11100 |
| 21) fe | fe | Remain in search-in-progress state. | | | 11100 |
| 22) 7b | fe | Output copy token: displacement 5, length 5. | 1, 00101, 1101 | 11) e4 | 1011101 |
| 23) fe | 7b | Compress and output previous input byte. | 0, 10011011 | 12) ba 13) 9b | |
| 24) 55 | fe | Enter search-in-progress state. | | | |
| 25) aa | 55 | Remain in search-in-progress state. | | | |
| 26) fe | aa | Remain in search-in-progress state. | | | |
| 27) fe | fe | Remain in search-in-progress state. | | | |

FIG. 14 (b)

| CURRENT INPUT BYTE | PREVIOUS INPUT BYTE | ACTION TAKEN BY COMPRESSOR | OUTPUT TOKEN GENERATED | PACKED OUTPUT BYTE | BITS REMAINING TO BE PACKED |
|---|---|---|---|---|---|
| 28) 7d | fe | Remain in search-in-progress state. | | | |
| 29) 55 | 7d | Remain in search-in-progress state. | | | |
| 30) aa | 55 | Remain in search-in-progress state. | | | |
| 31) 50 | aa | Output copy token: displacement 17, length 8. | 1, 011000, 111000 | 14) b1 | 11000 |
| 32) fe | 50 | Compress and output previous input byte. | 0, 111010000 | 15) c3 | 1010000 |
| None | fe | Compress and output previous input byte. | 0, 0011110 | 17) a0 | 0011110 |
| None | None | Pad bits remaining to make whole final byte. | | 18) 3c | |

FIG. 14 (c)

| UNMATCHED INPUT BYTE VALUE (DECIMAL) | REMAPPED BYTE VALUE (DECIMAL) | OUTPUT TOKEN (BINARY) |
|---|---|---|
| 224 | 0 | 0 000000 |
| 225 | 1 | 0 000001 |
| . . . | . . . | . . . |
| 254 | 30 | 0 011110 |
| 255 | 31 | 0 011111 |
| 0 | 32 | 0 100000 |
| 1 | 33 | 0 100001 |
| . . . | . . . | . . . |
| 30 | 62 | 0 111110 |
| 31 | 63 | 0 111111 |
| 96 | 64 | 10 000000 |
| 97 | 65 | 10 000001 |
| . . . | . . . | . . . |
| 126 | 94 | 10 011110 |
| 127 | 95 | 10 011111 |
| 32 | 96 | 10 100000 |
| 33 | 97 | 10 100001 |
| . . . | . . . | . . . |
| 62 | 126 | 10 111110 |
| 63 | 127 | 10 111111 |

FIG. 17 (a)

| UNMATCHED INPUT BYTE VALUE (DECIMAL) | REMAPPED BYTE VALUE (DECIMAL) | OUTPUT TOKEN (BINARY) |
|---|---|---|
| 192 | 128 | 11 0000000 |
| 193 | 129 | 11 0000001 |
| . . . | . . . | . . . |
| 222 | 158 | 11 0011110 |
| 223 | 159 | 11 0011111 |
| 128 | 160 | 11 0100000 |
| 129 | 161 | 11 0100001 |
| . . . | . . . | . . . |
| 158 | 190 | 11 0111110 |
| 159 | 191 | 11 0111111 |
| 64 | 192 | 11 1000000 |
| 65 | 193 | 11 1000001 |
| . . . | . . . | . . . |
| 94 | 222 | 11 1011110 |
| 95 | 223 | 11 1011111 |
| 160 | 224 | 11 1100000 |
| 161 | 225 | 11 1100001 |
| . . . | . . . | . . . |
| 190 | 254 | 11 1111110 |
| 191 | 255 | 11 1111111 |

FIG. 17 (b)

| Length Value (decimal) | Binary Encoded Length value | Length Value (decimal) | Binary Encoded Length value | Length Value (decimal) | Binary Encoded Length value |
|---|---|---|---|---|---|
| 002: | 0 | 050: | 1111110 01001 | 098: | 11111110 010001 |
| 003: | 10 | 051: | 1111110 11001 | 099: | 11111110 110001 |
| 004: | 110 0 | 052: | 1111110 00101 | 100: | 11111110 001001 |
| 005: | 110 1 | 053: | 1111110 10101 | 101: | 11111110 101001 |
| 006: | 1110 01 | 054: | 1111110 01101 | 102: | 11111110 011001 |
| 007: | 1110 11 | 055: | 1111110 11101 | 103: | 11111110 111001 |
| 008: | 1110 00 | 056: | 1111110 00011 | 104: | 11111110 000101 |
| 009: | 1110 10 | 057: | 1111110 10011 | 105: | 11111110 100101 |
| 010: | 11110 010 | 058: | 1111110 01011 | 106: | 11111110 010101 |
| 011: | 11110 110 | 059: | 1111110 11011 | 107: | 11111110 110101 |
| 012: | 11110 001 | 060: | 1111110 00111 | 108: | 11111110 001101 |
| 013: | 11110 101 | 061: | 1111110 10111 | 109: | 11111110 101101 |
| 014: | 11110 011 | 062: | 1111110 01111 | 110: | 11111110 011101 |
| 015: | 11110 111 | 063: | 1111110 11111 | 111: | 11111110 111101 |
| 016: | 11110 000 | 064: | 1111110 00000 | 112: | 11111110 000011 |
| 017: | 11110 100 | 065: | 1111110 10000 | 113: | 11111110 100011 |
| 018: | 111110 0100 | 066: | 11111110 010000 | 114: | 11111110 010011 |
| 019: | 111110 1100 | 067: | 11111110 110000 | 115: | 11111110 110011 |
| 020: | 111110 0010 | 068: | 11111110 001000 | 116: | 11111110 001011 |
| 021: | 111110 1010 | 069: | 11111110 101000 | 117: | 11111110 101011 |
| 022: | 111110 0110 | 070: | 11111110 011000 | 118: | 11111110 011011 |
| 023: | 111110 1110 | 071: | 11111110 111000 | 119: | 11111110 111011 |
| 024: | 111110 0001 | 072: | 11111110 000100 | 120: | 11111110 000111 |
| 025: | 111110 1001 | 073: | 11111110 100100 | 121: | 11111110 100111 |
| 026: | 111110 0101 | 074: | 11111110 010100 | 122: | 11111110 010111 |
| 027: | 111110 1101 | 075: | 11111110 110100 | 123: | 11111110 110111 |
| 028: | 111110 0011 | 076: | 11111110 001100 | 124: | 11111110 001111 |
| 029: | 111110 1011 | 077: | 11111110 101100 | 125: | 11111110 101111 |
| 030: | 111110 0111 | 078: | 11111110 011100 | 126: | 11111110 011111 |
| 031: | 111110 1111 | 079: | 11111110 111100 | 127: | 11111110 111111 |
| 032: | 111110 0000 | 080: | 11111110 000010 | 128: | 11111110 000000 |
| 033: | 111110 1000 | 081: | 11111110 100010 | 129: | 11111110 100000 |
| 034: | 1111110 01000 | 082: | 11111110 010010 | 130: | 111111110 0100000 |
| 035: | 1111110 11000 | 083: | 11111110 110010 | 131: | 111111110 1100000 |
| 036: | 1111110 00100 | 084: | 11111110 001010 | 132: | 111111110 0010000 |
| 037: | 1111110 10100 | 085: | 11111110 101010 | 133: | 111111110 1010000 |
| 038: | 1111110 01100 | 086: | 11111110 011010 | 134: | 111111110 0110000 |
| 039: | 1111110 11100 | 087: | 11111110 111010 | 135: | 111111110 1110000 |
| 040: | 1111110 00010 | 088: | 11111110 000110 | 136: | 111111110 0001000 |
| 041: | 1111110 10010 | 089: | 11111110 100110 | 137: | 111111110 1001000 |
| 042: | 1111110 01010 | 090: | 11111110 010110 | 138: | 111111110 0101000 |
| 043: | 1111110 11010 | 091: | 11111110 110110 | 139: | 111111110 1101000 |
| 044: | 1111110 00110 | 092: | 11111110 001110 | 140: | 111111110 0011000 |
| 045: | 1111110 10110 | 093: | 11111110 101110 | 141: | 111111110 1011000 |
| 046: | 1111110 01110 | 094: | 11111110 011110 | 142: | 111111110 0111000 |
| 047: | 1111110 11110 | 095: | 11111110 111110 | 143: | 111111110 1111000 |
| 048: | 1111110 00001 | 096: | 11111110 000001 | 144: | 111111110 0000100 |
| 049: | 1111110 10001 | 097: | 11111110 100001 | 145: | 111111110 1000100 |

FIG. 18 (a)

| Length Value (decimal) | Binary Encoded Length value | Length Value (decimal) | Binary Encoded Length value | Length Value (decimal) | Binary Encoded Length value |
|---|---|---|---|---|---|
| 146: | 111111110 0100100 | 194: | 111111110 0100001 | 242: | 111111110 0100111 |
| 147: | 111111110 1100100 | 195: | 111111110 1100001 | 243: | 111111110 1100111 |
| 148: | 111111110 0010100 | 196: | 111111110 0010001 | 244: | 111111110 0010111 |
| 149: | 111111110 1010100 | 197: | 111111110 1010001 | 245: | 111111110 1010111 |
| 150: | 111111110 0110100 | 198: | 111111110 0110001 | 246: | 111111110 0110111 |
| 151: | 111111110 1110100 | 199: | 111111110 1110001 | 247: | 111111110 1110111 |
| 152: | 111111110 0001100 | 200: | 111111110 0001001 | 248: | 111111110 0001111 |
| 153: | 111111110 1001100 | 201: | 111111110 1001001 | 249: | 111111110 1001111 |
| 154: | 111111110 0101100 | 202: | 111111110 0101001 | 250: | 111111110 0101111 |
| 155: | 111111110 1101100 | 203: | 111111110 1101001 | 251: | 111111110 1101111 |
| 156: | 111111110 0011100 | 204: | 111111110 0011001 | 252: | 111111110 0011111 |
| 157: | 111111110 1011100 | 205: | 111111110 1011001 | 253: | 111111110 1011111 |
| 158: | 111111110 0111100 | 206: | 111111110 0111001 | 254: | 111111110 0111111 |
| 159: | 111111110 1111100 | 207: | 111111110 1111001 | 255: | 111111110 1111111 |
| 160: | 111111110 0000010 | 208: | 111111110 0000101 | 256: | 111111110 0000000 |
| 161: | 111111110 1000010 | 209: | 111111110 1000101 | 257: | 111111110 1000000 |
| 162: | 111111110 0100010 | 210: | 111111110 0100101 | 258: | 1111111110 01000000 |
| 163: | 111111110 1100010 | 211: | 111111110 1100101 | 259: | 1111111110 11000000 |
| 164: | 111111110 0010010 | 212: | 111111110 0010101 | 260: | 1111111110 00100000 |
| 165: | 111111110 1010010 | 213: | 111111110 1010101 | 261: | 1111111110 10100000 |
| 166: | 111111110 0110010 | 214: | 111111110 0110101 | 262: | 1111111110 01100000 |
| 167: | 111111110 1110010 | 215: | 111111110 1110101 | 263: | 1111111110 11100000 |
| 168: | 111111110 0001010 | 216: | 111111110 0001101 | 264: | 1111111110 00010000 |
| 169: | 111111110 1001010 | 217: | 111111110 1001101 | 265: | 1111111110 10010000 |
| 170: | 111111110 0101010 | 218: | 111111110 0101101 | 266: | 1111111110 01010000 |
| 171: | 111111110 1101010 | 219: | 111111110 1101101 | 267: | 1111111110 11010000 |
| 172: | 111111110 0011010 | 220: | 111111110 0011101 | 268: | 1111111110 00110000 |
| 173: | 111111110 1011010 | 221: | 111111110 1011101 | 269: | 1111111110 10110000 |
| 174: | 111111110 0111010 | 222: | 111111110 0111101 | 270: | 1111111110 01110000 |
| 175: | 111111110 1111010 | 223: | 111111110 1111101 | 271: | 1111111110 11110000 |
| 176: | 111111110 0000110 | 224: | 111111110 0000011 | 272: | 1111111110 00001000 |
| 177: | 111111110 1000110 | 225: | 111111110 1000011 | 273: | 1111111110 10001000 |
| 178: | 111111110 0100110 | 226: | 111111110 0100011 | 274: | 1111111110 01001000 |
| 179: | 111111110 1100110 | 227: | 111111110 1100011 | 275: | 1111111110 11001000 |
| 180: | 111111110 0010110 | 228: | 111111110 0010011 | 276: | 1111111110 00101000 |
| 181: | 111111110 1010110 | 229: | 111111110 1010011 | 277: | 1111111110 10101000 |
| 182: | 111111110 0110110 | 230: | 111111110 0110011 | 278: | 1111111110 01101000 |
| 183: | 111111110 1110110 | 231: | 111111110 1110011 | 279: | 1111111110 11101000 |
| 184: | 111111110 0001110 | 232: | 111111110 0001011 | 280: | 1111111110 00011000 |
| 185: | 111111110 1001110 | 233: | 111111110 1001011 | 281: | 1111111110 10011000 |
| 186: | 111111110 0101110 | 234: | 111111110 0101011 | 282: | 1111111110 01011000 |
| 187: | 111111110 1101110 | 235: | 111111110 1101011 | 283: | 1111111110 11011000 |
| 188: | 111111110 0011110 | 236: | 111111110 0011011 | 284: | 1111111110 00111000 |
| 189: | 111111110 1011110 | 237: | 111111110 1011011 | 285: | 1111111110 10111000 |
| 190: | 111111110 0111110 | 238: | 111111110 0111011 | 286: | 1111111110 01111000 |
| 191: | 111111110 1111110 | 239: | 111111110 1111011 | 287: | 1111111110 11111000 |
| 192: | 111111110 0000001 | 240: | 111111110 0000111 | 288: | 1111111110 00000100 |
| 193: | 111111110 1000001 | 241: | 111111110 1000111 | 289: | 1111111110 10000100 |

FIG. 18 (b)

| Length Value (decimal) | Binary Encoded Length value | Length Value (decimal) | Binary Encoded Length value | Length Value (decimal) | Binary Encoded Length value |
|---|---|---|---|---|---|
| 290: | 1111111110 01000100 | 338: | 1111111110 01001010 | 386: | 1111111110 01000001 |
| 291: | 1111111110 11000100 | 339: | 1111111110 11001010 | 387: | 1111111110 11000001 |
| 292: | 1111111110 00100100 | 340: | 1111111110 00101010 | 388: | 1111111110 00100001 |
| 293: | 1111111110 10100100 | 341: | 1111111110 10101010 | 389: | 1111111110 10100001 |
| 294: | 1111111110 01100100 | 342: | 1111111110 01101010 | 390: | 1111111110 01100001 |
| 295: | 1111111110 11100100 | 343: | 1111111110 11101010 | 391: | 1111111110 11100001 |
| 296: | 1111111110 00010100 | 344: | 1111111110 00011010 | 392: | 1111111110 00010001 |
| 297: | 1111111110 10010100 | 345: | 1111111110 10011010 | 393: | 1111111110 10010001 |
| 298: | 1111111110 01010100 | 346: | 1111111110 01011010 | 394: | 1111111110 01010001 |
| 299: | 1111111110 11010100 | 347: | 1111111110 11011010 | 395: | 1111111110 11010001 |
| 300: | 1111111110 00110100 | 348: | 1111111110 00111010 | 396: | 1111111110 00110001 |
| 301: | 1111111110 10110100 | 349: | 1111111110 10111010 | 397: | 1111111110 10110001 |
| 302: | 1111111110 01110100 | 350: | 1111111110 01111010 | 398: | 1111111110 01110001 |
| 303: | 1111111110 11110100 | 351: | 1111111110 11111010 | 399: | 1111111110 11110001 |
| 304: | 1111111110 00001100 | 352: | 1111111110 00000110 | 400: | 1111111110 00001001 |
| 305: | 1111111110 10001100 | 353: | 1111111110 10000110 | 401: | 1111111110 10001001 |
| 306: | 1111111110 01001100 | 354: | 1111111110 01000110 | 402: | 1111111110 01001001 |
| 307: | 1111111110 11001100 | 355: | 1111111110 11000110 | 403: | 1111111110 11001001 |
| 308: | 1111111110 00101100 | 356: | 1111111110 00100110 | 404: | 1111111110 00101001 |
| 309: | 1111111110 10101100 | 357: | 1111111110 10100110 | 405: | 1111111110 10101001 |
| 310: | 1111111110 01101100 | 358: | 1111111110 01100110 | 406: | 1111111110 01101001 |
| 311: | 1111111110 11101100 | 359: | 1111111110 11100110 | 407: | 1111111110 11101001 |
| 312: | 1111111110 00011100 | 360: | 1111111110 00010110 | 408: | 1111111110 00011001 |
| 313: | 1111111110 10011100 | 361: | 1111111110 10010110 | 409: | 1111111110 10011001 |
| 314: | 1111111110 01011100 | 362: | 1111111110 01010110 | 410: | 1111111110 01011001 |
| 315: | 1111111110 11011100 | 363: | 1111111110 11010110 | 411: | 1111111110 11011001 |
| 316: | 1111111110 00111100 | 364: | 1111111110 00110110 | 412: | 1111111110 00111001 |
| 317: | 1111111110 10111100 | 365: | 1111111110 10110110 | 413: | 1111111110 10111001 |
| 318: | 1111111110 01111100 | 366: | 1111111110 01110110 | 414: | 1111111110 01111001 |
| 319: | 1111111110 11111100 | 367: | 1111111110 11110110 | 415: | 1111111110 11111001 |
| 320: | 1111111110 00000010 | 368: | 1111111110 00001110 | 416: | 1111111110 00000101 |
| 321: | 1111111110 10000010 | 369: | 1111111110 10001110 | 417: | 1111111110 10000101 |
| 322: | 1111111110 01000010 | 370: | 1111111110 01001110 | 418: | 1111111110 01000101 |
| 323: | 1111111110 11000010 | 371: | 1111111110 11001110 | 419: | 1111111110 11000101 |
| 324: | 1111111110 00100010 | 372: | 1111111110 00101110 | 420: | 1111111110 00100101 |
| 325: | 1111111110 10100010 | 373: | 1111111110 10101110 | 421: | 1111111110 10100101 |
| 326: | 1111111110 01100010 | 374: | 1111111110 01101110 | 422: | 1111111110 01100101 |
| 327: | 1111111110 11100010 | 375: | 1111111110 11101110 | 423: | 1111111110 11100101 |
| 328: | 1111111110 00010010 | 376: | 1111111110 00011110 | 424: | 1111111110 00010101 |
| 329: | 1111111110 10010010 | 377: | 1111111110 10011110 | 425: | 1111111110 10010101 |
| 330: | 1111111110 01010010 | 378: | 1111111110 01011110 | 426: | 1111111110 01010101 |
| 331: | 1111111110 11010010 | 379: | 1111111110 11011110 | 427: | 1111111110 11010101 |
| 332: | 1111111110 00110010 | 380: | 1111111110 00111110 | 428: | 1111111110 00110101 |
| 333: | 1111111110 10110010 | 381: | 1111111110 10111110 | 429: | 1111111110 10110101 |
| 334: | 1111111110 01110010 | 382: | 1111111110 01111110 | 430: | 1111111110 01110101 |
| 335: | 1111111110 11110010 | 383: | 1111111110 11111110 | 431: | 1111111110 11110101 |
| 336: | 1111111110 00001010 | 384: | 1111111110 00000001 | 432: | 1111111110 00001101 |
| 337: | 1111111110 10001010 | 385: | 1111111110 10000001 | 433: | 1111111110 10001101 |

FIG. 18 (c)

| Length Value (decimal) | Binary Encoded Length value | Length Value (decimal) | Binary Encoded Length value | Length Value (decimal) | Binary Encoded Length value |
|---|---|---|---|---|---|
| 434: | 1111111110 01001101 | 482: | 1111111110 01000111 | | |
| 435: | 1111111110 11001101 | 483: | 1111111110 11000111 | | |
| 436: | 1111111110 00101101 | 484: | 1111111110 00100111 | | |
| 437: | 1111111110 10101101 | 485: | 1111111110 10100111 | | |
| 438: | 1111111110 01101101 | 486: | 1111111110 01100111 | | |
| 439: | 1111111110 11101101 | 487: | 1111111110 11100111 | | |
| 440: | 1111111110 00011101 | 488: | 1111111110 00010111 | | |
| 441: | 1111111110 10011101 | 489: | 1111111110 10010111 | | |
| 442: | 1111111110 01011101 | 490: | 1111111110 01010111 | | |
| 443: | 1111111110 11011101 | 491: | 1111111110 11010111 | | |
| 444: | 1111111110 00111101 | 492: | 1111111110 00110111 | | |
| 445: | 1111111110 10111101 | 493: | 1111111110 10110111 | | |
| 446: | 1111111110 01111101 | 494: | 1111111110 01110111 | | |
| 447: | 1111111110 11111101 | 495: | 1111111110 11110111 | | |
| 448: | 1111111110 00000011 | 496: | 1111111110 00001111 | | |
| 449: | 1111111110 10000011 | 497: | 1111111110 10001111 | | |
| 450: | 1111111110 01000011 | 498: | 1111111110 01001111 | | |
| 451: | 1111111110 11000011 | 499: | 1111111110 11001111 | | |
| 452: | 1111111110 00100011 | 500: | 1111111110 00101111 | | |
| 453: | 1111111110 10100011 | 501: | 1111111110 10101111 | | |
| 454: | 1111111110 01100011 | 502: | 1111111110 01101111 | | |
| 455: | 1111111110 11100011 | 503: | 1111111110 11101111 | | |
| 456: | 1111111110 00010011 | 504: | 1111111110 00011111 | | |
| 457: | 1111111110 10010011 | 505: | 1111111110 10011111 | | |
| 458: | 1111111110 01010011 | 506: | 1111111110 01011111 | | |
| 459: | 1111111110 11010011 | 507: | 1111111110 11011111 | | |
| 460: | 1111111110 00110011 | 508: | 1111111110 00111111 | | |
| 461: | 1111111110 10110011 | 509: | 1111111110 10111111 | | |
| 462: | 1111111110 01110011 | 510: | 1111111110 01111111 | | |
| 463: | 1111111110 11110011 | 511: | 1111111110 11111111 | | |
| 464: | 1111111110 00001011 | | | | |
| 465: | 1111111110 10001011 | | | | |
| 466: | 1111111110 01001011 | | | | |
| 467: | 1111111110 11001011 | | | | |
| 468: | 1111111110 00101011 | | | | |
| 469: | 1111111110 10101011 | | | | |
| 470: | 1111111110 01101011 | | | | |
| 471: | 1111111110 11101011 | | | | |
| 472: | 1111111110 00011011 | | | | |
| 473: | 1111111110 10011011 | | | | |
| 474: | 1111111110 01011011 | | | | |
| 475: | 1111111110 11011011 | | | | |
| 476: | 1111111110 00111011 | | | | |
| 477: | 1111111110 10111011 | | | | |
| 478: | 1111111110 01111011 | | | | |
| 479: | 1111111110 11111011 | | | | |
| 480: | 1111111110 00000111 | | | | |
| 481: | 1111111110 10000111 | | | | |

FIG. 18 (d)

| Displacement (decimal) | Binary Encoded Displacement value | Displacement (decimal) | Binary Encoded Displacement value | Displacement (decimal) | Binary Encoded Displacement value |
|---|---|---|---|---|---|
| 000: | 00 000 | 059: | 110 110111 | 118: | 110 011011 |
| 001: | 00 100 | 060: | 110 001111 | 119: | 110 111011 |
| 002: | 00 010 | 061: | 110 101111 | 120: | 1110 0001111 |
| 003: | 00 110 | 062: | 110 011111 | 121: | 1110 1001111 |
| 004: | 00 001 | 063: | 110 111111 | 122: | 1110 0101111 |
| 005: | 00 101 | 064: | 110 000000 | 123: | 1110 1101111 |
| 006: | 00 011 | 065: | 110 100000 | 124: | 1110 0011111 |
| 007: | 00 111 | 066: | 110 010000 | 125: | 1110 1011111 |
| 008: | 01 0001 | 067: | 110 110000 | 126: | 1110 0111111 |
| 009: | 01 1001 | 068: | 110 001000 | 127: | 1110 1111111 |
| 010: | 01 0101 | 069: | 110 101000 | 128: | 1110 0000000 |
| 011: | 01 1101 | 070: | 110 011000 | 129: | 1110 1000000 |
| 012: | 01 0011 | 071: | 110 111000 | 130: | 1110 0100000 |
| 013: | 01 1011 | 072: | 110 000100 | 131: | 1110 1100000 |
| 014: | 01 0111 | 073: | 110 100100 | 132: | 1110 0010000 |
| 015: | 01 1111 | 074: | 110 010100 | 133: | 1110 1010000 |
| 016: | 01 0000 | 075: | 110 110100 | 134: | 1110 0110000 |
| 017: | 01 1000 | 076: | 110 001100 | 135: | 1110 1110000 |
| 018: | 01 0100 | 077: | 110 101100 | 136: | 1110 0001000 |
| 019: | 01 1100 | 078: | 110 011100 | 137: | 1110 1001000 |
| 020: | 01 0010 | 079: | 110 111100 | 138: | 1110 0101000 |
| 021: | 01 1010 | 080: | 110 000010 | 139: | 1110 1101000 |
| 022: | 01 0110 | 081: | 110 100010 | 140: | 1110 0011000 |
| 023: | 01 1110 | 082: | 110 010010 | 141: | 1110 1011000 |
| 024: | 10 00011 | 083: | 110 110010 | 142: | 1110 0111000 |
| 025: | 10 10011 | 084: | 110 001010 | 143: | 1110 1111000 |
| 026: | 10 01011 | 085: | 110 101010 | 144: | 1110 0000100 |
| 027: | 10 11011 | 086: | 110 011010 | 145: | 1110 1000100 |
| 028: | 10 00111 | 087: | 110 111010 | 146: | 1110 0100100 |
| 029: | 10 10111 | 088: | 110 000110 | 147: | 1110 1100100 |
| 030: | 10 01111 | 089: | 110 100110 | 148: | 1110 0010100 |
| 031: | 10 11111 | 090: | 110 010110 | 149: | 1110 1010100 |
| 032: | 10 00000 | 091: | 110 110110 | 150: | 1110 0110100 |
| 033: | 10 10000 | 092: | 110 001110 | 151: | 1110 1110100 |
| 034: | 10 01000 | 093: | 110 101110 | 152: | 1110 0001100 |
| 035: | 10 11000 | 094: | 110 011110 | 153: | 1110 1001100 |
| 036: | 10 00100 | 095: | 110 111110 | 154: | 1110 0101100 |
| 037: | 10 10100 | 096: | 110 000001 | 155: | 1110 1101100 |
| 038: | 10 01100 | 097: | 110 100001 | 156: | 1110 0011100 |
| 039: | 10 11100 | 098: | 110 010001 | 157: | 1110 1011100 |
| 040: | 10 00010 | 099: | 110 110001 | 158: | 1110 0111100 |
| 041: | 10 10010 | 100: | 110 001001 | 159: | 1110 1111100 |
| 042: | 10 01010 | 101: | 110 101001 | 160: | 1110 0000010 |
| 043: | 10 11010 | 102: | 110 011001 | 161: | 1110 1000010 |
| 044: | 10 00110 | 103: | 110 111001 | 162: | 1110 0100010 |
| 045: | 10 10110 | 104: | 110 000101 | 163: | 1110 1100010 |
| 046: | 10 01110 | 105: | 110 100101 | 164: | 1110 0010010 |
| 047: | 10 11110 | 106: | 110 010101 | 165: | 1110 1010010 |
| 048: | 10 00001 | 107: | 110 110101 | 166: | 1110 0110010 |
| 049: | 10 10001 | 108: | 110 001101 | 167: | 1110 1110010 |
| 050: | 10 01001 | 109: | 110 101101 | 168: | 1110 0001010 |
| 051: | 10 11001 | 110: | 110 011101 | 169: | 1110 1001010 |
| 052: | 10 00101 | 111: | 110 111101 | 170: | 1110 0101010 |
| 053: | 10 10101 | 112: | 110 000011 | 171: | 1110 1101010 |
| 054: | 10 01101 | 113: | 110 100011 | 172: | 1110 0011010 |
| 055: | 10 11101 | 114: | 110 010011 | 173: | 1110 1011010 |
| 056: | 110 000111 | 115: | 110 110011 | 174: | 1110 0111010 |
| 057: | 110 100111 | 116: | 110 001011 | 175: | 1110 1111010 |
| 058: | 110 010111 | 117: | 110 101011 | 176: | 1110 0000110 |

FIG. 19 (a)

| Displacement (decimal) | Binary Encoded Displacement value | Displacement (decimal) | Binary Encoded Displacement value | Displacement (decimal) | Binary Encoded Displacement value |
|---|---|---|---|---|---|
| 177: | 1110 1000110 | 236: | 1110 0011011 | 295: | 11110 11100100 |
| 178: | 1110 0100110 | 237: | 1110 1011011 | 296: | 11110 00010100 |
| 179: | 1110 1100110 | 238: | 1110 0111011 | 297: | 11110 10010100 |
| 180: | 1110 0010110 | 239: | 1110 1111011 | 298: | 11110 01010100 |
| 181: | 1110 1010110 | 240: | 1110 0000111 | 299: | 11110 11010100 |
| 182: | 1110 0110110 | 241: | 1110 1000111 | 300: | 11110 00110100 |
| 183: | 1110 1110110 | 242: | 1110 0100111 | 301: | 11110 10110100 |
| 184: | 1110 0001110 | 243: | 1110 1100111 | 302: | 11110 01110100 |
| 185: | 1110 1001110 | 244: | 1110 0010111 | 303: | 11110 11110100 |
| 186: | 1110 0101110 | 245: | 1110 1010111 | 304: | 11110 00001100 |
| 187: | 1110 1101110 | 246: | 1110 0110111 | 305: | 11110 10001100 |
| 188: | 1110 0011110 | 247: | 1110 1110111 | 306: | 11110 01001100 |
| 189: | 1110 1011110 | 248: | 11110 00011111 | 307: | 11110 11001100 |
| 190: | 1110 0111110 | 249: | 11110 10011111 | 308: | 11110 00101100 |
| 191: | 1110 1111110 | 250: | 11110 01011111 | 309: | 11110 10101100 |
| 192: | 1110 0000001 | 251: | 11110 11011111 | 310: | 11110 01101100 |
| 193: | 1110 1000001 | 252: | 11110 00111111 | 311: | 11110 11101100 |
| 194: | 1110 0100001 | 253: | 11110 10111111 | 312: | 11110 00011100 |
| 195: | 1110 1100001 | 254: | 11110 01111111 | 313: | 11110 10011100 |
| 196: | 1110 0010001 | 255: | 11110 11111111 | 314: | 11110 01011100 |
| 197: | 1110 1010001 | 256: | 11110 00000000 | 315: | 11110 11011100 |
| 198: | 1110 0110001 | 257: | 11110 10000000 | 316: | 11110 00111100 |
| 199: | 1110 1110001 | 258: | 11110 01000000 | 317: | 11110 10111100 |
| 200: | 1110 0001001 | 259: | 11110 11000000 | 318: | 11110 01111100 |
| 201: | 1110 1001001 | 260: | 11110 00100000 | 319: | 11110 11111100 |
| 202: | 1110 0101001 | 261: | 11110 10100000 | 320: | 11110 00000010 |
| 203: | 1110 1101001 | 262: | 11110 01100000 | 321: | 11110 10000010 |
| 204: | 1110 0011001 | 263: | 11110 11100000 | 322: | 11110 01000010 |
| 205: | 1110 1011001 | 264: | 11110 00010000 | 323: | 11110 11000010 |
| 206: | 1110 0111001 | 265: | 11110 10010000 | 324: | 11110 00100010 |
| 207: | 1110 1111001 | 266: | 11110 01010000 | 325: | 11110 10100010 |
| 208: | 1110 0000101 | 267: | 11110 11010000 | 326: | 11110 01100010 |
| 209: | 1110 1000101 | 268: | 11110 00110000 | 327: | 11110 11100010 |
| 210: | 1110 0100101 | 269: | 11110 10110000 | 328: | 11110 00010010 |
| 211: | 1110 1100101 | 270: | 11110 01110000 | 329: | 11110 10010010 |
| 212: | 1110 0010101 | 271: | 11110 11110000 | 330: | 11110 01010010 |
| 213: | 1110 1010101 | 272: | 11110 00001000 | 331: | 11110 11010010 |
| 214: | 1110 0110101 | 273: | 11110 10001000 | 332: | 11110 00110010 |
| 215: | 1110 1110101 | 274: | 11110 01001000 | 333: | 11110 10110010 |
| 216: | 1110 0001101 | 275: | 11110 11001000 | 334: | 11110 01110010 |
| 217: | 1110 1001101 | 276: | 11110 00101000 | 335: | 11110 11110010 |
| 218: | 1110 0101101 | 277: | 11110 10101000 | 336: | 11110 00001010 |
| 219: | 1110 1101101 | 278: | 11110 01101000 | 337: | 11110 10001010 |
| 220: | 1110 0011101 | 279: | 11110 11101000 | 338: | 11110 01001010 |
| 221: | 1110 1011101 | 280: | 11110 00011000 | 339: | 11110 11001010 |
| 222: | 1110 0111101 | 281: | 11110 10011000 | 340: | 11110 00101010 |
| 223: | 1110 1111101 | 282: | 11110 01011000 | 341: | 11110 10101010 |
| 224: | 1110 0000011 | 283: | 11110 11011000 | 342: | 11110 01101010 |
| 225: | 1110 1000011 | 284: | 11110 00111000 | 343: | 11110 11101010 |
| 226: | 1110 0100011 | 285: | 11110 10111000 | 344: | 11110 00011010 |
| 227: | 1110 1100011 | 286: | 11110 01111000 | 345: | 11110 10011010 |
| 228: | 1110 0010011 | 287: | 11110 11111000 | 346: | 11110 01011010 |
| 229: | 1110 1010011 | 288: | 11110 00000100 | 347: | 11110 11011010 |
| 230: | 1110 0110011 | 289: | 11110 10000100 | 348: | 11110 00111010 |
| 231: | 1110 1110011 | 290: | 11110 01000100 | 349: | 11110 10111010 |
| 232: | 1110 0001011 | 291: | 11110 11000100 | 350: | 11110 01111010 |
| 233: | 1110 1001011 | 292: | 11110 00100100 | 351: | 11110 11111010 |
| 234: | 1110 0101011 | 293: | 11110 10100100 | 352: | 11110 00000110 |
| 235: | 1110 1101011 | 294: | 11110 01100100 | 353: | 11110 10000110 |

FIG. 19 (b)

| Displacement (decimal) | Binary Encoded Displacement value | Displacement (decimal) | Binary Encoded Displacement value | Displacement (decimal) | Binary Encoded Displacement value |
|---|---|---|---|---|---|
| 354: | 11110 01000110 | 413: | 11110 10111001 | 472: | 11110 00011011 |
| 355: | 11110 11000110 | 414: | 11110 01111001 | 473: | 11110 10011011 |
| 356: | 11110 00100110 | 415: | 11110 11111001 | 474: | 11110 01011011 |
| 357: | 11110 10100110 | 416: | 11110 00000101 | 475: | 11110 11011011 |
| 358: | 11110 01100110 | 417: | 11110 10000101 | 476: | 11110 00111011 |
| 359: | 11110 11100110 | 418: | 11110 01000101 | 477: | 11110 10111011 |
| 360: | 11110 00010110 | 419: | 11110 11000101 | 478: | 11110 01111011 |
| 361: | 11110 10010110 | 420: | 11110 00100101 | 479: | 11110 11111011 |
| 362: | 11110 01010110 | 421: | 11110 10100101 | 480: | 11110 00000111 |
| 363: | 11110 11010110 | 422: | 11110 01100101 | 481: | 11110 10000111 |
| 364: | 11110 00110110 | 423: | 11110 11100101 | 482: | 11110 01000111 |
| 365: | 11110 10110110 | 424: | 11110 00010101 | 483: | 11110 11000111 |
| 366: | 11110 01110110 | 425: | 11110 10010101 | 484: | 11110 00100111 |
| 367: | 11110 11110110 | 426: | 11110 01010101 | 485: | 11110 10100111 |
| 368: | 11110 00001110 | 427: | 11110 11010101 | 486: | 11110 01100111 |
| 369: | 11110 10001110 | 428: | 11110 00110101 | 487: | 11110 11100111 |
| 370: | 11110 01001110 | 429: | 11110 10110101 | 488: | 11110 00010111 |
| 371: | 11110 11001110 | 430: | 11110 01110101 | 489: | 11110 10010111 |
| 372: | 11110 00101110 | 431: | 11110 11110101 | 490: | 11110 01010111 |
| 373: | 11110 10101110 | 432: | 11110 00001101 | 491: | 11110 11010111 |
| 374: | 11110 01101110 | 433: | 11110 10001101 | 492: | 11110 00110111 |
| 375: | 11110 11101110 | 434: | 11110 01001101 | 493: | 11110 10110111 |
| 376: | 11110 00011110 | 435: | 11110 11001101 | 494: | 11110 01110111 |
| 377: | 11110 10011110 | 436: | 11110 00101101 | 495: | 11110 11110111 |
| 378: | 11110 01011110 | 437: | 11110 10101101 | 496: | 11110 00001111 |
| 379: | 11110 11011110 | 438: | 11110 01101101 | 497: | 11110 10001111 |
| 380: | 11110 00111110 | 439: | 11110 11101101 | 498: | 11110 01001111 |
| 381: | 11110 10111110 | 440: | 11110 00011101 | 499: | 11110 11001111 |
| 382: | 11110 01111110 | 441: | 11110 10011101 | 500: | 11110 00101111 |
| 383: | 11110 11111110 | 442: | 11110 01011101 | 501: | 11110 10101111 |
| 384: | 11110 00000001 | 443: | 11110 11011101 | 502: | 11110 01101111 |
| 385: | 11110 10000001 | 444: | 11110 00111101 | 503: | 11110 11101111 |
| 386: | 11110 01000001 | 445: | 11110 10111101 | 504: | 111110 000111111 |
| 387: | 11110 11000001 | 446: | 11110 01111101 | 505: | 111110 100111111 |
| 388: | 11110 00100001 | 447: | 11110 11111101 | 506: | 111110 010111111 |
| 389: | 11110 10100001 | 448: | 11110 00000011 | 507: | 111110 110111111 |
| 390: | 11110 01100001 | 449: | 11110 10000011 | 508: | 111110 001111111 |
| 391: | 11110 11100001 | 450: | 11110 01000011 | 509: | 111110 101111111 |
| 392: | 11110 00010001 | 451: | 11110 11000011 | | |
| 393: | 11110 10010001 | 452: | 11110 00100011 | | |
| 394: | 11110 01010001 | 453: | 11110 10100011 | | |
| 395: | 11110 11010001 | 454: | 11110 01100011 | | |
| 396: | 11110 00110001 | 455: | 11110 11100011 | | |
| 397: | 11110 10110001 | 456: | 11110 00010011 | | |
| 398: | 11110 01110001 | 457: | 11110 10010011 | | |
| 399: | 11110 11110001 | 458: | 11110 01010011 | | |
| 400: | 11110 00001001 | 459: | 11110 11010011 | | |
| 401: | 11110 10001001 | 460: | 11110 00110011 | | |
| 402: | 11110 01001001 | 461: | 11110 10110011 | | |
| 403: | 11110 11001001 | 462: | 11110 01110011 | | |
| 404: | 11110 00101001 | 463: | 11110 11110011 | | |
| 405: | 11110 10101001 | 464: | 11110 00001011 | | |
| 406: | 11110 01101001 | 465: | 11110 10001011 | | |
| 407: | 11110 11101001 | 466: | 11110 01001011 | | |
| 408: | 11110 00011001 | 467: | 11110 11001011 | | |
| 409: | 11110 10011001 | 468: | 11110 00101011 | | |
| 410: | 11110 01011001 | 469: | 11110 10101011 | | |
| 411: | 11110 11011001 | 470: | 11110 01101011 | | |
| 412: | 11110 00111001 | 471: | 11110 11101011 | | |

FIG. 19 (c)

| UNMATCHED INPUT BYTE (decimal) | ALPHABET TOKEN (binary) | UNMATCHED INPUT BYTE (decimal) | ALPHABET TOKEN (binary) | UNMATCHED INPUT BYTE (decimal) | ALPHABET TOKEN (binary) |
|---|---|---|---|---|---|
| 0 | 11111 | 48 | 10100111 | 96 | 10100100 |
| 1 | 110110 | 49 | 00101010 | 97 | 0011100 |
| 2 | 100010 | 50 | 01011101 | 98 | 00000011 |
| 3 | 010011 | 51 | 00111101 | 99 | 10011001 |
| 4 | 000100 | 52 | 111100001 | 100 | 10101100 |
| 5 | 1011100 | 53 | 101110110 | 101 | 0111110 |
| 6 | 001011 | 54 | 01100010 | 102 | 10011000 |
| 7 | 1100010 | 55 | 101001011 | 103 | 10100000 |
| 8 | 1110011 | 56 | 110100101 | 104 | 10011110 |
| 9 | 0110010 | 57 | 111100010 | 105 | 11101101 |
| 10 | 1101000 | 58 | 101111100 | 106 | 110101010 |
| 11 | 1000111 | 59 | 110111001 | 107 | 100101011 |
| 12 | 1001101 | 60 | 111100011 | 108 | 11001001 |
| 13 | 0110000 | 61 | 00011001 | 109 | 01010100 |
| 14 | 1010111 | 62 | 01000110 | 110 | 11100010 |
| 15 | 0111001 | 63 | 111100100 | 111 | 0101101 |
| 16 | 1001011 | 64 | 10000100 | 112 | 10111010 |
| 17 | 0001110 | 65 | 01010111 | 113 | 001000001 |
| 18 | 0011111 | 66 | 111101100 | 114 | 0010100 |
| 19 | 0000011 | 67 | 01000111 | 115 | 11110101 |
| 20 | 0011011 | 68 | 01101101 | 116 | 1101011 |
| 21 | 0000010 | 69 | 01111001 | 117 | 1000001 |
| 22 | 0111011 | 70 | 0101100 | 118 | 10101010 |
| 23 | 11000000 | 71 | 01111000 | 119 | 10100110 |
| 24 | 11110111 | 72 | 111100000 | 120 | 00100001 |
| 25 | 10011111 | 73 | 111000011 | 121 | 00001100 |
| 26 | 10101101 | 74 | 100100010 | 122 | 100011000 |
| 27 | 10000101 | 75 | 100100101 | 123 | 001101001 |
| 28 | 10011101 | 76 | 111000010 | 124 | 101111101 |
| 29 | 01101100 | 77 | 00110011 | 125 | 100001100 |
| 30 | 0100101 | 78 | 00110001 | 126 | 11001010 |
| 31 | 11101001 | 79 | 00010110 | 127 | 10100001 |
| 32 | 001001 | 80 | 0100000 | 128 | 1010001 |
| 33 | 01110101 | 81 | 101100000 | 129 | 0101111 |
| 34 | 01111010 | 82 | 01111011 | 130 | 00000010 |
| 35 | 01100011 | 83 | 00111011 | 131 | 0001101 |
| 36 | 01111110 | 84 | 00110101 | 132 | 10111111 |
| 37 | 00001110 | 85 | 01000101 | 133 | 11000010 |
| 38 | 11110011 | 86 | 10111100 | 134 | 101001010 |
| 39 | 111011100 | 87 | 01001000 | 135 | 1011001 |
| 40 | 01010001 | 88 | 00011000 | 136 | 01101001 |
| 41 | 111011101 | 89 | 101010110 | 137 | 11101000 |
| 42 | 00100010 | 90 | 100011001 | 138 | 111101000 |
| 43 | 10000111 | 91 | 011111110 | 139 | 1101111 |
| 44 | 01010101 | 92 | 100000001 | 140 | 100111001 |
| 45 | 01010110 | 93 | 110101001 | 141 | 110111000 |
| 46 | 10101000 | 94 | 11001011 | 142 | 111000000 |
| 47 | 111101001 | 95 | 01101000 | 143 | 011100011 |

FIG. 20 (a)

| UNMATCHED INPUT BYTE (decimal) | ALPHABET TOKEN (binary) | UNMATCHED INPUT BYTE (decimal) | ALPHABET TOKEN (binary) | UNMATCHED INPUT BYTE (decimal) | ALPHABET TOKEN (binary) |
|---|---|---|---|---|---|
| 144 | 10110111 | 192 | 11100011 | 240 | 11010011 |
| 145 | 011101001 | 193 | 111011000 | 241 | 110001100 |
| 146 | 010100001 | 194 | 110101000 | 242 | 01110000 |
| 147 | 010010011 | 195 | 111001001 | 243 | 00011110 |
| 148 | 101101010 | 196 | 00110010 | 244 | 10010000 |
| 149 | 1100000111 | 197 | 1110010000 | 245 | 00001101 |
| 150 | 000101110 | 198 | 110000110 | 246 | 11101010 |
| 151 | 1110110010 | 199 | 00001111 | 247 | 11100101 |
| 152 | 011101000 | 200 | 110010001 | 248 | 0000000 |
| 153 | 100100100 | 201 | 001111000 | 249 | 10000001 |
| 154 | 0101001 | 202 | 011111111 | 250 | 0100001 |
| 155 | 1111001011 | 203 | 100000000 | 251 | 11000111 |
| 156 | 1110000010 | 204 | 010111000 | 252 | 0110111 |
| 157 | 1001001110 | 205 | 1110000011 | 253 | 10101001 |
| 158 | 000010110 | 206 | 010111001 | 254 | 0110011 |
| 159 | 000111111 | 207 | 011010101 | 255 | 110011 |
| 160 | 100011010 | 208 | 110000010 | | |
| 161 | 110000111 | 209 | 00001001 | | |
| 162 | 000101111 | 210 | 101100001 | | |
| 163 | 101101101 | 211 | 001111001 | | |
| 164 | 000010111 | 212 | 000111110 | | |
| 165 | 001000000 | 213 | 1110101101 | | |
| 166 | 1100100001 | 214 | 010100000 | | |
| 167 | 1101110100 | 215 | 000010000 | | |
| 168 | 1110110011 | 216 | 00111010 | | |
| 169 | 1001001111 | 217 | 1111011011 | | |
| 170 | 010001001 | 218 | 100100011 | | |
| 171 | 1100100000 | 219 | 001000111 | | |
| 172 | 1111001010 | 220 | 011010100 | | |
| 173 | 1011011001 | 221 | 101110111 | | |
| 174 | 1110101100 | 222 | 100011011 | | |
| 175 | 000010001 | 223 | 100001101 | | |
| 176 | 00101011 | 224 | 01101011 | | |
| 177 | 001100001 | 225 | 101111011 | | |
| 178 | 001100000 | 226 | 110101011 | | |
| 179 | 1100000110 | 227 | 101010111 | | |
| 180 | 010010010 | 228 | 110001101 | | |
| 181 | 1110010001 | 229 | 110100100 | | |
| 182 | 001000110 | 230 | 00001010 | | |
| 183 | 1101110101 | 231 | 011100010 | | |
| 184 | 10110001 | 232 | 0001010 | | |
| 185 | 111010111 | 233 | 10110100 | | |
| 186 | 010001000 | 234 | 101111010 | | |
| 187 | 001101000 | 235 | 11101111 | | |
| 188 | 1111011010 | 236 | 10010100 | | |
| 189 | 1011011000 | 237 | 101101011 | | |
| 190 | 100111000 | 238 | 110111011 | | |
| 191 | 100100110 | 239 | 100101010 | | |

FIG. 20 (b)

GENERAL PURPOSE, HASH-BASED TECHNIQUE FOR SINGLE-PASS LOSSLESS DATA COMPRESSION

FIELD OF THE INVENTION

This invention relates to the field of digital data transmission and storage and, more particularly, to general-purpose, single-pass, adaptive, and lossless data compression and decompression.

BACKGROUND OF THE INVENTION

In a digital data storage or communication system, it is desirable to reduce the size of stored or transmitted data so that it requires less space. The space occupied by a body of digital data is most frequently measured in eight-bit bytes, where each bit is a fundamental unit of information representing a single binary decision. Although the invention is described for eight-bit bytes, the generalization to larger or smaller byte sizes will be obvious to those skilled in the art. The effectiveness of a compression method is measured by its compression ratio, the ratio of the number of bytes in the data's uncompressed representation to the number of bytes in its compressed representation.

There are a multitude of methods for compressing data, but only a few are amenable to general data storage/transmission. A system for general data storage/transmission employs a method that satisfies four criteria: general-purpose, single-pass, adaptive, and lossless.

By general-purpose it is meant that the compression method operates effectively on any type of data, as opposed to a special-purpose method which performs well only on data of special content or in a special format. To meet the general-purpose criterion, some compression methods require a preliminary pass over the data for gathering statistics. These compression methods may be unusable in real-time data storage/transmission environments because of an unacceptable amount of delay; for real time applications, a compression method usually must meet the single-pass criterion.

A compression method for data storage/transmission that is general-purpose and single-pass is almost always adaptive. An adaptive compression method is one which conforms to the particular redundant characteristics of the input data while it compresses the data.

Finally, a lossless compression method is desired; a method with which the decompressed data is an exact replica of the original data before compression, not just a close facsimile. Compression methods which are not lossless throw out the fine details which are sometimes unimportant when the data is decompressed. The determination of what constitutes an unimportant detail relies upon some prior knowledge of the data and clearly is inappropriate for general-purpose data compression.

The compression methods which satisfy the four criteria fall into two categories: statistical and substitutional. Prior art statistical compression methods include adaptive versions of the Huffman code and the arithmetic code. A description of Huffman codes is found in "A Method for the Construction of Minimum-Redundancy Codes," Proceedings of the IRE, vol. 40, Sept. 1952, pp. 1098-1101. A description of arithmetic codes is found in "An Introduction to Arithmetic Coding,"/BM Journal of Research and Development, vol. 28, no. 2, pp. 135-149. Both Huffman and arithmetic codes operate by calculating, if only in effect, the probability of each received byte (or bit) in accordance with some probabilistic model of the input data. The probabilistic model is typically a Markov model. An order N Markov model examines the context, consisting of the previous $N-1$ bytes, and estimates the likelihood of the byte in question. To achieve a high compression ratio, N must be large. The problem with statistical data compression methods is that with increasing N, the amount of working memory required to store the model grows exponentially. The amount of working memory required for the compression ratios desired in a data storage/transmission system is prohibitively large for many applications.

Substitutional compression methods achieve a compact representation of data by replacing input bytes or strings of input bytes with special tokens. A token is a sequence of bits, typically of variable length, which a compressor puts into the compressed output data as a replacement or substitution for one or more uncompressed input bytes. The decompressor must be able to recognize these tokens and parse them from the compressed data as it decompresses. These tokens instruct the decompressor as to how to reconstruct the original, uncompressed data. Run-length coding is perhaps the best known example of a substitutional data compression method. In run-length coding, runs of identical bytes are replaced with an identifier of the byte and a count of the number of times the byte is repeated. Although a good example of substitutional data compression, run-length coding is suited only for special types of data and not for general data transmission/storage. A more sophisticated substitutional method which satisfies the four criteria is LZ1, also known as LZ77.

THE LZ1 METHOD

The theory behind LZ1 can be found in Jacob Ziv and Abraham Lempel's paper "A Universal Algorithm for Sequential Data Compression", IEEE Transactions on Information Theory, Vol. IT-23, No. 3, May 1977, pp. 337-343. Of greater interest is the variation presented in a paper by Storer and Szymanski and explained clearly in Timothy Bell's paper "Better OPM/L Text Compression", IEEE Transactions on Communications, Vol COM-34, No. 12, December 1986, pp. 1176-1182. A good general discussion of the family of LZ1 compression methods can be found in section 8.3 of Text Compression, written by Timothy C. Bell, John G. Cleary, and Ian H. Witten and published by Prentice Hall, Englewood Cliffs, N.J., 1990, pp. 214-226.

LZ1 is often referred to as the sliding window method of data compression. This name refers to the way an LZ1 compressor keeps a history of its most recent uncompressed input bytes and the way an LZ1 decompressor keeps a history of its most recent decompressed output bytes. This history can be thought of as a window through which only a limited number of bytes is visible and which slides across the compressor's input or decompressor's output so as to always give a view of the most recently compressed or decompressed bytes.

When compressing, the window is initially empty. As each input byte is processed, i.e. represented in the output token stream, the unprocessed (uncompressed) input byte is also inserted into the window. Typically the window is shorter than the length of the input to be compressed, so the window will eventually be filled to capacity. By forcing out the oldest data bytes in the window, the compressor continues to insert new input bytes, maintaining the window in a first-in-first-out (FIFO) manner. The decompressor maintains a similar window by also inserting the decompressed output bytes into a decompressor window. At each step, the compressor and decompressor have identical windows even though the two processes may occur at a different time and place.

Since the compressor and decompressor have the window data in common, the window data is used as a vehicle for compression. If the compressor can find window bytes that match the input bytes, then the input bytes are replaced with a pointer to the matching window bytes and a length specifying the number of bytes which match. Usually this pointer and length can be represented in fewer bits than the actual input bytes themselves, yielding a savings of one or more bits with each pointer/length pair. Best compression is achieved when the match between the input bytes and the window bytes is long; therefore, the LZ1 compressor searches for the "longest match", the longest sequence of bytes which occurs identically in the input and in the window.

When there are no matching window bytes, the compressor simply copies the raw input bytes, without any change, to the compressed output. These uncompressed bytes are called literals. Another situation in which raw input bytes (literals) are copied to the output occurs when a window byte matches the input byte but the copy pointer representation requires more bits than the input byte(s) it is meant to replace. Typically, this happens when the "longest match" is short (usually one byte). To curtail this undesired expansion of data, short matches are discarded and the input byte is represented by transmitting the raw input byte, i.e. a literal token. The compressor then searches for an acceptably long match for the remaining input bytes.

So that the decompressor can distinguish between copies (pointer/length pairs) and literals, each copy and literal is preceded with a flag bit. To represent a copy, the flag bit is set to a predetermined logic state, for example zero, by the compressor. To distinguish a literal from a copy within the decompressor, the compressor sets the literal's flag bit to a second predetermined logic state, for example one. A flag bit in combination with a literal byte comprises a literal token. The combination of a flag bit, pointer, and length comprises a copy token.

The following discussion refers to the compression example shown in FIG. 1, which shows the basic operation of a compressor which performs the improved variation of LZ1 described in the previous references. Input bytes are represented by the lowercase characters x, y, and z. In the description of the window, the window may be thought of as sliding toward the right side of the page across the input byte stream. The window has a capacity of four bytes, and each byte location of the window is associated with a displacement, address, or location that is represented by the number one, two three, or four shown at the bottom of the column. The number of bytes consumed in each data compression step varies, depending upon the contents of the window and what the compressor can match. The window reads bytes into byte location one and discards bytes from byte location four. The window reads (or shifts along the input byte stream) by the number of input bytes consumed in each step with the consumed bytes shown in the window in the next step. The output token is the output produced by the compressor when comparing the input bytes with the window contents. The compressor is most efficient when it can represent a long byte pattern with a single copy token, such as zzzz represented by one copy token (C1,4) at step 105 of FIG. 1.

At step 100, the initial window is empty and therefore has no bytes in which to find a match. Compression begins with a search of the window for a "longest match," but with the window at step 100 empty, there is no match. The first input byte x is therefore represented in the compressed output with a literal token Lx. The first input byte thus represented (x) is read (or shifted )into the window. Conceptually, the window slides to the right over the input byte stream with data bytes inserted at window displacement 1 and bytes shifted out from window displacement 4. The ends of the sliding window, displacement 1 and displacement 4, can be respectively described as the insertion end and deletion end. At step 101, the updated window is shown with byte x read in just prior to processing the next input byte.

At step 101, the window contains no instances of input byte y, therefore no matches are found. The output token produced is the literal token Ly. Next, the window reads in the y byte as shown at step 102.

At step 102, the window bytes x and y match the next two input bytes. These two input bytes are represented in the compressed data stream by a copy token, i.e. C2,2. A copy token can be split into three fields. The first field, i.e. C, identifies this token as a copy token. The second field, i.e. the first 2, specifies the window displacement where the copy starts, i.e. the displacement of the first matching byte. The third field of the copy token specifies the copy length, i.e. the length of the match. For example, at step 105 in FIG. 1, the output token is C1,4, which means that a copy starts at window byte location one and is four bytes long. In step 102, copy token C2,2 denotes that the copy starts at window displacement two and is two bytes long, continuing to the end of the window and representing two bytes of the input byte stream (x and y). The two fields, copy length and displacement, when combined tell the decompressor how many bytes must be copied and where they must be copied from, in order to reconstruct the uncompressed data.

The numbering of the window from right to left is intentional. A window location is described by this numbering system as a displacement from the input bytes being processed. In step 102, the displacement of the first byte of the copy is two (window byte location two is two bytes away from the input byte x being processed). There are certain advantages in referring to the location of the first matching window byte by its displacement. In a typical input data stream, matches are more frequently found near the insertion end than further back toward the deletion end of the window, especially at first when the portion near the deletion end of the window is still empty. Therefore, displacement values tend to be small numbers. This tendency can be exploited by designing an encoding scheme for the displacement values that represent small numbers in fewer bits than large numbers.

By analyzing the probability of a copy token referring to any given displacement, those skilled in the art can generate an optimized binary encoding for displacements that will maximize the average compression ratio. Information theory dictates that the optimum number of bits, B (usually not an integer), can be computed by the following equation:

$$B = \log_2(1/p_w)$$

$\log_2$ is a base two logarithm and $p_w$ is the probability of a copy token referring to particular displacement w. FIG. 1 does not show the binary encoding of a copy token's displacement. Decimal values have been retained for clarity.

Occasionally, there is more than one "longest match" in the window; two or more matches may be found with the same length (measured in number of bytes). When using the technique of variable-length encoding for displacement values, then the compressor will maximize compression efficiency if it chooses the match with the smallest displacement.

Returning to FIG. 1 at step 102, the copy length in the copy token C2,2 is two. In our example, this is the first (and only) match and therefore also the "longest match". Similar to the encoding of a displacement, the copy lengths can be binary encoded in order to maximize the compression efficiency (least number of bits).

At step 103, data bytes x and y have been inserted into the window shifting the previous bytes to locations 4 and 3. Again, a search is begun for the "longest match". The compressor scans the input bytes and determines that it can replace yxyyx with a single copy token. This step illustrates a special recursive case in LZ1 compression. The "longest match" begins at displacement three and extends beyond the window into the input bytes. Notice that the first input byte (y) matches the fourth input byte and that the second input byte (x) matches the fifth input byte. Therefore, this match is actually 5 bytes long (2 bytes beyond the window). In this step, the compressor outputs a copy token of C3,5.

Matches that extend beyond the end of the window, such as that in step 103, are perfectly acceptable and even desirable. Decompression is guaranteed to be possible as long as the first byte of the match is actually in the window. Such a copy token cannot be decompressed all at once, rather it is decompressed by recovering one byte at a time, appending each byte to the window to facilitate recovery of the next.

At step 104, the compressor encounters an input byte for which there is no match. As in steps 100 and 101, the compressor adds a flag to the raw input byte, and inserts this uncompressed combination, a literal token, into the compressed output stream. Next as shown in step 105, the window shifts to include the just processed input byte (z).

At step 105 run-length coding proves to be a special case of LZ1 compression. The search for the "longest match" is similar to the search performed in step 103. The first byte of the match (z) is in the window, at displacement one, while the remainder of the match (zzz) extends beyond the end of the window. This match is a run of identical bytes, and just as would be expected from a run-length coder, the compressor replaces all but the first identical byte with a copy token. The first byte was already compressed producing the literal token, Lz, in step 104. The copy token specifies the location of the first byte of the continuing run as well as the number of bytes in the run; therefore, the output token at step 105 is C1,4 designating the window byte at displacement one as the starting byte and the continuing run length of four bytes.

Step 111 illustrates another special case in LZ1 compression. The match consists of only one byte (y) at displacement four. Some compressors will transmit the copy token C4,1, and other compressors will transmit the literal token Ly. This is a design decision which varies from one implementation to the next and is made according to a particular compression ratio-complexity trade-off. Not only are copy tokens with a copy length of one sometimes restricted, some compressors will opt to transmit a literal instead of a copy token with a copy length of two or three in hopes that a match starting the next input byte may be longer (giving better compression).

DIFFERENTIAL COPY LENGTHS

An improvement upon LZ1 compression is found in Paul E. Bender and Jack K. Wolf's, "New Asymptotic Bounds and Improvements on the Lempel-Ziv Data Compression Algorithm", IEEE Transactions on Information Theory, Vol. 37, No. 3, May 1991, pp. 721–729. The improvement is due to an improved representation for the copy-length field in a copy token. The idea is based upon the principle that there may be many matches in the window with a length less than the length of the "longest match". The length of the "longest match" can therefore be represented as the difference between the length of the "longest match" and the length of the "second-longest match." Hence, the copy length is represented as a differential length between the longest and second-longest matches. This improves compression by skewing the probability distribution of stored/transmitted copy lengths toward smaller values, reducing the average number of bits needed to represent a copy length by yielding a better variable-length encoding. This variation requires the decompressor to do more work by searching the window for the "second-longest match." When the decompressor finds the "second-longest match," it adds the length of the "second-longest match" to the received differential length to arrive at the actual (non-differential) copy length.

When using differential lengths, the compressor must account for the situation where there are two or more equal length "longest matches". Should these two (or more) candidates match each other to a length beyond which they match the input bytes being compressed, then the decompressor will determine an actual (non-differential) copy length which is greater than the intended copy length. This problem is solved by requiring that the compressor select the "longest match" that is closest to the insertion end of the window and ignore any "second-longest match" which occurs between the "longest match" and the deletion end of the window.

FIG. 2 shows an example window 200 and input bytes beginning with input byte 201. Window 200 contains four possible matches starting at window locations 202, 203, 204, and 205. The "longest match" either begins with window byte 202 or 203 and has a length of four bytes. An LZ1 compressor without differential copy lengths would store/transmit a copy token with the displacement for window location 203 and a copy length of four, choosing 203 over 202 because of its smaller displacement value. With differential copy lengths, the compressor finds the second "longest match" between 203 and the insertion end of the window. The "second-longest match" begins with 204 and has a length of three bytes. A copy token would be produced which points to window byte 203, the "longest match," and has the differential length found by subtracting the length of the "second-longest match"

from the length of the "longest match", four minus three leaving one. Although not shown, it is possible for the "longest match" and the "second-longest match" to overlap, but this oddity is not really a special case—everything is compressed (and decompressed)in the same way.

The corresponding decompressor has a window identical to 200 and decompresses by following the displacement field of the copy token to the byte at 203. The decompressor would then search to the right of 203, looking for the "second-longest match" between the window bytes at 203 and the remaining window bytes. That "second-longest match" would be found at 204 and would have a length of three. The decompressor then adds the differential length, one, to the match length of three, yielding the actual copy length of four.

If the compressor were to consider "second-longest matches" that occur between 203 and the deletion end of the window, then the "second-longest match" would start at 202 and have the same length as the "longest match", four, hence a differential length of zero (four minus four). The problem occurs when the decompressor searches for the "second-longest match" by comparing the window bytes starting at 203 to the rest of the window bytes. The decompressor will correctly find the match between the window bytes starting at 202, the "second-longest match," and 203, the "longest match," but incorrectly identify the length of this match as five, which added to the differential length of zero gives a actual copy length of five. This illustrates why the "second-longest match" is constrained to occur toward the insertion end of the window.

LZ1 IMPLEMENTATION

A major implementation problem for LZ1 compression is the search for the "longest match". The straight forward approach is to exhaustively search the window. If performed sequentially, this requires far too many comparisons and is too slow for data transmission/storage environments. If the comparisons are performed in parallel then multiple processing units are necessary. These parallel solutions are Often too costly, requiring large amounts of computing resources or large integrated circuits. For implementations of exhaustive parallel searches, see U.S. Pat. No. 5,003,307, Data Compression Apparatus with Shift Register Search Means, Douglas L. Whiting and Glen A. George as well as Data Compression Methods and Theory, James A. Storer, Computer Science Press, Rockville, Md., 1988, pp. 146-163.

To accomplish the search with more reasonable computing or hardware requirements, a data structure which allows faster searching must be used. In the prior art, faster searching is accomplished by restructuring the window as a trie. The trie is a variation of the tree data structure commonly used in computer programming. Each internal node of a trie may have as many children as there are input byte values. Each arc (link) from parent to child is associated with a particular input byte value, and a node in the trie represents the sequence of bytes collected from each arc in a traversal from the root of the trie. For LZ1 data compression, the trie contains every substring in the window and is maintained so that each node contains a pointer to the most recent occurrence of its associated string. Searching for the "longest match" is carried out by starting at the root of the trie and repeatedly traversing the arc associated with the value of the input byte. The "longest match" has been found when there is no arc with a value matching the next input byte.

An implementation problem with tries is that for each new input byte, a host of updates and insertions is necessary to maintain the trie. In fact for the M'th input byte, the number of update and insertion operations will total M. In the prior art, this is handled by keeping the trie manageably small. Typically, a maximum trie depth is enforced; this is equivalent to enforcing a limit on the length of a match. Still for a maximum trie depth of L, L updates or insertions are required. Additional pointers may be added to the trie to simplify the update and insertion operations themselves (as with the suffix tree, described in Rodeh, Pratt, and Even's, "Linear Algorithm for Data Compression via String Matching", Journal of the Association for Computing Machinery, Vol. 9, No. 11, January 1981, pp. 617-623). Nevertheless, the total number of update and insertion operations required for a reasonable trie implementation still exceeds the computing or hardware resources available for a typical data storage/transmission system.

One appealing simplification to LZ1 is to limit the candidates for matches to a subset of the strings in the window. The subset of interest is the one in which every string begins with an input byte which was, at the time it was inserted into the window, either represented as a literal or the first byte of a match. The prior art refers to this technique as incremental parsing which leads toward a compression method known as LZ2 or LZ78, a dictionary-based substitutional compressor. A compressor which implements incremental parsing is disclosed in U.S. Pat. No. 4,464,650, Apparatus and Method for Compressing Data Signals and Restoring the Compressed Data Signals by Willard L. Eastman, Abraham Lempel, Jacob Ziv, and Martin Cohn. A compressor which implements LZ2 can be found in U.S. Pat. No. 4,558,302, High Speed Data Compression and Decompression Apparatus and Method, by Terry A. Welch. Such incremental data compression methods, although typically well suited for implementation in a real-time data storage/transmission system by virtue of their speed, are inferior to the true LZ1 compression methods because of relatively poor average compression ratios in typical general-purpose applications.

Thus, there is a need for a compression method which achieves all the compression ratio benefits of LZ1 methods but with a simple and fast implementation suitable for hardware and software implementation.

SUMMARY OF THE INVENTION

A general-purpose, single-pass, adaptive, and lossless data compression invention implements an LZ1-like method using a hash-based architecture. It is suitable for use in data storage and data communications applications. Implementation efficiency, in terms of required memory and logic gates relative to the typical compression ratio achieved, is highly optimized. An easy-to-implement and quick-to-verify hash function is used. Differential copy lengths may be used to reduce the number of bits required to encode the copy-length field within copy tokens. That is, if multiple matches to a sequence of input bytes are found in the current window, then the length of the copy may be encoded as the difference between the lengths of the longest and the second-longest match, which results in a smaller copy length which likely has a shorter encoded representation. To further increase the compression achieved, literals are not used, but rather input bytes without window matches are mapped into alphabet tokens of variable length using a unary-length code. Other unary-length codes are used to represent the copy-length field and the displacement field within copy tokens.

It is an object of the invention to provide a method and apparatus which compresses data in a general-purpose, lossless, adaptive, and single-pass manner with the compression ratio benefits of the LZ1 method.

Another object of the invention is to perform such compression with a minimal hardware implementation cost, i.e. quantity of working memory, registers, and logic gates.

A still further object is to perform such compression with memory and hardware requirements which allow the compression function to be provided on a multifunction integrated circuit.

It is an object of the invention to improve average compression ratio without increasing the memory requirements or decreasing the speed of the compressor.

Another object of the invention is to improve average compression ratio with variable-length encodings of the displacement and copy-length fields of a copy token.

Another object of the invention is to improve average compression ratio by implementing a hash-based variation of differential copy lengths.

A still further object is to implement differential copy lengths without a significant increase in implementation complexity and no increase in memory requirements.

Another object of the invention is to improve average compression ratio by remapping and variable-length encoding the alphabet of unmatched input byte values.

It is an object of the invention to verify candidates for matches, as produced by a hash function, in a minimum number of memory cycles.

BRIEF DESCRIPTIONS OF THE DRAWINGS

FIG. 1 "shows an example of the operation of a prior art LZ1 compressor patterned after the Storer and Szymanski variation of the LZ1 technique.

FIGS. 8(a)–8(c) shows an example of a compression operation (without differential copy lengths) on a 32-byte data block.

Figure 7:
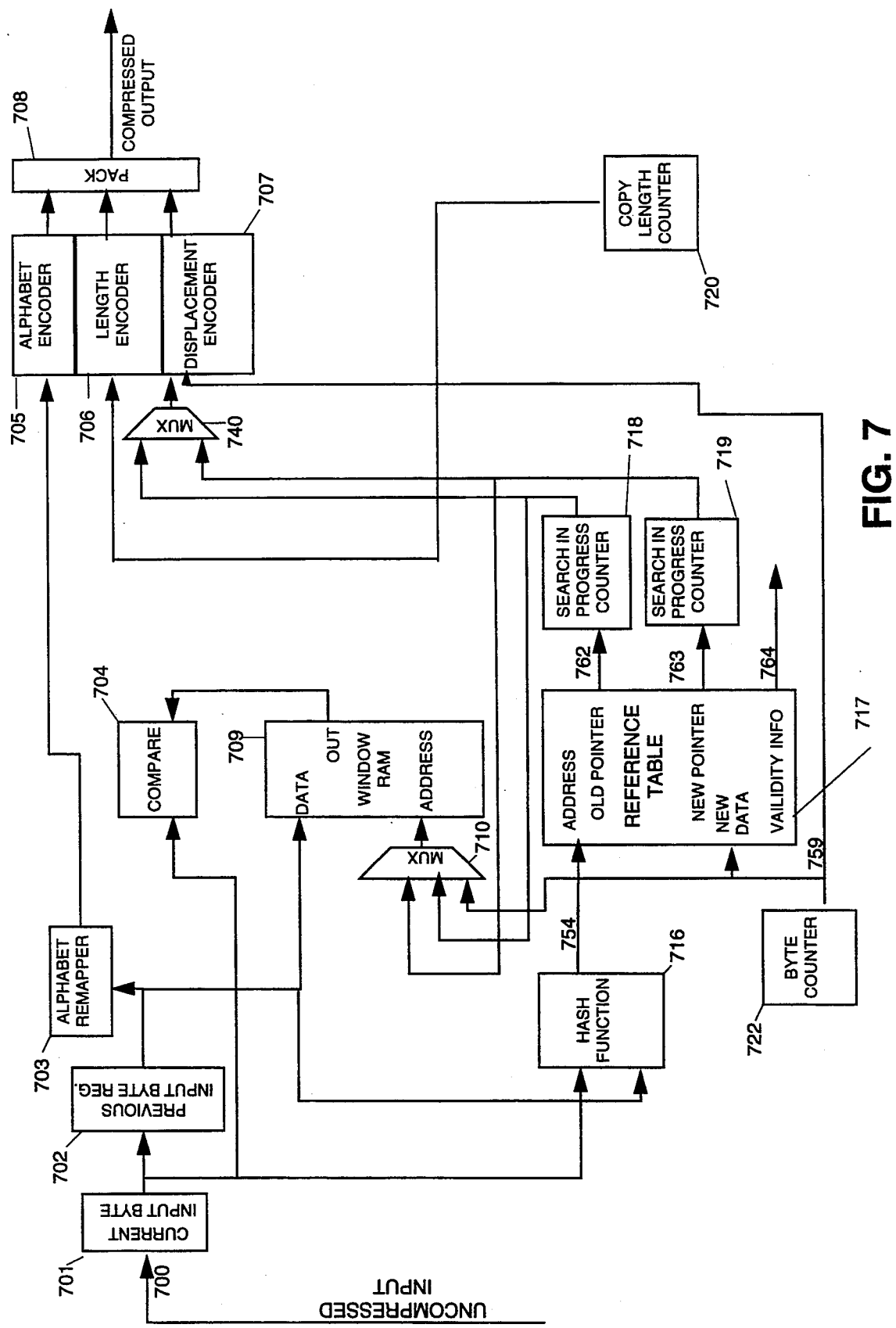
FIG. 7 shows a block diagram of the basic compressor architecture.
Figure 9:
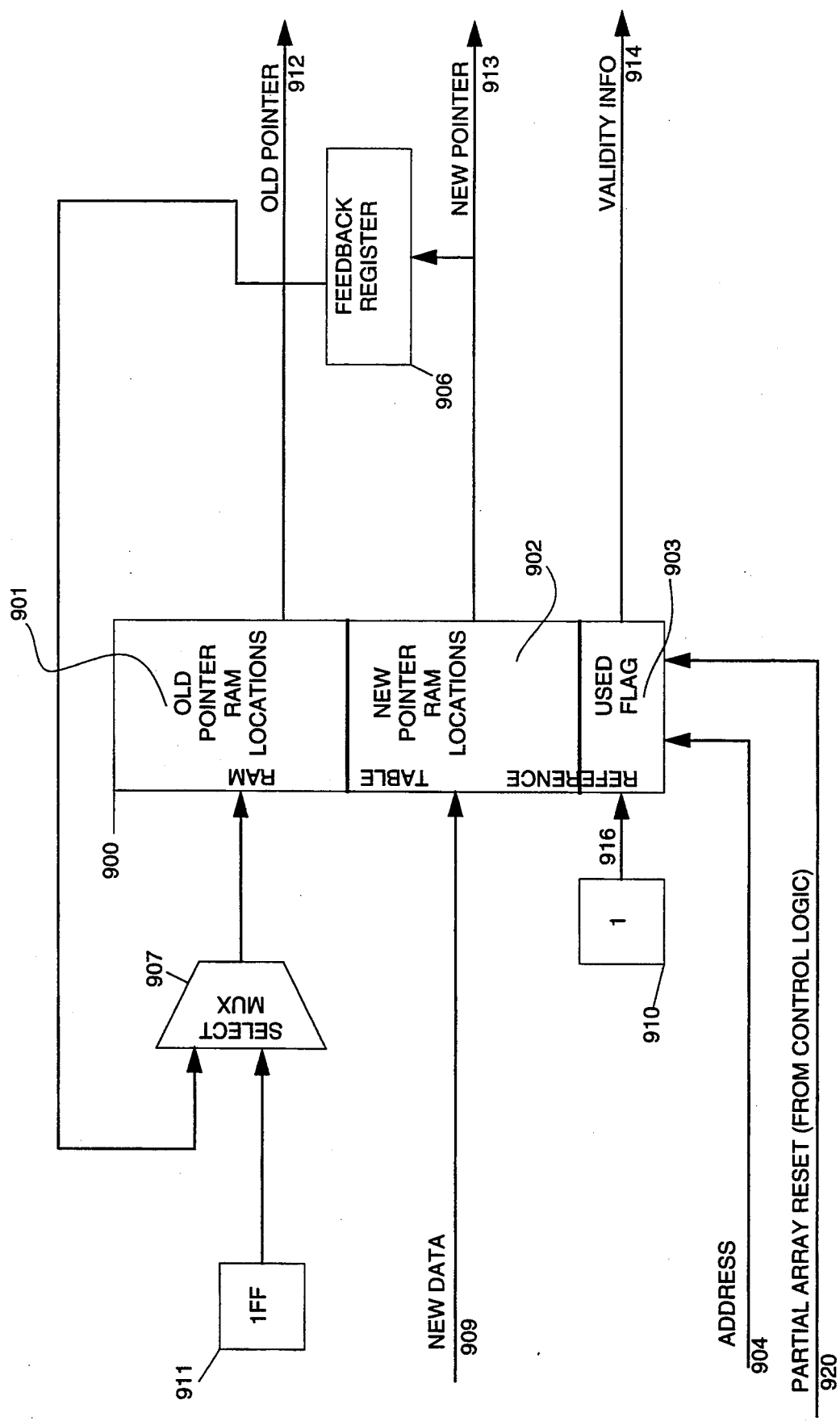

FIG. 9 shows a detailed block diagram of the reference table from FIG. 7.

Figure 10:
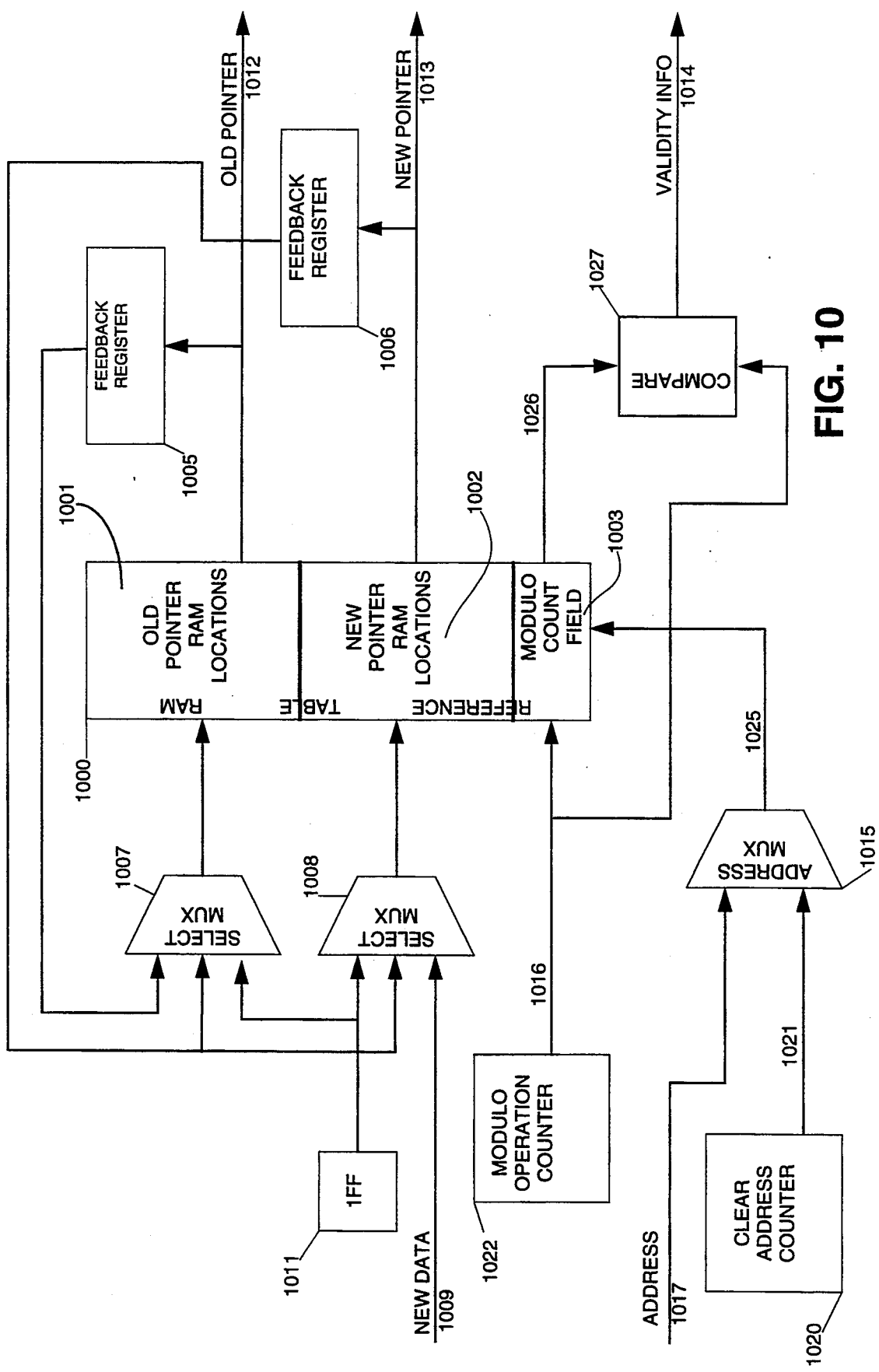

FIG. 10 shows a detailed block diagram of the reference table from FIG. 7 with the addition of the clearing circuit used by an embodiment of the invention to distinguish between current valid pointers in the reference table and stale pointers left over from a previous compression operation.

Figure 11:
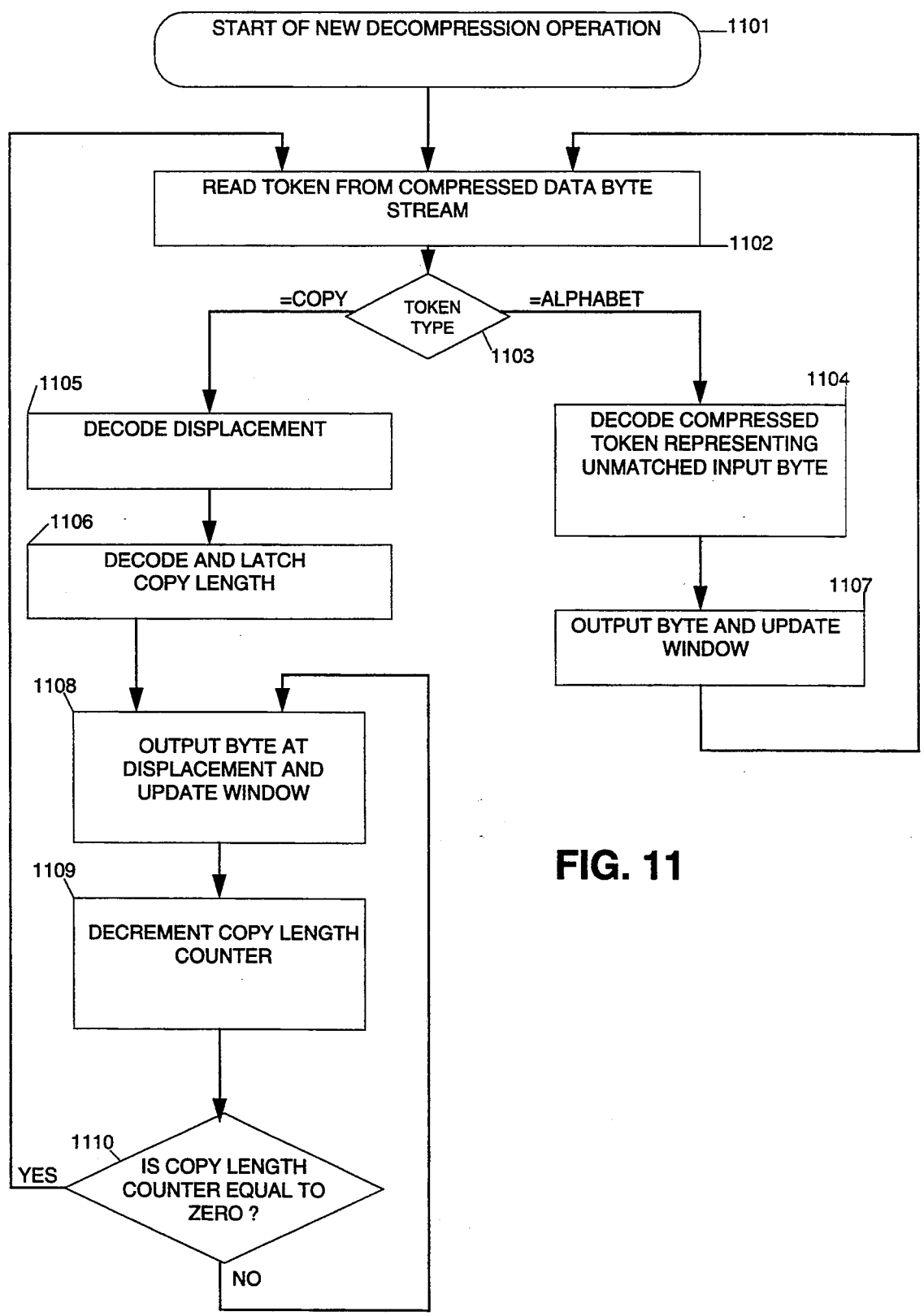

FIG. 11 shows a flowchart of the operation of the basic decompressor.

Figure 12:
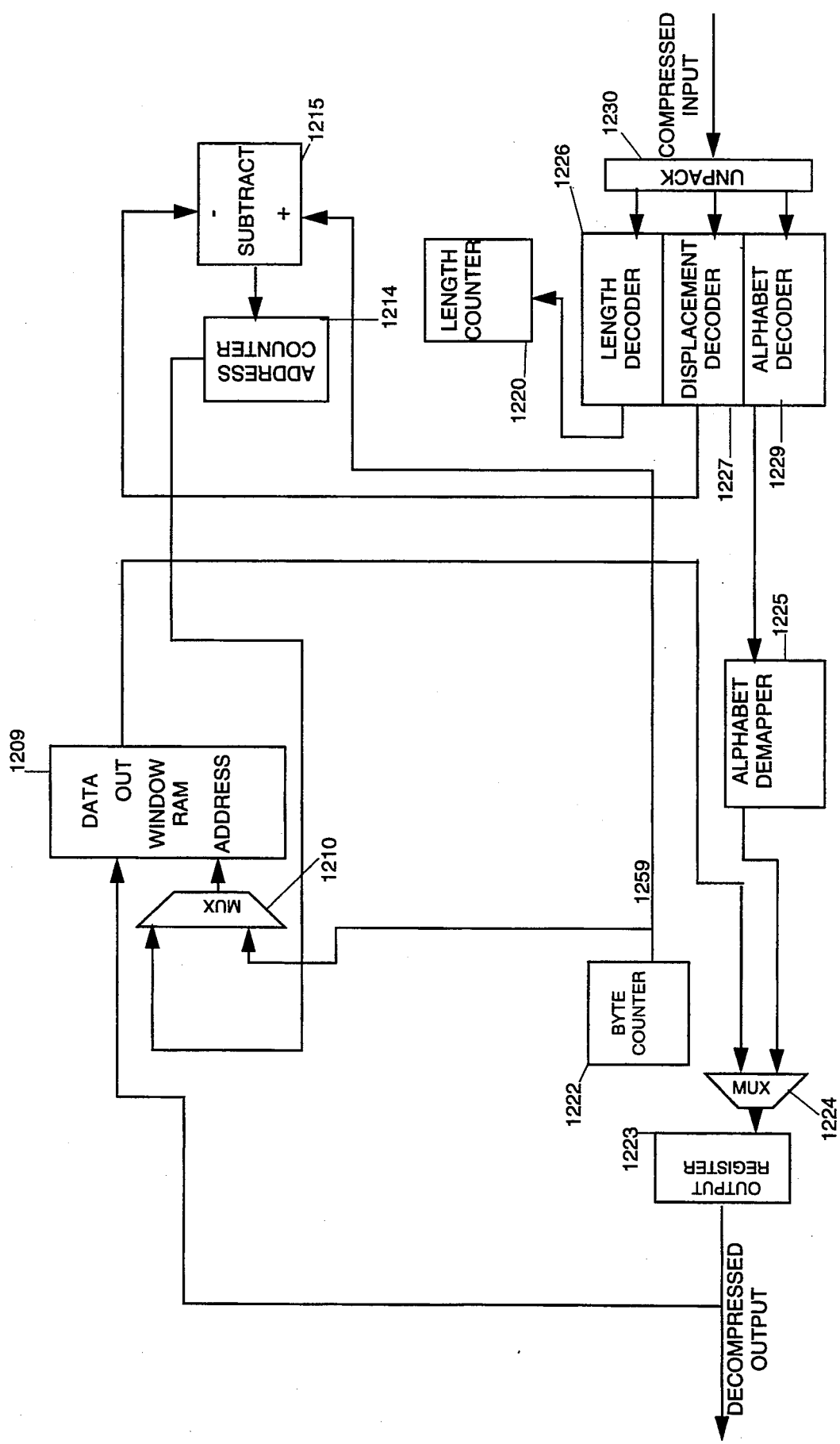

FIG. 12 shows a block diagram of the basic decompressor architecture.

Figure 13:
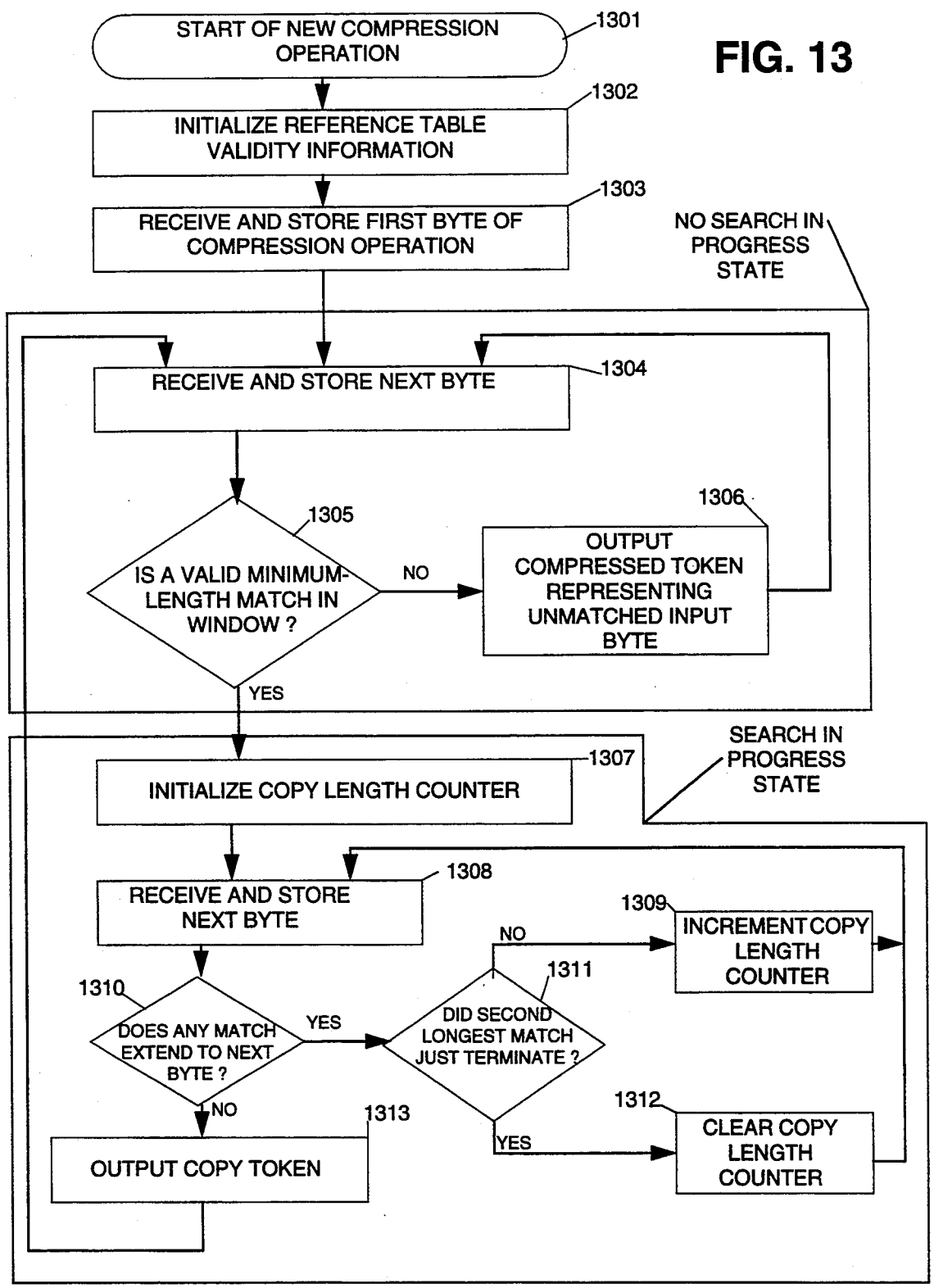

FIG. 13 shows a flowchart of the operation of the differential-copy-length compressor.

FIGS. 14(a)–14(c) shows an example of the same compression operation as in FIG. 8, but performed with differential copy lengths.

Figure 15:
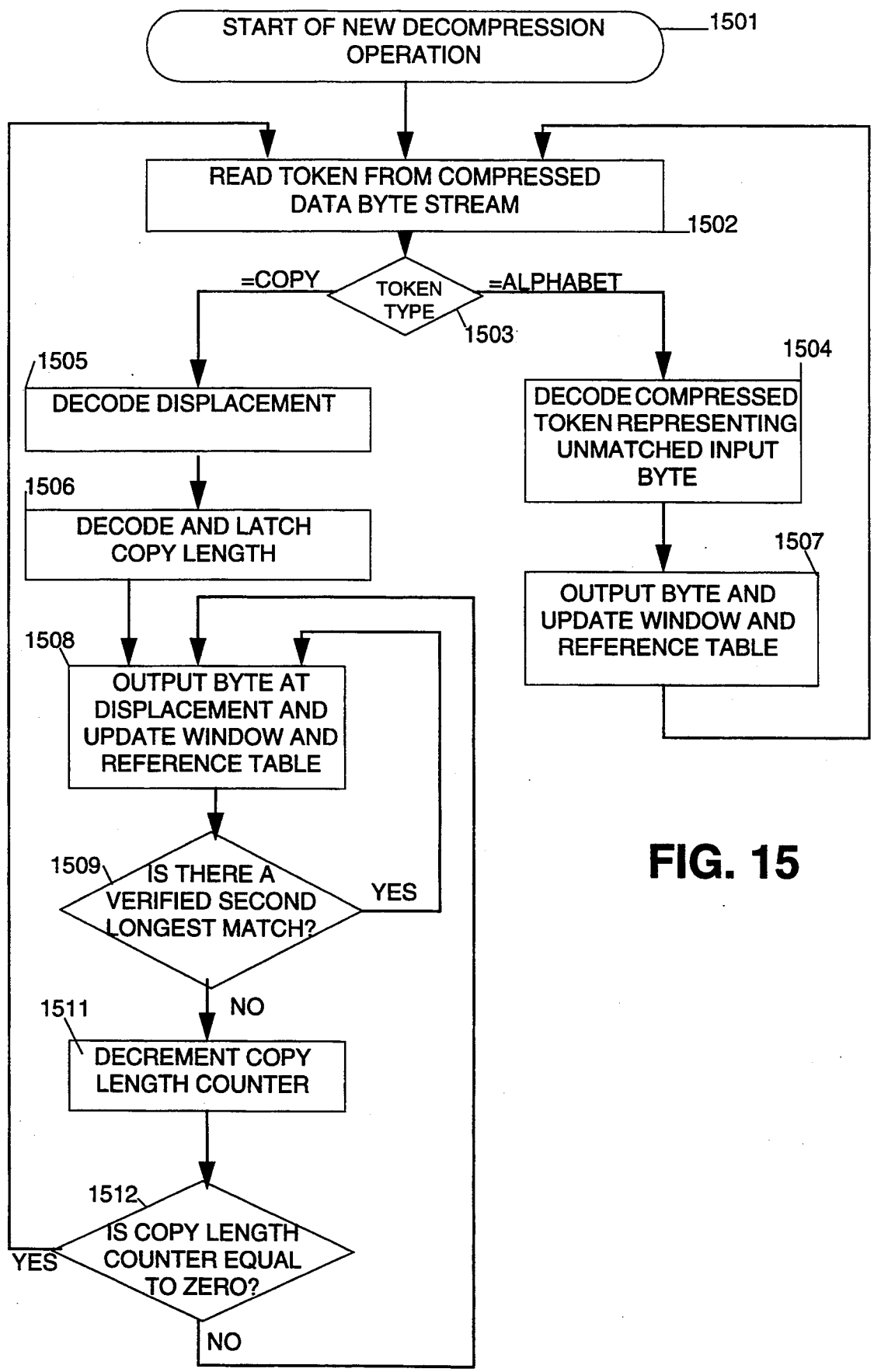

FIG. 15 shows a flowchart of the operation of the differential-copy-length decompressor.

Figure 16:
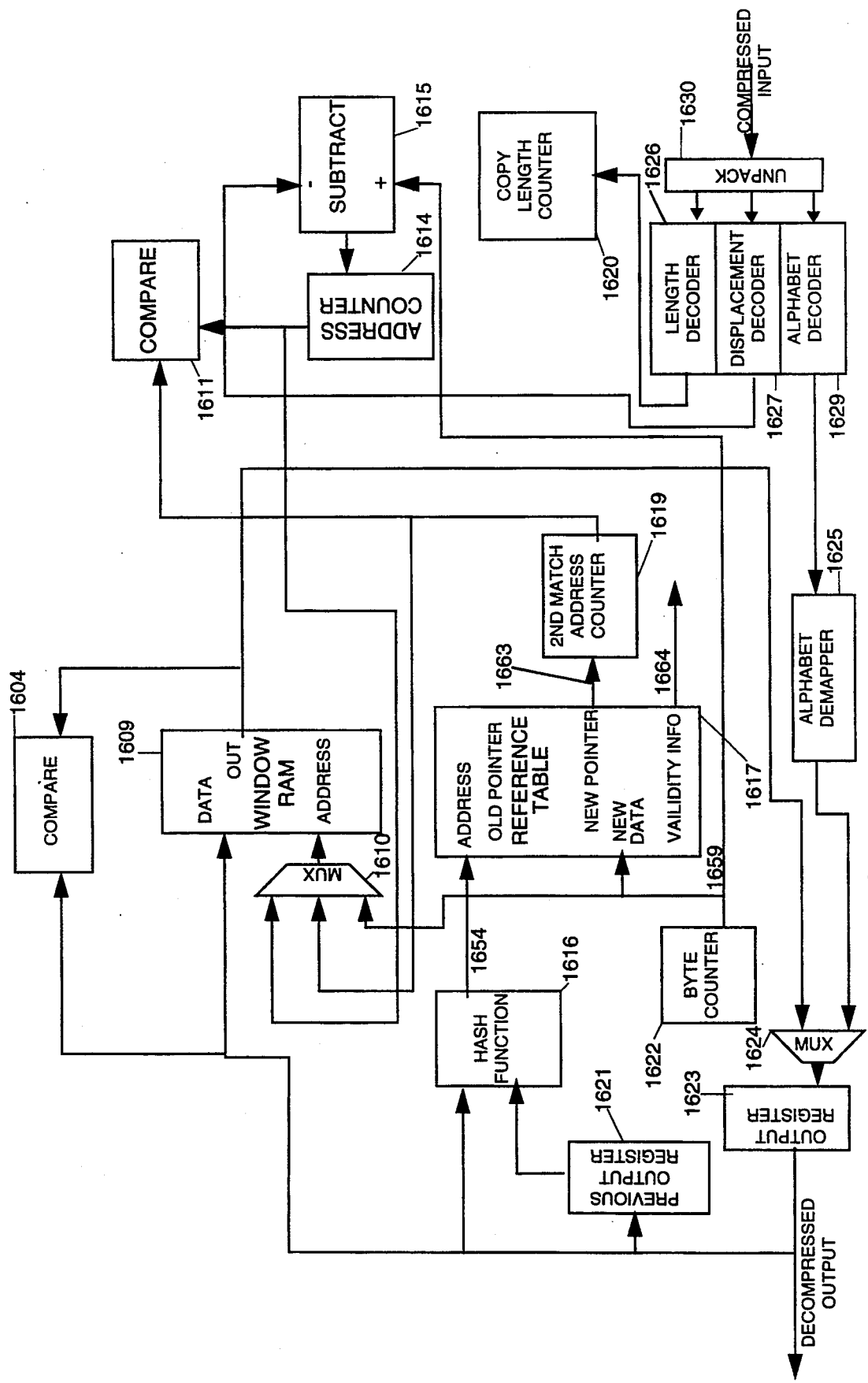

FIG. 16 shows a block diagram of the differential-copy-length decompressor architecture.

Figure 23:
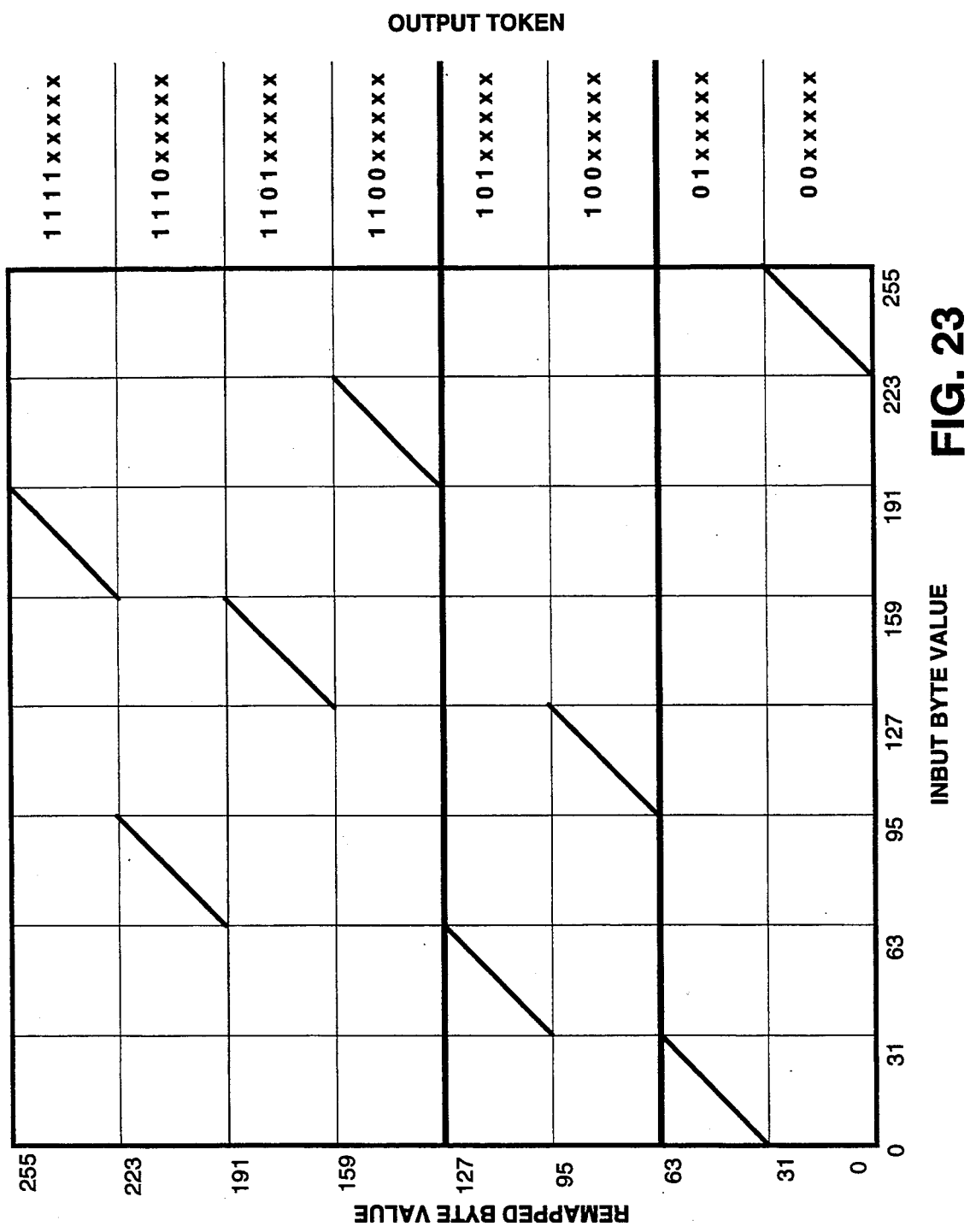

FIGS. 17(a) and 17(b) shows, as a tabulated unary-length code, the same encoding shown in FIG. 23.

FIGS. 18(a)–18(b) shows the unary-length code used in the 512-byte-optimized embodiment of the invention to map a window-match length into a copy-length field of variable length within a copy token.

FIGS. 19(a)–19(c) shows the unary-length code used in the 512-byte-optimized embodiment of the invention to map a window-match displacement into a displacement field of variable length within a copy token.

FIGS. 20(a) and 20(b) shows the encoding used in the Huffman code embodiment of the invention to map unmatched input bytes into variable-length, compressed alphabet tokens.

Figure 21:
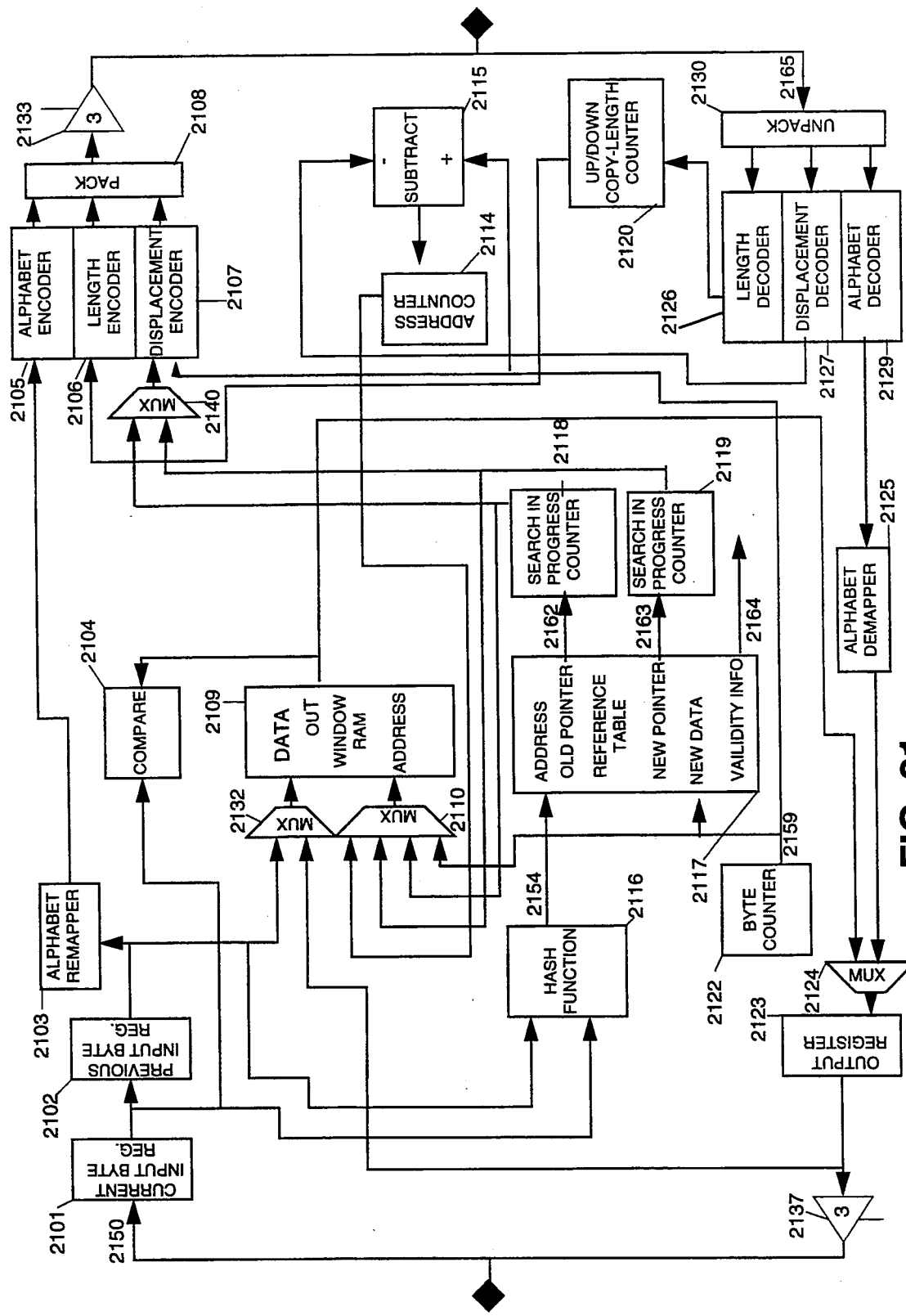

FIG. 21 shows the architecture of a machine which can perform either basic compression or decompression and shares circuitry which is common to both the basic compressor and decompressor.

Figure 22:
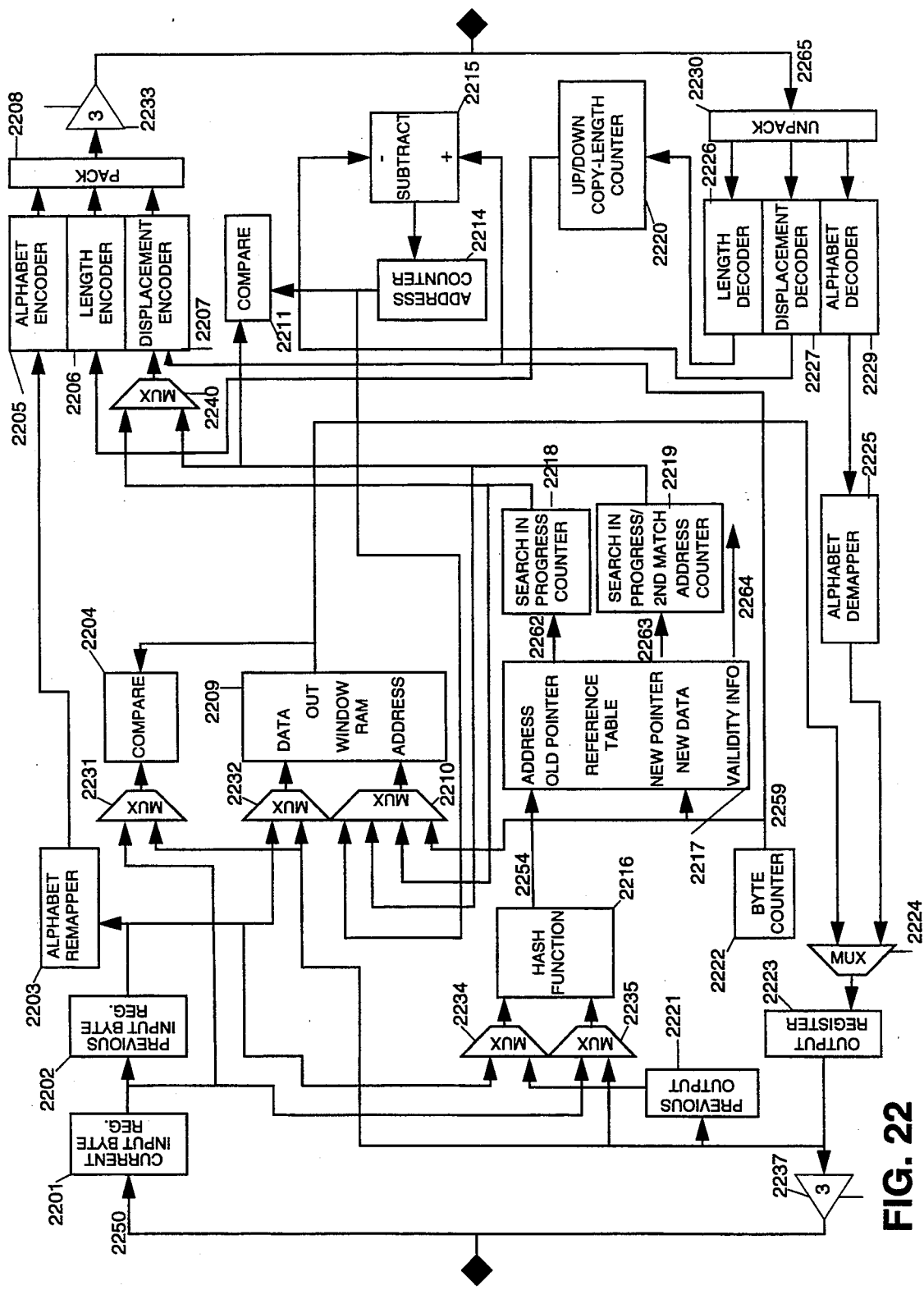

FIG. 22 shows the architecture of a machine which can perform either differential-copy-length compression or decompression and shares circuitry which is common to both the differential-copy-length compressor and decompressor.

FIG. 23 shows, as a function, the encoding used in the 512-byte-optimized embodiment of the invention to map unmatched input bytes into variable-length, compressed alphabet tokens.

DETAILED DESCRIPTION OF THE INVENTION OVERVIEW

Figure 2:
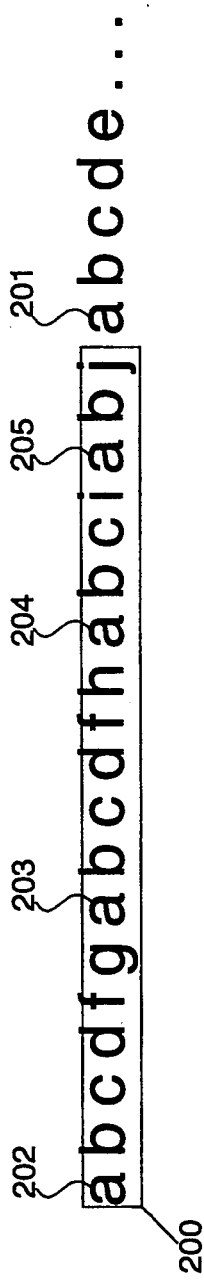
FIG. 2 illustrates the use of differential copy lengths in the referenced paper by Bender and Wolf, showing the longest match, the second-longest match, other possible shorter matches, and one illegal candidate for the second-longest match.
Figure 3:
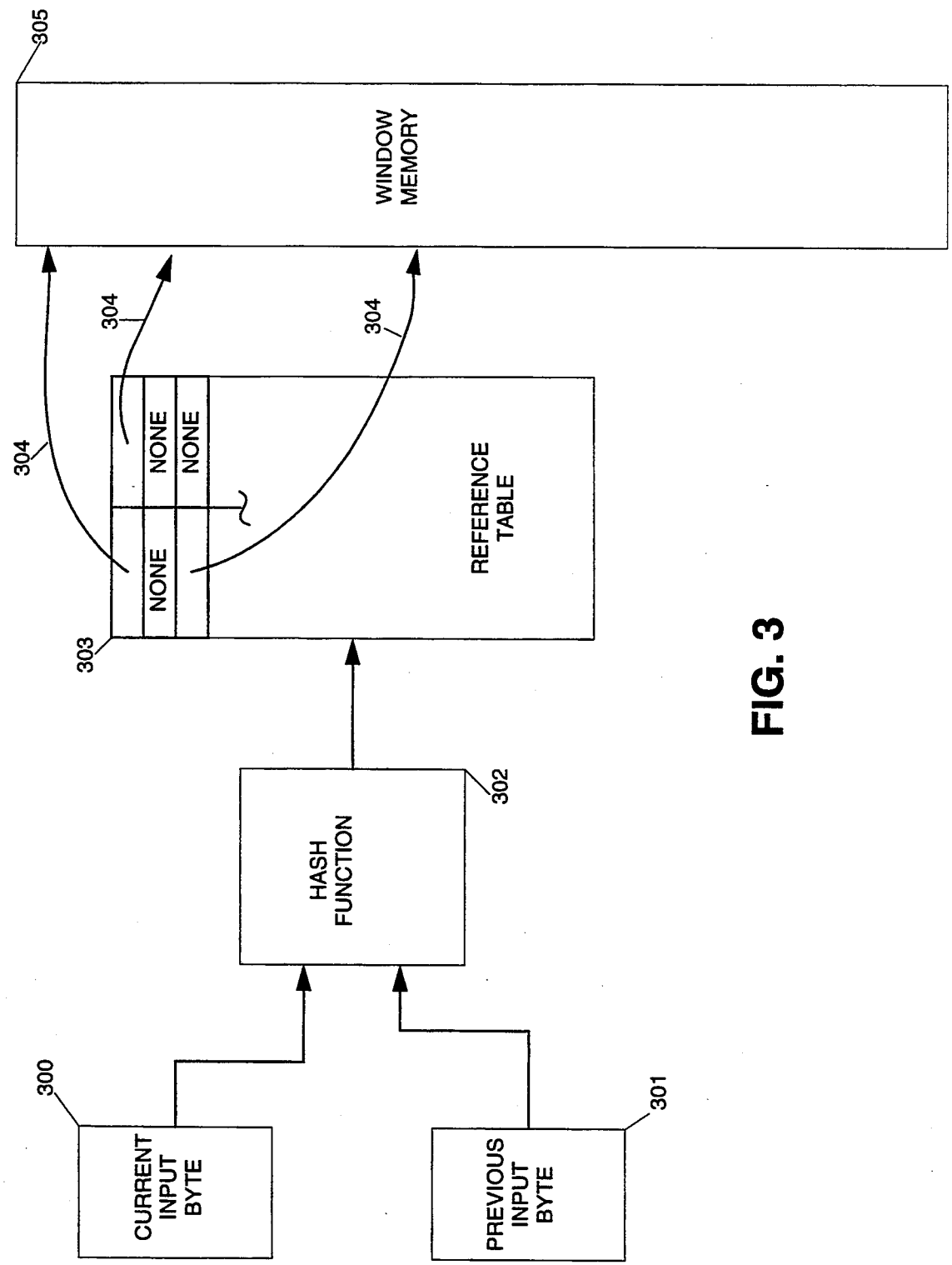
FIG. 3 Shows a high-level block diagram which illustrates the functionality of the hash function and the reference table in searching for longest matches in the window.

FIG. 3 illustrates the search function of the invention. Input bytes are stored in current input byte register 300 and previous input byte register 301. Although the invention is described for eight-bit bytes, the generalization to larger or smaller byte sizes will be obvious to those skilled in the art. These are then processed by hash function 302. Hash function 302 maps pairs of successive input bytes to locations in reference table 303; i.e. with each new input byte, the current input byte and the previous input byte are processed through hash function 302 yielding an address with which to access reference table 303. Reference pointers 304 addressing window bytes in window 305, are stored in reference table 303 to facilitate finding the longest match between the window bytes and the input bytes. Window 305 is an array of data bytes which is maintained in circular buffer fashion. The insertion end of the window advances as each new input byte is inserted. When the window is full, the insertion end of the window wraps around and continues to advance, and each new input byte naturally overwrites the oldest window byte. This creates the sliding window effect in a simple and efficient way. An additional effect of the circular buffer is that the address of any particular window byte remains the same from its time of insertion until it is overwritten, even though its displacement from the insertion end of the window changes continuously.

Each row of reference table 303 is accessed by a unique reference table address which is generated by hash function 302. One or more bits in each row may constitute a row-validity indicator, which can be either a used flag or a modulo operation count. The row-validity indicator is used for clearing the reference table between consecutive but independent compression operations. Each compression operation occurs on a data block or a finite input byte stream, which may be of a fixed or variable size. Each compression operation is independent of any other compression operation, meaning that no information carries over from one compression operation to the next so that each compressed block or stream can be decompressed independently. The remaining bits in each row of the reference table are allocated to one or more reference pointers. Reference pointers address the window, and are maintained so that each reference table row corresponds to a particular pattern of window bytes. For example, one row of the reference table may be dedicated to reference pointers which point solely to occurrences of the pattern "ab" in the window. As each "ab" input byte sequence is received and inserted into the window, the "ab" row of the reference table is updated to point to the new occurrence. The reference pointers of that row will always be either addresses of "ab" patterns in the window or clear. Cleared reference pointers are represented symbolically in FIG. 3 by the word "NONE".

With each new input byte inserted into the window, a reference table address is generated by hash function 302. The contents of reference table 303 are read and the row-validity information is interpreted to determine if the reference pointers in the row are valid or stale (i.e. left over from a previous compression operation). If all the reference pointers are stale, then there is not a pair of matching window bytes, and one of the row's reference pointers is modified to point to where the input byte pair is being inserted into the window. The remaining reference pointers are cleared by setting them to the clear flag, a predetermined reference pointer value that is not otherwise used. If the row-validity indicator indicates that the reference pointers are valid for this compression operation, then each (if any) of the reference pointers which is not set to the clear flag is used to find matching window byte pairs, and the address at which the current input byte pair is being inserted is stored as the newest reference pointer in the row. This is done by overwriting a reference pointer currently set to the clear flag or, if no reference pointers are clear, then overwriting the oldest reference pointer in the row. While writing the new reference pointer into the row, the row-validity indicator is updated so that it appropriately reflects that the reference table row contains at least one valid reference pointer.

THE HASH FUNCTION

Hash function 302, is preferably not so simple as to map only "ab" strings into a reference row as in the example. The preferred hash function is designed so that many different pairs of input bytes yield the same row address for reference table 303. This is done to minimize the memory required for the reference table. If, as in the example, each input byte pair is mapped to a different row, then 65,536 rows would be needed to provide a row for every byte pair, and most of the rows would remain unused since every possible pair does not show up in typical data. If, on the other hand, the reference table were addressed by a single input byte instead of a pair of input bytes, then there would be only 256 rows. Though this reduction in rows would decrease the memory size, this usage of memory would be inefficient since there would be a high demand for certain rows, such as the "θ" row when compressing ACSII text, and yet other rows may not even be used, such as the "Z" row when compressing ASCII text. Thus, it is a more efficient use of memory to hash two input bytes; multiple input byte pairs map to each row, keeping the number of rows and amount of memory small, and the hashing function partially evens out the demand so that row usage is more evenly distributed than would otherwise be possible, making the best use of the smaller amount of memory.

With more than one input byte pair mapping to each reference table row, it is necessary to verify each reference pointer to insure that it points to a window byte pair which truly matches the input bytes. It is common for a reference pointer to point to a window byte pair which produces the same hash value but does not match the input byte pair. This happens because the hash function is a many to one mapping, relating many input byte pairs to the same reference table row. To verify a reference pointer, it is necessary to follow the reference pointer to the window byte pair it addresses and compare the window byte pair with the current input byte pair to verify an actual match. As described below, only one byte of each pair need actually take part in this comparison.

The target window location of any verified reference pointer is a candidate for the beginning of the longest match. To select from among the longest match candidates, the window byte which follows the window byte pair given by each verified reference pointer is compared with the next input byte in an effort to extend the match to a greater length. Any candidate which miscompares is eliminated, and the longest match search continues by comparing, in sequence, each input byte to each window byte of every surviving candidate. Candidates are eliminated as soon as an input byte and a corresponding window byte miscompare. The last candidate to be eliminated is determined the longest match. In the case of a tie, i.e. when two or more last candidates are eliminated by miscomparing to the same input byte, the candidate which is closer to the insertion end of the window is declared the longest match winner. Since the encoding of copy tokens is generally shorter for matches closer to the insertion end of the window, this tie-breaking method insures selection of the match that yields the best compression.

In general, hash function 302 may operate on more than two input bytes at a time, but when the hash function is defined to operate on L input bytes at a time, then the minimum length of a match is constrained to be greater than or equal to L. This is because the start of a match is found with a reference pointer which in turn is found via the hash function. Thus, unless a sequence of input bytes is long enough so that its hash function is defined, the sequence cannot be matched to a sequence of window bytes.

Hash function 302 should have the property that the probabilities Of reference table addresses at its output should be random and evenly distributed (i.e. a uniform or flat probability density function), even though the input bytes upon which it operates may be far from random and far from evenly distributed. Thus, the hash function should operate on at least two bytes in an effort to flatten out the probability distribution of reference table addresses.

Figure 4:
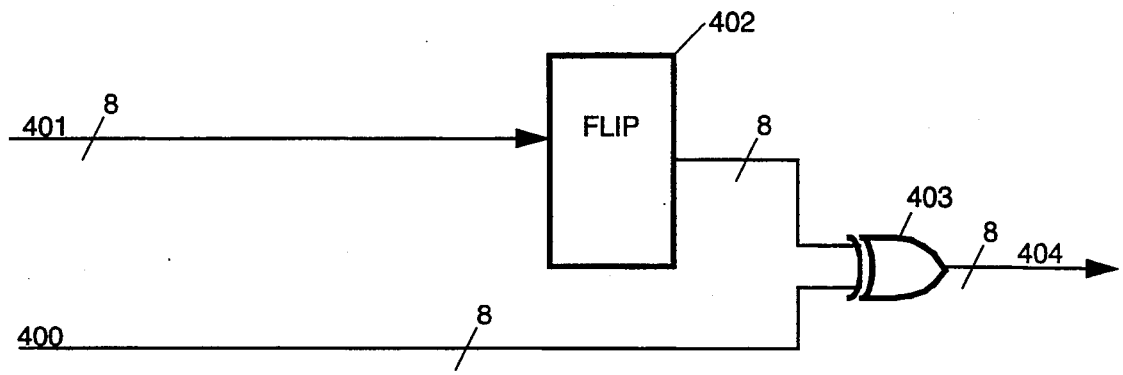
FIG. 4 shows the hash function of the 512-byte-optimized embodiment.

The 512-byte-optimized embodiment of the invention includes a hash function which accepts two input bytes, the current input byte (just received) and the previous input byte, and generates an eight-bit address for addressing a 256-row reference table. This hash function is shown in FIG. 4. Eight-bit bus 401 feeds the previous input byte to flip device 402, where it is flipped end-for-end. The flip is simply a reordering of the bits so that the most significant bit becomes the least significant, the least significant bit becomes the most significant, and so forth. The flipped previous input byte is combined with the current input byte received on eight-bit bus 400 by eight exclusive or gates 403 to form the hashed reference table address on bus 404. This hash function can be expected to perform well because in typical data, the upper bits of each byte tend to be similar. ASCII text, for example, always has a logical 0 as the most significant bit and frequently the three most significant bits are logical 011 which covers the portion of the ASCII code representing the lower-case English alphabet. By flipping one byte end-for-end, the bits which are the most predictable for one byte (the upper bits) are combined with the least predictable bits of the other byte (the lower bits) through the exclusive-or function.

This idea can be extended to a hash function operating on three or more input bytes. In one approach, each input byte would be split into a low nibble (i.e. least-significant four bits) and a high nibble (i.e. most-significant four bits). Each low nibble would be combined, via a bit-wise exclusive-or, with the high nibble of one of the other bytes with either the low or the high nibble flipped end-for-end. With most input data, these three combined nibbles would then be sufficiently random to combine in a simple way (by concatenation or exclusive-or for example) to form the desired number of bits for a reference table row address. For example, if a twelve-bit hash value was desired for accessing a 4096-row reference table, then the three nibbles formed as described above could simply be concatenated. Alternatively, if an eight-bit hash value was desired, then it could be formed from the twelve-bits of the three nibbles by an exclusive-or of two of the nibbles and the subsequent concatenation of the third nibble. It is desirable that the process of verifying the match be simplified by choosing a hash function such that if two bytes of the window data match two input bytes, then the third byte is guaranteed to match. This is an extension of the preferred hash constraint described below.

The hash function of FIG. 4, is designed to address the reference table of the 512-byte-optimized embodiment which has 256 entries. For larger reference table sizes which are powers of two, the flipped previous input byte can be shifted so that its most significant bit aligns with the most significant bit of the reference table address; then, only where the current and flipped previous input bytes overlap are the bits combined in exclusive-or fashion. For example if the previous input byte is 83 (hexadecimal), the current input byte is F0 (hexadecimal), and the reference table has 1,024 rows requiring a ten bit address, then the hash function would flip the previous input byte (C1 hexadecimal), shift the flipped byte two bits to the left (304 hexadecimal), and combine the result with the current input byte (F0 hexadecimal) with a bit-wise exclusive-or to yield the address 3F4 (hexadecimal). An alternative and equivalent hash function flips the current input byte and combines it with the unflipped previous input byte, left-shifting the flipped current input byte if the resulting address is to be longer than eight bits (flipping the current input byte instead of the previous input byte).

It will be clear to one skilled in the art that a very wide variety of hash functions may be employed. Nevertheless, preferred hash functions satisfy an important constraint: for any given current input byte value every possible value of the previous input byte hashes to a different reference table address. This constraint simplifies the implementation and speeds up reference pointer verification. The simplification is this: when verifying a reference pointer generated by a hash function that satisfies the preferred constraint, it is sufficient to confirm that the second byte of the window byte pair matches the current input byte used in the hash function. If these bytes match, then the first byte of the window byte pair is guaranteed to match the previous input byte by virtue of the properties of the hash function.

The word hash has denotations of chopping into small pieces and mixing. In this spirit, flip device 402 can be thought of as one particular chopping and mixing of the previous input byte. There are 8! (8 factorial) such scrambled versions of the previous input byte, and replacing flip device 402 with any one of them would create a hash function that satisfies the preferred constraint. There are also a myriad of Boolean functions which could be performed to alter the current input byte prior to the exclusive or function of the two altered bytes that would satisfy the preferred constraint. It is possible that a given set of input data will hash more effectively (i.e. with fewer collisions and overwriting of reference pointers) with such hash functions. The disclosed function was chosen from among this set because it is simple yet effective.

An alternative and equivalent hash function constraint is to insure that for any given previous input byte value, each possible current input byte value hashes to a different reference table row. The property thereby guaranteed is that a reference pointer can be verified if the first byte of the window pair matches the previous input byte supplied to the hash function—the other byte always matches. This differs from the preferred constraint previously described in that the first byte of the window byte pair must be compared instead of the second byte. Once again there are myriad variations upon this basic theme that will be clear to one skilled in the art.

These constraints can be generalized for application to hash functions which operate on three or more bytes. For example, a hash function operating on three bytes will allow one of the bytes to go uncompared if, given any combination of the other two bytes, every value of the third byte hashes to a different address. With eight-bit bytes, the reference table needs at least 256 rows, and the byte which need not be compared is the third byte used in the hash function. With a larger reference table and a different constraint, two of the hashed bytes need not be compared. This can be accomplished when given any value for the first byte, every different combination of the other two hashes to a different address. With eight-bit bytes, the reference table needs a minimum of 256 times 256 (65,536) rows, and only the first byte of the hash function needs to be compared to verify a match. In the limit with a three byte input, no verification is necessary if every possible combination of the three hashed bytes produces a unique address. This would require exactly 256 times 256 times 256 (over 16 million) rows.

The hash function of the FIG. 4 satisfies both the preferred and alternative constraints, although satisfying both offers the same advantage as satisfying either constraint. It is the simplification resulting from the first constraint which is used in the preferred embodiment. This simplification is that only the second byte of a window byte pair must match the current input byte to verify that the reference pointer points to a true match. Because of this, each reference pointer of the preferred embodiment addresses the second byte of the window byte pair it represents. Thus, the reference pointer is the address of the window byte which is compared to the current input byte. It would also be possible to store reference pointers which address the first byte of their corresponding window byte pairs and still use the preferred constraint. In this embodiment, the compressor would add one (modulo the window length) to the reference pointer before addressing the window and comparing to the current window byte. It will be obvious that embodiments which satisfy the alternative hash constraint will have similar variations with respect to which byte of the window byte pair is pointed to by the reference pointer.

An example of a hash function which satisfies only one of the aforementioned hash constraints is one where a bit-wise exclusive-or combines the first input byte as flipped end-for-end with the unflipped version of the same first byte and then combines the resulting byte, by bit-wise exclusive-or, with the second byte. Along similar lines, if both input bytes are flipped end-for-end and combined, by bit-wise exclusive-or, with their respective unflipped values and the resulting two bytes are then combined by bit-wise exclusive-or, then the hash function satisfies neither of the aforementioned hash constraints.

The hash functions disclosed herein are not unique. There are many equally suitable hash functions which will satisfy one or both constraints and produce the appropriate range of reference table addresses for any size reference table. It will be obvious to one skilled in the art that these other hash functions could be employed without departing from the spirit and the scope of the invention.

THE REFERENCE TABLE

Figure 5:
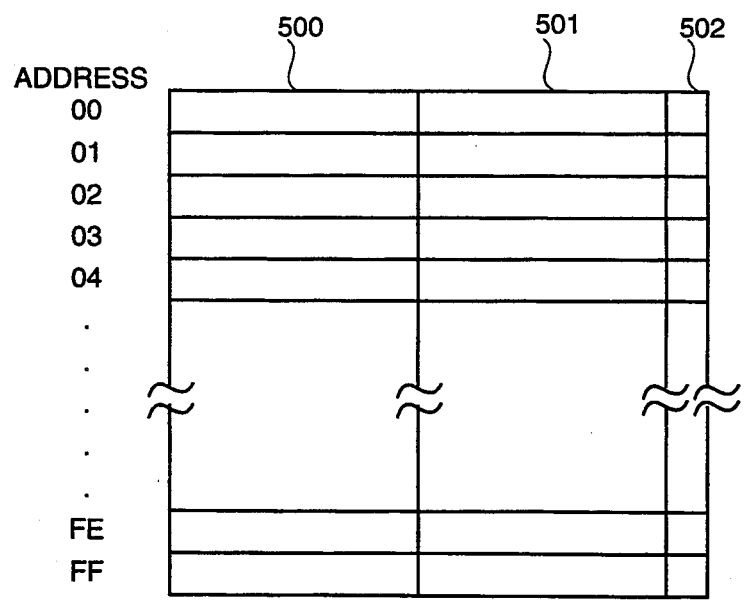
FIG. 5 shows the reference table organization in the 512-byte-optimized embodiment.

The reference table of the 512-byte-optimized embodiment is shown in FIG. 5. The reference table is organized into 256 rows, each with its own address (shown in hexadecimal). To satisfy either or both of the hash function constraints, there must be at least as many reference table rows as there are possible input byte values; thus, 256 is the minimum number of rows for the reference table given eight bits per byte. Each row of the reference table has storage space for two reference pointers 500 and 501 which may point to instances of window byte pairs which hash to the address of the row. Each row also has storage space for the row-validity indicator 502.

In the 512-byte-optimized embodiment, the reference table is implemented with a partial memory reset which resets selected bits in every row simultaneously. In this case, the row validity indicators 502 can be simply a single bit per row which will be referred to as the used flag. When used flag 502 of a particular row is clear, then the reference pointers in the row contain un-initialized (stale) data. When used flag 502 in a row is set, then the reference pointers either both point to window byte pairs which are currently valid in this compression operation, or one of the reference pointers has been initialized to the clear flag which signifies the absence of a valid reference pointer and the other points to a window byte pair which is currently valid. In the 512-byte-optimized embodiment with a 512 byte window, the clear flag may be selected to be 511 (1FF hexadecimal shown in block 911 of FIG. 9) which would otherwise indicate a reference pointer which points to the last window byte pair in the window. Being the last pair of bytes in the data block, there is no further data to which they could match. In other embodiments where the size of the data block is larger than the window and the window slides over the data block, every window location may be the target of a reference pointer. In this case it is most efficient if the window has a capacity of one less than a power of two, so that the reference pointers in the reference table are stored in a minimum number of bits with one value left to assign as the clear flag.

The dimensions of the reference table of the 512-byte-optimized embodiment are 256 rows for length and two reference pointers plus a one-bit flag per row for width. These dimensions were chosen as the best trade-off of compression efficiency and memory requirements for an application in which data is received in 512-byte blocks and compressed with a 512-byte window. For other size data blocks and other size windows, other lengths and widths are likely to provide a better trade-off.

A longer reference table, one with more rows, can be used to provide more storage space for reference pointers. This is useful for providing better compression efficiency on 512 byte data blocks or for maintaining compression ratio when compressing longer data blocks in potentially larger windows. The additional length increases the number of reference table addresses, and a hash function, such as one of the variations described previously, must be used to access the additional reference table addresses while keeping the usage frequency of each particular address relatively equal. With more reference table rows, the average number of input byte pairs which map to each row decreases, and it becomes less likely that a row will become full so that reference pointers are overwritten in FIFO fashion.

A wider reference table, one with storage space for more reference pointers on each row, can also be used to increase the average compression ratio or to provide more reference pointer storage for larger data blocks with possibly larger windows. The increase in compression ratio is a direct result of the fact that each row can store more reference pointers before the oldest gets overwritten in FIFO fashion.

The length and width of the reference table of the 512-byte-optimized embodiment were chosen to minimize the compressor/decompressor implementation cost (logic gates and memory) without sacrificing much compression efficiency. The larger the reference table chosen, the more effective the hashing will be and the better the compression ratio between the input byte stream and the compressed output byte stream, but at a higher implementation cost. Also, for a given size of reference table (in total bits), there is a trade off between number of rows and width of rows. For some applications, an increase in width may be preferred over an increase in length: an increase in the number of reference pointers per row (width) does not increase the total number of bits allocated as used flags or modulo operation counts and better absorbs non-uniformities in reference table address frequency which helps support simpler-to-implement hash functions. For other applications, an increase in length may be preferred over an increase in width: additional width comes at a cost of more window memory operations (additional time) for verifying reference pointers and extending matches.

COMPRESSOR OPERATION

Figure 6:
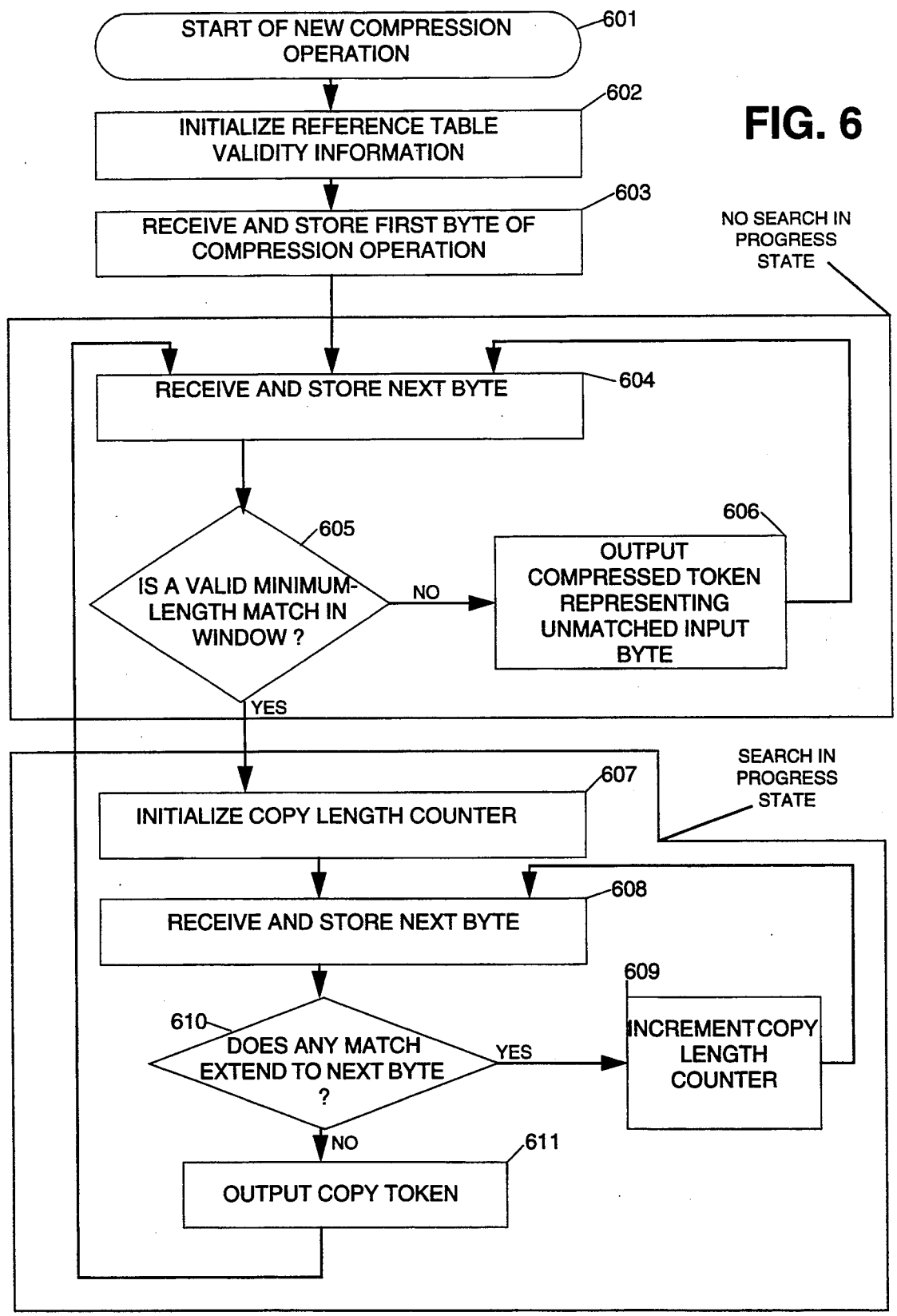
FIG. 6 shows a flowchart of the operation of the basic compressor.

FIG. 6 shows a logic flowchart illustrating the basic operation of the compressor of the present invention. Compression and decompression in accordance with the present invention is generally done on data of a particular size or having a fixed maximum size, though there is nothing in the present invention that establishes this as a rigid limitation. For instance, the present invention is readily usable with a storage system such as a disk drive or a tape drive having a fixed data block size or equivalent, or an application such as a flash memory or data communications not having a fixed sector size or equivalent, wherein the sector or equivalent would demarcate the data block to be compressed.

At the start of a new compression operation (step 601), the reference table is initialized to invalidate any information remaining stored therein from any previous compression operation (step 602), and the first byte of the data stream is received and stored (step 603). At this time, the window is empty and the reference table (717 in FIG. 7) does not contain any currently valid data. When the next byte is received (step 604), it too is stored in the window at the next window address, preferably but not necessarily in a circular fashion so that the address of any character in the window does not change from the time it is first put in the window until it is overwritten. As step 605 illustrates, a test is then performed to check whether there is a valid minimum-length match in the window. In the preferred embodiment, this is done by hashing, using a bit-by-bit exclusive-or hash function, the last received byte with the immediately previous received byte as bit flipped end-for-end, and using the hash value to address the reference table 717 (FIG. 7). The minimum length of a match is two bytes, and this is enforced by the two-byte hash function used in finding a match. Obviously the first time through on a new compression operation, there will not be a valid match, as there are no valid entries in the reference table pointing to any bytes in the window. Consequently in step 606, the first byte is compressed as an alphabet token, and the corresponding alphabet flag and compressed byte representing the unmatched input byte are output as the first token in the compressed data stream. Also the current window address is stored as a now-valid entry in the reference table at the address corresponding to the hashed value, so that a subsequent pair of characters which hash to the same value (and therefore have some likelihood of matching the current pair) will cause the retrieval of the current window address so that they may be tested against the current pair for a match.

When the third byte is received (back again to step 604), it is stored in the window at the next window address and hashed with the immediately previous byte as described. If the hashed value is the same as the first hashed value was for the first two bytes, the reference pointer is retrieved and the current byte is compared with the byte pointed to in the window. If they do not match, or the hashed value is not the same as the first hashed value, the process of step 606 is repeated by compressing the second byte as an alphabet token and outputting the corresponding alphabet flag and compressed byte representing the unmatched input byte as the second token in the compressed data stream. Also the current window address is stored in the reference table as another now-valid entry in the reference table at the address corresponding to the hashed value.

However, if they do match, there must be at least a two-byte match as previously described. Therefore at least the two bytes will be compressed by a copy token. Thus the search-in-progress state is entered; the copy-length counter is initialized (step 607); the next byte is received and stored in the window; the reference table information is updated (step 608); and the next byte is tested to see if the match extends to that byte (step 610). If the match does extend to that byte, then the copy-length counter is incremented (step 609), and still another byte is received and stored in the window. This is repeated until the match does not extend to the current input byte or until a maximum match length is encountered (which may be necessary due to such things as hardware limitations). At that time, the appropriate flag bit is output, followed by the displacement of the matching string in the window, followed by the length of the string to be copied by the decompressor (step 611). At this point, the compressor returns to the no-search-in-progress state, and the next byte is received and processed as hereinbefore described starting again in step 604.

In the 512-byte-optimized embodiment, there can be up to two entries (reference pointers) in the reference table for any one hash value, so that up to two tests for matches are made for each pair of bytes hashed. In general, there would be one test for a match per reference pointer. Whether or not a match is found or a match is extended, the current window address is Stored, as a reference pointer, in the reference table at the row corresponding to the hash value, overwriting the oldest (furthest from the current window entry point) reference pointer in the row if necessary.

COMPRESSOR ARCHITECTURE

The first step of each compression operation is to clear the reference table. If the reference table is implemented in a RAM or other technology which allows a full memory reset, i.e. resetting every bit in the memory by the assertion of a reset signal, then the reference table can be cleared all at once with every reference pointer set to the clear flag. In this case no row-validity indicators 502 are necessary. However, the time typically required to complete a full memory reset is much more than the time available. Instead, technologies which support a partial memory reset, i.e. resetting only a predetermined number of bits at each address by the assertion of a reset signal, allow the entire reference table to be cleared in effect by only clearing the row-validity indicator 502 at each row address. In this particular embodiment, the row-validity indicator takes the form of a one-bit used flag. Typically, clearing only one bit in each row can be performed in a sufficiently short period of time.

Once the reference table is cleared, compression begins. The necessary interfaces and data flow control change with the application and will be familiar to those versed in the prior art; therefore, this disclosure will not make reference to handshaking protocols, FIFO buffers, and the like.

As shown in FIG. 6, the compressor operates in two different states, a search-in-progress state and a no-search-in-progress state. The compressor starts by entering the no-search-in-progress state.

FIG. 7 is a block diagram (not showing control logic) of the basic compressor. When the first input byte of a compression operation is received on byte-wide input bus 700, it is latched into the current input byte register 701. Since hash function 716 requires two input bytes, the compressor takes no action until the second input byte is received. Upon receipt of the second input byte or upon receipt of any input byte while in the no-search-in-progress state, the contents of current input byte register 701 is latched into previous input byte register 702. Simultaneously, the newly received input byte is latched into current input byte register 701. The previous input byte in previous input byte register 702 is stored in window RAM 709 at the location chosen by byte counter 722 via address multiplexer 710. Byte counter 722, which is cleared at the beginning of each independent compression operation, is incremented to point to the new insertion end of window RAM 709. Byte counter 722 is incremented for each byte that is input into the compressor. Hash function 716 operates on the contents of input byte registers 701 and 702 in the manner previously described. The contents of reference table 717, at the address (particular reference table row) generated by hash function 716, is retrieved.

Reference table 717 represents more than just a memory, as is seen in FIG. 9 which shows the internal structure of reference table 717 (FIG. 7) without its associated control logic. The central feature of the reference table is the reference table RAM 900. The dotted lines through reference table RAM 900 serve to illustrate the three logical fields, the two larger fields 901 and 902 for reference pointers and the smaller field 903 for the row-validity indicator (i.e. a one-bit used flag or alternatively a multi-bit modulo operation count). Each field is treated as if it had separate data inputs and outputs, but they may be implemented as a single RAM since all three fields are accessed with the same address on address bus 904 which, as FIG. 7 shows, is the output of hash function 716. In the 512-byte-optimized embodiment, reference table RAM 900 has a functional width of 19 bits for storing two nine-bit reference pointers into 512-byte window RAM 709 and a one-bit used flag. Obviously, the number of reference pointers per reference table row and the size of the compression window are design choices that may differ among different implementations of the invention. The implementation width of reference table RAM 900 depends on the technique used to clear it between compression operations, as is explained below. Reference table 717 also includes feedback register 906, which latches the newer reference pointer in the row to be written back into the older reference pointer field 901, and selection multiplexer 907, operable to set the older reference pointer to the clear flag by selecting constant clear flag source 911.

With each new input byte, the row of reference table 717 that is selected with the address generated by hash function 716 undergoes a read-update operation. In the read portion of each read-update operation, the row addressed by hash function 716 is read and the reference pointers 901 and 902 are sent to search-in-progress counters 718 and 719. Reference pointer 902 is also latched into feedback register 906. Used flag 903 is forwarded to control logic not shown. If the used flag of the selected row is clear, then neither reference pointer in the row is valid. In this case, the update portion of each read-update operation writes a word to the selected row consisting of:

(1) the clear flag which is written into old reference pointer field 901 from constant clear value source 911 via selection multiplexer 907;

(2) the new reference pointer which is written into new reference pointer field 902 from line 909, which as shown in FIG. 7, is the output of byte counter 722 (in the 512-byte-optimized embodiment the byte counter points to the window location of the second data byte in the newly inserted window byte pair); and (3) a set value provided by constant set value source 910, which sets the used flag for future accesses to this row.

If the used flag of the selected row is set, due to a previous read-update operation performed as just described, then at least one of the reference pointers is valid. The update portion of the read-update operation then involves writing a word to the reference table RAM consisting of:

(1) The reference pointer contained in new reference pointer field 902 which, having been latched in feedback register 906, overwrites the reference pointer in old reference pointer field 901, thus maintaining the reference pointers in a FIFO manner;

(2) the current value of byte counter 722 which is the new reference pointer written into new reference pointer field 902; and (3) a set value for the used flag.

Except for the very first byte of each independent compression operation, the read-update operation is performed with each new input byte regardless of the current state of the compressor, i.e. search-in-progress or no-search-in-progress. The read-update operation serves to synchronize the reference pointers in the reference table with the input data as it is inserted into the window.

When the state is no-search-in-progress, then the read portion of the read-update operation becomes an integral part of the search for a longest match. If the used flag of the selected row is clear, then the current input byte pair is the first pair to hash to this reference table row in the current independent compression operation, and there is no accessible match in the window for the current input byte pair. In this case, the previous input byte in register 702 is encoded as an alphabet token by alphabet remapper 703 and alphabet encoder 705 (the functions of both are described below in conjunction with unary length codes).

If, on the other hand, the used flag is set, then there is at least one candidate for a match of at least two bytes in the window memory. In this case, reference pointers 901 and 902 are latched into search-in-progress counters 718 and 719. Search-in-progress counter 719, guaranteed to contain a valid pointer by the value of the used flag, then addresses window RAM 709. Search-in-progress counter 718 also addresses the window RAM 709, but only if it does not contain the clear flag. The output of the window RAM is compared to the current input byte in register 701 by the comparator 704. If both comparisons fail because of a miscompare or one search fails because of a miscompare and the other is aborted by the clear flag in search-in-progress counter 718, then there is no match and the previous input byte in register 702 is encoded into the output stream as an alphabet token by alphabet remapper 703 and alphabet encoder 705.

If, however, one or both comparisons turn up a matching pair of window bytes, then the compressor changes its state to search-in-progress. In this case, the search for the longest match continues by incrementing any (one or both) search-in-progress counter containing a verified reference pointer to a matching window byte pair and setting copy-length counter 720 to an initial value of 2, which is the initial match length. Initializing the copy length counter to the initial match length clears the counter. With each new input byte, the compressor attempts to extend the current longest match candidates by comparing the contents of the window, addressed by each surviving search-in-progress counter 718 and/or 719, to the contents of current input byte register 701, with the read-update operations on reference table continuing as described above to keep the reference table and window synchronized. As long as the bytes match, the search-in-progress counter survives (the match is extended) and is incremented along with the copy-length counter. If one of the search-in-progress counter addresses results in a miscompare then that particular search is terminated. When, finally, both searches conducted by the search-in-progress counters result in miscompares (or at the end of a compression operation), then the longest match has been found. The contents of the search-in-progress counter which caused the last miscompare is selected by encoder multiplexer 740. In the case of a tie, when both searches (one for each search-in-progress counter) fail by miscomparing against the same input byte, the contents of search-in-progress counter 719 is selected by encoder multiplexer 740. This is a consequence of the FIFO manner in which the reference pointers are overwritten; reference pointer 902, feeding search-in-progress counter 719, is the most recently inserted reference pointer and thereby guaranteed to point to the closest match to the insertion end of the window in the case of a tie. The contents of the search-in-progress counter selected by encoder multiplexer 740 is sent to displacement encoder 707 where, in combination with byte counter 722, it determines the displacement field of the copy token. Displacement encoder 707 subtracts byte counter output 759 from the output of multiplexer 740 to determine the displacement value which is subsequently encoded into a compact binary representation. FIGS. 19(a)–19(c) shows the binary encoding used in the 512-byte-optimized embodiment to achieve a compact representation of displacement values. It will be seen by those skilled in the art that displacement encoder 707 may encode using not only a prefix code, but also other binary encoding methods such as a Huffman code or a unary-length code. The copy-length value in copy-length counter 720 is sent to length encoder 706 to become the copy-length field of the copy token. FIGS. 18(a)–18(d) shows the binary encoding used in the 512-byte-optimized embodiment to achieve a compact representation of copy-length values. Once the longest match is identified, the state of the compressor returns to no-search-in-progress.

FIG. 7 also includes pack block 708 which has the responsibility of putting the compressed tokens into the compressed output stream. In many applications, the compressed output stream must leave the compressor in fixed-size bytes, and the pack block has the job of packing the variable-length tokens into the fixed-size bytes required by the external world.

FIGS. 8(a)–8(c) shows an example of a compression operation upon a 32 byte block of data, illustrating how the compressor responds to each new input byte. The output shown in FIG. 8 is encoded using the unary-length codes of the 512-byte-optimized embodiment of the invention described hereinafter.

REFERENCE TABLE CLEARING

In order for the compressor/decompressor to operate properly, each reference pointer within each row of the reference table must indicate whether or not it is valid, i.e. empty after power up or out of date because they are left over from a previous compression operation. This is done either with the clear flag value or through a row-validity indicator. Disclosed herein are three alternative embodiments of the invention that differ in how they handle reference table clearing.

The simplest case is where the RAM (or other memory) technology used to implement the reference table can quickly reset all bits at every address to a predetermined value. In this case, the reference pointer clear flag value is chosen to be the reset value of the RAM technology. The storage of reference pointers should be altered so that the clear flag is truly an otherwise illegal reference pointer value. For example, typically the reset of the memory would set every bit to a logical zero. This can be made consistent with the 512-byte-optimized clear flag value of 1 FF (hexadecimal for the nine-bit all-ones value) by storing reference pointers in inverted form. This is done by inverting the inputs to the memory and inverting the outputs of the memory, making the all-zeroes memory reset value appear to be the expected all-ones clear value. No additional validity information is required and row-validity indicator field 502 (FIG. 5) can be eliminated from the reference table. The reference table is cleared between independent compression operations by resetting the entire RAM, setting every reference pointer in the reference table to the clear flag.

The next-simplest case is that described in the preferred embodiment where the RAM technology can reset, with acceptable speed and implementation cost, a limited number of bits at each address simultaneously. In this case, row-validity indicator 502 becomes a one-bit used flag found in each row of the reference table. At the start of each independent compression operation, all used flag bits are reset. When a valid pointer is written into a row, the used flag bit of that row is set. FIG. 9 illustrates this embodiment utilizing the technology of a partially resetable RAM that can simultaneously clear one field within each memory row. Control input 920, partial memory reset, when active clears each used flag at every address. This effectively invalidates every reference pointer in the reference table. The first time each row is written after a partial memory reset, i.e. in a read-update operation, the older reference pointer field 901 is set to the clear flag, a new reference pointer is written in field 902, and the used flag bit of that row is set by constant set value 910.

Not all current RAM technologies provide a method of partial or full memory reset, i.e. clearing some or all bits at every address concurrently. Many RAM technologies require that each address in the RAM be initialized separately. In this situation, the more general modulo operation count field is used for row-validity indicator 502 in place of the used flag. In this most-complex embodiment of the invention, an additional initialization step is needed, after power up and before the first compression operation, to clear the modulo operation count in each row of the reference table. This can be accomplished through some control logic which uses clear address counter 1020, shown in FIG. 10, to sequence through all row addresses in the reference table.

FIG. 10 shows a block diagram of the reference table from FIG. 7 with the addition of the clearing circuit used by this embodiment of the invention to distinguish between current valid pointers in the reference table and stale pointers left over from a previous compression operation or unknown values left over from power up. The clearing circuitry comprises two counters, 1020 and 1022, one extra feedback register, additional multiplexing, and control logic (not shown). Clear address counter 1020 produces a reference table address 1021 which is multiplexed onto address line 1025 by address multiplexer 1015 during each clear operation. Modulo operation counter 1022 counts the number of compression operations modulo a predetermined number that is large enough to ensure that there is no confusion between the current and previous compression operations. In this embodiment, the contents of modulo operation counter 1022 replace the constant set value 910 (FIG. 9), and the clear flag input 916 is replaced by a modulo operation count input 1016 which allows the contents of modulo operation counter 1022 to be written into the modulo count field 1003 of reference table RAM 1000. The modulo operation counter is initialized to one more than the value to which the modulo operation count fields are initialized, (e.g. during initialization, the modulo operation count fields 1003 can be initialized to zero by modulo operation counter 1022 after which the modulo operation counter is incremented to one). Full initialization of the reference table, by use of the clearing circuitry, is only required upon power up before the first compression operation has started.

The read-update operation of the reference table of FIG. 10, that utilizes non-resetable memory technology, is now described. In the read portion, modulo count field 1003 of the selected row is compared to the current value of modulo operation counter 1022. If equal, then the row has at least one valid reference pointer—this is equivalent to the used flag 903 being set in the embodiment of FIG. 9. The modulo count field 1003 of the selected row is updated during the update phase of each read-update operation by writing the current value of modulo operation counter 1022 into modulo count field 1003. Therefore, if a row's modulo count field 1003 is equal to the value of modulo operation counter 1022, then the row contains valid reference pointers for the current compression operation.

After completion of a compression operation, the reference table is effectively cleared prior to a new compression operation by simply incrementing modulo operation counter 1022. After incrementing, no modulo operation count field 1003 in the reference table will match the modulo operation counter's new value, and thus all rows of the reference table have been marked as invalid.

This method of clearing the reference table works until the modulo operation counter is incremented and rolls over to the initialization value. Potentially after rolling over, the modulo operation counter contains a value for which there is a match in the modulo count field 1003 of some row. The problem of rolling over to the initialization value can be solved by forcing every row in the reference table to be updated at least once before the modulo operation counter 1022 rolls over.

A clear operation is periodically performed upon a single row or upon a group of rows. The clear operation consists of writing the modulo operation count into the modulo count field of the row of the reference table that is presently addressed by clear address counter 1020, and then incrementing the clear address counter, so that it points to the next row address. During the clear operation, if the modulo operation count field 1003 is equal to the current value of modulo operation counter 1022, then the contents of the reference table row is not changed; the reference pointers are fed back from feedback registers 1005 and 1006. If modulo count field 1003 does not equal the modulo operation counter 1022 (indicating an invalid or empty row), then when the modulo operation count is written into the modulo count field, each reference pointer in the row is set to the clear flag value by constant clear flag source 1011 via selection multiplexers 1007 and 1008. The reference pointers must be set to the clear flag because the new modulo count field value indicates that the reference pointers would otherwise be valid.

Clear operations may be performed regularly as part of processing each input byte, or performed during an idle time, or performed periodically by pausing the compressor then restarting when finished clearing. If the clear operations are performed often enough, then each row in the reference table either contains valid reference pointers or has a modulo operation count field 1003 that indicates an empty or invalid row, i.e. there will be no row with the current value of the modulo operation counter and stale reference pointers.

DECOMPRESSOR OPERATION

FIG. 11 shows the operation of the basic decompressor. At the start of each decompression operation (step 1101), a token is read from the compressed data byte stream (step 1102). To read a token it is necessary to determine the token type, i.e. copy token or alphabet token, by interpreting the first bit of the token as a flag identifying either a copy token or an alphabet token. The token type partially determines the length of the token (in bits) and fully determines what processing is needed to decompress the token, the decision made in step 1103.

In the case of an alphabet token, the alphabet byte is decoded from its encoded representation in the token (step 1104), output from the decompressor as a decompressed output byte, and entered into the decompressor's window (step 1107). Then, the next token is read from the compressed byte stream (step 1102 again).

In the case of a copy token, the displacement is decoded from the token (step 1105), and the copy length is decoded and latched in the copy-length counter (step 1106). The window is accessed at the location given by the displacement and the byte at that location is output from the decompressor as a decompressed output byte and is entered into the decompressor's window (step 1108). Then the copy-length counter is decremented (step 1109) and tested to see if another byte still remains to be output in response to the current copy token (step 1110). Note that entering the newly decompressed output byte into the decompressor's window moves the insertion end of the window which causes the same displacement value to address subsequent bytes from the window with each byte output in response to the copy token (each loop through steps 1108, 1109, and 1110).

In an embodiment, such as the circular-buffer-based window described in regard to FIG. 6 above, where the actual address of window bytes does not change once they are stored, then the decoding process treats the displacement value similar to the copy-length value. That is, an initial window memory address is computed from the displacement value decoded from the copy token and the window memory address of the byte currently being inserted (the address of the insertion end of the window). This initial address is latched in a counter and is decremented once per each byte output in response to the current copy token (i.e. in step 1109).

DECOMPRESSOR ARCHITECTURE

FIG. 12 shows a block diagram of the basic decompressor architecture. Unpack block 1230 receives the compressed input stream, and parses the compressed input stream into variable-length copy and alphabet tokens. Tokens which are recognized as alphabet tokens are passed to alphabet decoder 1229 which decodes the unary-length codes and passes on the remapped alphabet byte to alphabet demapper 1225 (the decoder and demapper functions will become clear when the coding of alphabet tokens and unary-length codes is discussed below). The decompressed alphabet byte is selected by output multiplexer 1224 and latched in Output register 1223 which feeds the decompressed output stream. The decompressed alphabet byte in output register 1223 is also written into window RAM 1209 at the address selected by byte counter 1222 via address multiplexer 1210. This updates the window RAM so that the decompressor replicates the window created and used during compression. Byte counter 1222 is incremented to point to the new insertion end of the window, and the next token is decompressed.

When unpack block 1230 detects that the current token is a copy token, then the displacement field is decoded back into its fixed-length binary representation by displacement decoder 1227. In an embodiment with the window implemented as a circular buffer where a window byte retains the same address from its insertion until it is overwritten, the current value of byte counter 1222, representing the location of the insertion end of the window, is subtracted from the decoded displacement by subtracter 1215 to yield the window address of the first byte of the match. This address is latched into address counter 1214 which then addresses window RAM 1209 via address multiplexer 1210 to retrieve the first decompressed byte indicated by the copy token. The decompressed byte is selected by output multiplexer 1224, and is then latched in output register 1223. As is the case with alphabet bytes, the decompressed copy byte in output register 1223 feeds the decompressed output stream and is also written back into window RAM 1209 at the address of the insertion end of the window specified by byte counter 1222. As the first byte is retrieved in response to the copy token, unpack block 1230 may simultaneously send the copy-length field of the copy token through length decoder 1226, which decodes the copy length into a fixed length binary representation, to copy-length counter 1220 where it is latched. After the copy length is latched and the first byte of the copy is written into window RAM 1209, the copy-length counter is decremented to reflect the number of bytes remaining to be retrieved in response to the copy token, and the byte counter is incremented to reflect the new location of the insertion end of the window. Additionally, address counter 1214 is incremented to the next address in the window at which the next byte of the copy will be retrieved. This process is repeated until the copy-length counter is decremented to zero: address counter 1214 is used to fetch the next byte out of window RAM 1209, which is latched into output register 1223 by way of output multiplexer 1224; next, the new decompressed output byte is available in the decompressed output stream and also stored in window RAM 1209 at the insertion end of the window addressed by byte counter 1222; finally, byte counter 1222 and address counter 1214 are incremented and copy-length counter 1220 is decremented.

DIFFERENTIAL COPY LENGTHS

In the differential-copy-length embodiment, differential copy lengths are encoded into the copy-length field of copy tokens. Actual or non-differential copy lengths are used when no differential copy length exists. The length of the match is encoded differentially only when more than one reference pointer is verified as pointing to a matching window byte pair and, upon extending these matches, the one closer to the deletion end of the window is found to be the longest. In this case, the copy length output by the compressor is the difference between the length of the longest match and the shorter second-longest match nearer the insertion end of the window.

FIG. 13 shows a flowchart of the operation of a differential-copy-length compressor. In comparison to FIG. 6, the basic compressor operation flowchart, a differential-copy-length compressor performs the same steps with the exception that it may choose (in step 1311) to clear the copy-length counter (step 1312) instead of performing the increment (in step 1309). Clearing the copy-length counter when the longest match candidate closest to the insertion end of the window miscompares to the input byte stream is equivalent to subtracting the length of the second-longest match from the length of the longest match: after being cleared, the copy-length counter begins counting the differential copy length without any need for an actual subtracter.

A version of the compressor that uses differential copy lengths may be constructed from the same basic compressor architecture shown in FIG. 7 by making a few changes to the control logic (not shown) so that the copy-length counter 720 operates in a different way. While in the no-search-in-progress state, reference pointers are read from reference table 717 and latched into search-in-progress counters 718 and 719 as before. Again the search-in-progress counters address window RAM 709 in order to verify that the reference pointers point to pairs of window bytes which match the current input bytes. As before, copy-length counter 720 begins counting the length of the candidates for the longest match. If the candidate nearest the deletion end of the window should miscompare first (search-in-progress counter 718), then the copy-length counter 720 continues counting and eventually issues the actual copy length as before; in these cases, a differential copy length does not exist because the compressor cannot find a second-longest match between the start of the longest match and the insertion end of the window. If, however, the candidate nearest the insertion end of the window miscompares first (search-in-progress counter 719), then copy-length counter 720 is cleared and resumes counting the copy length from its cleared value. This new length, counted by copy-length counter 720, is the differential length between the longest match and the second-longest match. When finally both candidates miscompare, copy-length counter 720 will contain the final differential copy length to be encoded.

With two types of copy lengths, actual and differential, it would be possible use two different encoders, one for actual copy lengths and one for differential copy lengths. However due to the increase in implementation costs, it is preferable to encode both types of copy lengths with the same encoder and hence use the same code. As a single code, the encoder is not efficient because the two domains are different: the smallest possible actual copy length is typically greater than one while the smallest possible differential copy length is identically one. To increase coding efficiency, an offset is added to differential copy lengths (or subtracted from actual copy lengths) so that the smallest differential copy length aligns with the smallest actual copy length. In this way, the high frequency of minimum-length copies aligns with the high frequency of minimum-differential-length copies, and further skews the copy length frequency distribution, reducing the average number of bits needed to represent each copy length. This offset is accomplished by clearing the copy-length counter to the smallest possible copy length value (actual and differential)instead of zero when the second-longest match miscompares.

In an embodiment with three or more reference pointers per reference table row, the compressor needs additional search-in-progress counters, one for each additional reference pointer. Since the longest match is not known beforehand, additional storage is also required for keeping track of the length of each match so that when the longest match is identified, the associated second-longest match can be determined and its length recalled and subtracted from the actual copy length to yield the differential copy length.

FIGS. 14(a)–14(c) shows an example of a differential-copy-length compression operation upon the same 32 byte block of data as used in FIGS. 8(a)–8(c), illustrating how the compressor responds to each new input byte. Of particular interest, is the processing of input bytes number 11 through 16 where a differential copy length is issued. The output shown in FIGS. 14(a)–14(b) is encoded using the unary-length codes of the 512-byte-optimized embodiment of the invention described hereinafter.

A decompressor which handles differential copy lengths operates in much the same way as the basic decompressor of FIG. 11 and FIG. 12. The principle difference is that the decompressor must distinguishes between actual copy length and differential-copy-length codes by maintaining a reference table which replicates the reference table constructed by the compressor. Consequently in FIG. 15, steps 1507 (decompressing an alphabet token) and 1508 (decompressing a copy token) now include the task of updating the reference table. To update the reference table, every pair of decompressed output bytes is hashed to address a row of the reference table, in which is stored the window memory address of the hashed pair. This is performed in the same way as the update of the reference table in the compressor and even includes the reference table clearing functions (i.e. maintaining clear flags and row-validity indicators as is done during compression). The only difference is that the compressor pairs and hashes the input bytes as they are received while the decompressor receives tokens which must be decompressed before the bytes to pair and hash are known. The hash function of the decompressor is necessarily equivalent and preferably identical to the hash function of the compressor. Identical hash functions may share hardware in a combined compressor/decompressor. An example of hash functions which are equivalent but not identical are the hash function in FIG. 4 and a hash function which is identical to FIG. 4 except that the bits of the output are flipped end-for-end.

The differential-copy-length decompressor handles copy tokens in a slightly different way than the basic decompressor. The differential-copy-length decompressor first looks up the window byte pair given by the displacement in the copy token (while retrieving the decompressed output byte in step 1508). In step 1509, this window byte pair is then hashed to find the corresponding row of the reference table. In this reference table row, the decompressor will find a first reference pointer to the same location specified by the displacement in the copy token and perhaps a second reference pointer. If there is a second reference pointer in the row and this second reference pointer points to a location which is nearer the insertion end-of the window than the first reference pointer, then the decompressor follows the second reference pointer to its destination in the window to verify that the window byte pair referenced by the second reference pointer matches the window byte pair pointed to by both the copy token displacement and the first reference pointer. As in the compressor, the preferred or alternative hash constraint will allow the window byte pair to be verified by comparing only one byte of the window byte pair. If the window byte pair addressed by the second reference pointer matches the window byte pair found with the displacement in the copy token, then the copy length has been encoded differentially; since a second-longest match exists, the decompressor returns from step 1509 to step 1508. Otherwise, the encoded copy length represents the actual copy length, and in the absence of a second-longest match, the decompressor continues on to step 1511 and decrements the copy-length counter before returning to step 1508.

If it is determined that the copy length is encoded differentially, then the decompressor performs a comparison between the window byte string beginning at the copy token's displacement and the string beginning at the second reference pointer location. The length of this match may be added to the encoded differential copy length to reconstruct the actual copy length. The obvious way to find the actual copy length, is by addition, but such an adder requires more hardware circuitry than is necessary.

A preferred way to determine actual copy length from the differential copy length is shown in FIG. 15. Upon detecting a differential copy length by the presence of a second-longest match, the decompressor then retrieves bytes from the window memory in the loop comprising steps 1508 and 1509 and bypassing the decrement of the copy-length counter in step 1511. The decompressor continues to retrieve bytes, each time comparing the retrieved decompressed output byte with the corresponding byte of the second-longest match, until a decompressed output byte is found which does not match the corresponding byte of the second-longest match. Once this miscompare occurs, the decompressor begins decrementing the copy-length counter in step 1511 each time it retrieves a new decompressed output byte until the remaining bytes of the match have been retrieved (the copy-length counter reaches zero). In this way, the decompressor effectively adds the length of the second-longest match in increments of one, each time it retrieves a new decompressed output byte and bypasses the decrement of the copy-length counter in step 1511.

A differential-copy-length decompressor is shown in FIG. 16. It differs from the basic decompressor of FIG. 12, by the addition of a previous output register 1621, a hash function 1616, a reference table 1617, a second match address counter 1619, comparators 1604 and 1611, and some control logic (not shown). The hash function 1616 and reference table 1617 are familiar parts of the compressor and perform equivalent functions in the decompressor. Previous output register 1621 stores the decompressed output byte which was latched previously in output register 1623 and which, in conjunction with the newest decompressed output byte in output register 1623, is hashed, by hash function 1616, to address an appropriate reference table row. If the decompressed output bytes in registers 1621 and 1623 represent the first two bytes in a match, then the newest reference pointer in the row is latched into second match address counter 1619. In any case, the reference pointers are updated by storing the value in byte counter 1622 as the new reference pointer. As in the basic decompressor, byte counter 1622 also addresses window RAM 1609 for storing the decompressed output bytes, latched in output register 1623, in the window. At the beginning of a copy token, when the bytes in registers 1621 and 1623 are the first two bytes retrieved in response to a copy token, the newest reference pointer fetched from the reference table and stored in second match address counter 1619 is compared, by comparator 1611, to the window address of the second byte of the copy found in address counter 1614 (address counter 1614 determines addresses of decompressed output bytes to be retrieved from the window memory in response to a copy token as before in the basic decompressor). If the two addresses are identical, then there is no second-longest match. Identical addresses indicate that the compressor found the longest match using the newest reference pointer in the reference table row; any second-longest matches would have been discarded by the compressor for being further from the insertion end of the window memory than the longest match. If the two addresses do not compare, then the window byte fetched at the address in second match address counter 1619 is compared by comparator 1604 to the decompressed output byte in output register 1623 to verify that the reference pointer points to a second-longest match.

When indeed there is a second-longest match, then each new decompressed output byte is fetched from the window memory (which is addressed by address counter 1614 which increments with each new decompressed output byte) and latched by output register 1623. Second match address counter 1619 increments to address the corresponding byte of the second-longest match which is compared to the decompressed output byte by comparator 1604. As long as the two bytes compare, copy-length counter 1620 is not decremented. When the two bytes miscompare, then copy-length counter 1620 resumes its countdown of the remaining bytes represented by the copy token.

A detail of FIG. 16 which is not reflected in FIG. 15, is that the copy-length counter should be decremented while fetching the first byte of a copy because it is not yet known whether the copy length is actual or differential until the second byte is fetched and the whole hash and reference pointer verification process is completed. If the copy length turns out to be differential, then the copy-length counter must be incremented back to its original value, or the control logic must either compare the copy-length counter to a value other than zero (as in step 1512, FIG. 15) or refrain from decrementing the copy-length counter exactly once after the longest and second-longest matches miscompare.

A preferred method exists (in some embodiments) when a synergy between the encoding of copy lengths and the extra decrement of the copy-length counter can be exercised. Since differential copy lengths may be encoded so that the most commonly occurring differential copy length of one aligns with the most commonly occurring actual copy length of two (using the 512-byte-optimized embodiment of the invention as an example), this offset of one between differential copy lengths and actual copy lengths may be used to counteract the extra decrement of the copy-length counter performed while fetching the first byte in response to a copy token with a differential copy length. In this implementation when the second-longest match miscompares, the copy-length counter resumes its countdown with no special action required.

In an embodiment with three or more reference pointers per reference table row, the decompressor needs additional second match address counters, one for each additional reference pointer, and additional comparators (such as 1611 with a total of one for each second match address counter) or a multiplexer to share comparator 1611. The additional second match address counters address the bytes of second-longest match candidates. With additional candidates for a second-longest match, the copy-length counter must not be decremented until the last of the second-longest match candidates miscompares, subject to any special deviations which result from the mandatory decrement made when fetching the first byte in response to the copy token as discussed above.

COMBINED COMPRESSOR/DECOMPRESSOR

FIG. 21 shows the architecture of a machine that can perform either compression or decompression, using only actual (non-differential) copy lengths, and that shares the circuitry which is common to both the compressor and decompressor. This machine is useful in applications such as data storage or one-direction-at-a-time data transmission where the compression and the decompression operations are both needed within the same device but are not needed at the same time.

Buses 2150 and 2165 are shown as tri-state busses feeding a diamond on each end of the page. These diamonds represent connections to the outside world. During compression, bus 2150 is driven by an external source to push uncompressed input bytes into the compressor. Tri-state driver 2133 drives the compressed output bytes out to the external world. During decompression, the direction of data flow is reversed, with compressed input bytes driven in on bus 2165 and the restored output bytes driven out on bus 2150 by tri-state driver 2137. Of course, any form of bidirectional bus may be used fro 2150 and 2165, and in fact, some applications may prefer separate unidirectional input and output busses on one or both sides of the compressor.

The following blocks are used in both the compression and the decompression operations: window RAM 2109, address multiplexer 2110, copy-length counter 2120, and byte counter 2122. When the machine is in compression mode, these blocks function as described for the respective blocks 709, 710, 720, and 722 in FIG. 7. When the machine is in decompression mode, these blocks function as described for the respective blocks 1209, 1210, 1220, and 1222 in FIG. 12. Potentially, search-in-progress counter 718 and address counter 1614 could be merged into a single counter. The decision to merge must be made taking into consideration the necessary addition of a multiplexer which is required in a merged implementation to select between the old reference pointer on bus 2162 and the output of subtracter 2115. It will be clear to one skilled in the art how the control signals and logic, not shown in any of FIGS. 7, 12, or 21, must be enhanced to support blocks which operate in either mode. The remainder of the blocks in FIG. 21 correspond to, and function equivalently to, a block in either the compressor of FIG. 7 or the decompressor of FIG. 12, but not both. The compression operation as described in the flowchart of FIG. 6 and the decompression operation as described in the flowchart of FIG. 11 are unchanged in the combined machine of FIG. 21.

FIG. 22 shows the architecture of a machine that can perform either differential-copy-length compression or decompression and that shares circuitry which is common to both the differential-copy-length compressor and decompressor. The connections to the outside world, busses 2250 and 2265, are identical to those discussed in reference to FIG. 21. Search-in-progress counter 719 and second match address counter 1619 are combined into search-in-progress/second match address counter 2119, which has the same functionality in compression and decompression but two different names for clarity. Because the differential-copy-length decompressor must maintain a reference table so that it is able to find the second-longest match within the region from the longest match to the insertion end of the window, there is considerably more sharing of blocks than is the case with the combined machine with actual copy lengths. This fact makes the differential-copy-length method less costly to implement for those applications where a combined compressor/decompressor is acceptable. The compression operation as described in the flowchart of FIG. 13 and the decompression operation as described in the flowchart of FIG. 15 are unchanged in the combined machine of FIG. 22.

UNARY-LENGTH CODES

The unary-length codes which are used for encoding alphabet tokens as well as the constituent parts of copy tokens are based upon the class of prefix codes, which are also known in the prior art as instantaneous codes. Prefix codes obey the prefix property which means that no codeword is the prefix of another codeword. A sequence of codewords from a prefix code can be decoded one at a time as each codeword is received without looking ahead at the next codeword(s) to determine where one codeword stops and the next begins. Thus the boundaries between codewords in the output stream can be "instantaneously" determined. A description of prefix codes can be found in Data Compression Methods and Theory, James A. Storer, Computer Science Press, Rockville, Md., 1988, pp. 34–53. A unary code is a prefix code with the additional property that each codeword consists of a run of like bits (binary 11111 . . . or 00000 . . .) followed by a single bit of the opposite polarity. Unary codes are well known in the prior art.

An example of a unary code used to represent the integers zero through six is shown in the following table.

| Integer | Unary token |
|---------|-------------|
| 0 | 0 |
| 1 | 10 |
| 2 | 110 |
| 3 | 1110 |
| 4 | 11110 |
| 5 | 111110 |
| 6 | 111111 |

Note that the last unary code (normally 1111110) is shortened by one bit to 111111 by omitting the final binary 0. This can always be done with the last codeword in a unary code without destroying the prefix property.

In the preferred embodiment of the present invention, unary codes are used to define a set of unary-length codes which are a special subset of prefix codes, particularly easy to implement in hardware. Each code in this subset consists of codewords comprising a first field which is a unary-code length indicator followed by a second field the length of which is specified by the length indicator. Each unary-code length indicator can be thought of as defining a bin of possible codewords. For example in the output token column of FIGS. 17(a) and 17(b), two different unary codes (0 and 10) indicate that six bits follow and a third (11) that seven bits follow. In this example, the first two unary codes define bins of 64 codewords each, and the last unary code defines a bin of 128 codewords. These 256 codewords, spread across three bins, may, for example, be used to represent the unmatched input bytes with values between 0 and 255. Other codes may not work out to have the same number of codewords as there are values to represent. This inefficiency is tolerable and desirable if the unused codewords are all in the bin where the codewords are longest and the high frequency of values assigned to the other bins (with shorter codewords) gives a sufficient increase in encoding efficiency to counteract the unused codewords and still provide an improved compression ratio.

ALPHABET TOKENS

To enhance the overall compression attained by the invention, alphabet tokens reduce the average number of bits required to represent input bytes that have no match in the current window, or for which the longest match is so short that it is more effective to ignore the match. The invention does not output such input bytes as literals as done in the prior art. Rather as described above, alphabet remapper 703 and alphabet encoder 705 use a remapping and a prefix code to replace each such byte by an encoded variable-length output token. The 512-byte-optimized embodiment of the invention uses a unary-length code for alphabet tokens, and implements the encoding map shown in FIG. 23, which is applied to input bytes that do not form matching pairs (or longer) in the compression window, to improve coding efficiency. These eight-bit input bytes range in value from 0 to 255 (decimal).

The natural way to assign unary-length codewords to unmatched input byte values is to assign them sequentially as shown for the remapped byte values and output tokens in FIGS. 17(a) and 17(b). In the figure, remapped byte values are naturally ordered as an increasing sequence of numbers, the codeword bins are naturally ordered by the sequence of unary codes, and the codewords within each bin are naturally ordered as an increasing sequence of fixed length binary numbers. A codeword is assigned to the unmatched input byte value it falls next to when tabulated as in the second two columns of FIGS. 17(a) and 17(b).

Although this natural way of assigning codes allows for a simple implementation, a more efficient code is generated if the unmatched input byte values are sorted in non-increasing frequency order. A true sorting, based upon statistics measured with typical data, is too random to be implemented efficiently without a table lookup scheme. The table lookup would require an additional RAM or other additional memory. Thus, it is desirable to reorder or remap the alphabet of unmatched input byte values to approximate the true sorted order obtained from the frequency statistics in such a way that the remapping has a simple implementation without any need for a table lookup.

A simple remapping is performed by recognizing that, while the frequency statistics vary widely from one unmatched input byte value to the next when looking on a small scale, on a larger scale, when taken as a whole, the frequency statistics are well-behaved and predictable but not in any semblance of sorted order. Therefore instead of generating an ideal remapping function which maps an eight-bit input to an eight-bit output and can be implemented efficiently only with additional memory, benefit can still be gained by remapping only the most significant bits of each byte. In the preferred embodiment, a remapping function is used which maps the three most significant bits of the input to a 3-bit output which comprises the three most significant bits of the remapped bytes values. The result is a block-wise remapping like the one shown in FIG. 23 where each 32-value block of unmatched input byte values is mapped to another 32-value block location. The values within each block are not altered and remain in sequence with respect to other values in the block.

The preferred remapping function is shown in FIG. 23, which can be thought of as an X-Y plot of input byte values, on the horizontal axis, versus encoded remapped byte values, on the vertical axis. That is for a particular input byte value (223 or 11011111 for example), find the corresponding point on the horizontal axis of FIG. 23 and from the plot of the remapping function determine the corresponding point on the vertical axis, which is labeled with the value of the remapped byte value (159 or 10011111 for example).

Once a remapping is selected which gives an acceptable approximation to true frequency-based sorting, then a code is selected from the subset of prefix codes described above which approximates the optimal lengths (in bits) for each codeword as determined by the theory of entropy and the frequency statistics of the set of remapped unmatched input bytes (at least given a "typical" distribution of frequencies of unmatched input byte values). The preferred unary-length code is shown in FIG. 23 along the right-hand axis. The uppermost bits of every codeword in a particular block of 32 remapped byte values are identical because of the blocking of the remapping function and the coincidence that the preferred unary-length code has coding bins with sizes that are multiples of 32. The five least significant bits of each codeword are the same as the five least significant bits of each input byte value since the remapping function preserves the ordering of the values within each 32-value block. The output token for the example input byte value is therefore 110011111 (binary).

The preferred code can be thought of in the following manner: if the first bit of an alphabet token is 0, then the following six bits complete the token; if the first two bits of an alphabet token are 10, then the following six bits complete the token; and if the first two bits of an encoded output token are 11, then the following seven bits form the token. An encoding table for the preferred unary-length code is shown in FIGS. 17(a) and 17(b). The sequence of unmatched input byte values in FIGS. 17(a) and 17(b) shown scrambled so that the remapped byte values and output tokens appear in their natural order. This particular code has an added attraction in that it provides exactly 256 codewords and encodes all eight-bit unmatched input byte values without any wasted codewords.

The preferred code is divided into three bins, illustrated in FIG. 23 with heavy horizontal lines, that correspond to the three different lengths of the encoded output token. Note that in terms of compression effectiveness, it does not matter where within each coding bin any particular input byte value is mapped; i.e. all mappings that place the same partition of input byte values into each coding bin achieve the same compression ratio. Thus the remapping chosen before the choice of coding bins can be simplified by rearranging the 32-value blocks within each bin according to implementation costs and performance considerations. This was done to arrive at the remapping shown in FIG. 23.

The alphabet remapping and encoding functions described above are performed by separate blocks in FIG. 7. The alphabet remapping is performed by alphabet remapper 703. The remapped alphabet bytes are then encoded with a unary-length code by alphabet encoder 705. In general, alphabet encoder may encode remapped alphabet bytes with any code, of which unary-length codes, Huffman codes, and other prefix codes are examples.

COPY-LENGTH CODING

The copy-length code for an embodiment of the present invention which is designed to operate with a 512-byte window on 512-byte data blocks is selected from the same subset of prefix codes as the alphabet prefix code. In order to allow compatibility to embodiments with a larger window, the last unary code has not been shortened to omit the final binary 0. This allows the copy-length code to be extended for encoding longer copy lengths by adding additional codewords without modifying the existing portion of the copy-length code. For example in FIGS. 18(a)–18(d), a bin of codewords with a unary length indicator of 11111111110 followed by nine bits would extend the code to include copy lengths up to 1024 bytes long. Data compressed by the 512-byte-optimized embodiment is decompressable by hardware or software with the extended copy-length code, although data compressed using the extended code may not be decompressed by a decompressor using the non-extended code. The actual copy-length code of the 512-byte-optimized embodiment is shown in FIGS. 18(a)–18(d), where two modifications to the basic prefix encoding scheme are illustrated. These two modifications are intended to simplify the hardware implementation. The first modification is that the bits which follow the unary length indicator appear in reversed order (000,100,010, 110,001,101, . . .). The second modification is that, rather than the first codeword in each bin being the unary length indicator followed by the all zeroes binary code (1110 00, 11110 000, . . .), the first code in each bin is the copy length which the codeword represents with the appropriate number of most significant bits truncated before being reversed.

DISPLACEMENT CODING

The displacement code for the 512-byte-optimized embodiment of the present invention is once again selected from the same subset of prefix codes as the alphabet prefix code, but in order to improve its efficiency somewhat, the first two bins of the code have been optimized to better match the frequency statistics of the displacements and thereby compress more efficiently. Again, compatibility to embodiments with a larger window has been established by not truncating the binary 0 from the last unary code. Another embodiment with a larger window may expand the code to allow for longer displacements by adding more codeword bins. The actual displacement code of the 512-byte-optimized embodiment is shown in FIGS. 19(a)–19(c), where the same modifications, reversal and correspondence to actual displacement values with some truncated bits, are made. The displacement values in FIGS. 19(a–19(i), begin with zero which represents a displacement to the last inserted byte in the window. The numbering of displacements could just as well have started with one resulting in a slightly different code due to the correspondence between the codeword and the value it represents. The decision is arbitrary, having no effect on complexity or compression ratio.

The combination of the displacement and copy-length codes of the 512-byte-optimized embodiment lead to one interesting special case. A copy token may comprise 1 bit for the copy token flag, 15 bits for a displacement field representing a displacement of 504 or greater (with 0 being the smallest displacement), and 1 bit to represent an actual copy length of 2 (or differential length of 1), totaling 17 bits. Given that the input bytes are 8 bits each, then this is a situation in which a copy token expands the data from 16 bits to 17 bits. This copy token expansion case may be avoided by representing the first byte of the copy with an alphabet token and searching for a match'starting with the second byte of the copy, but since this situation is rare, the expansion is small, the cost of avoiding the situation is high, and the alphabet token may cause expansion anyway, it is preferable to ignore this special case and allow the copy token to expand the data.

HUFFMAN CODES

Unary-length codes are the preferred method for encoding alphabet tokens and copy tokens due to the ease with which they may be implemented, but there are other codes which may be used to encode alphabet tokens and the displacement and copy-length fields in copy tokens. In particular, FIGS. 20(a) and 20(b) shows the encoding used in the Huffman code embodiment of the invention to map unmatched input bytes into variable-length, compressed alphabet tokens. This code is more efficient, achieving better compression ratios, than the unary-length code in FIGS. 17(a)–17(b), but requires much greater complexity (probably a table lookup) to implement.

DATA INTEGRITY

The 512-byte-optimized embodiment of the invention has an advantage in data integrity over compressors intended for a larger (perhaps variable length) data block. Since each 512 byte block is compressed independently, error propagation due to errors introduced in transmission or in reading from a storage medium or introduced through other means is limited to the 512 byte block in which the error occurs.

The preferred embodiment calculates a parity or checksum upon the uncompressed input to the compressor which is appended to the compressed data. The parity or checksum is then verified when the data is subsequently decompressed. This extra redundancy provides a means to detect errors occurring within the compressor and decompressor logic. The parity or checksum does not obviate the need for the normal error detection and correction redundancy bytes which should be calculated upon the compressed data and parity or checksum bytes to provide the same degree of protection for compressed data as is normally given to uncompressed data sent through the storage/transmission channel.

SUMMARY

While a preferred embodiment of the invention has been disclosed and described in detail herein, it will be obvious to those skilled in the art that various changes in form and detail may be made therein without departing from the spirit and scope thereof.

We claim:

1. A method of compressing digital data of bytes of K bits each received from a data stream to form and to output a compressed data stream, comprising the steps of:

(a) receiving the first byte of the data stream and storing the first byte in a compressor window;

(b) receiving the next byte of the data stream, storing the byte in a compressor window, and hashing the byte with the immediately preceding byte to obtain a hash value;

(c) addressing a reference table with the hash value obtained in step (b) to obtain any reference pointers to bytes within the compressor window stored at that reference-table address and to store at that reference-table address a new reference pointer to the current byte in the compressor window;

(d) for each reference pointer, if any, obtained in step (c), comparing the current byte with the byte in the compressor window pointed to by that reference pointer;

(e) in the event no reference pointers were obtained in step (c) or the current byte does not match the byte in the compressor window pointed to by any of the reference pointers obtained in step (c), then outputting within the compressed data stream a flag indicating an alphabet token and a compressed representation of the byte preceding the current byte;

(f) in the event the current byte matches the byte in the compressor window pointed to by any of the reference pointers addressed in step (c), then (1) receiving one or more additional bytes from the data stream and, for each, comparing the additional byte with the byte in the compressor window immediately after each match to determine if any match is extended by the additional byte, until the additional byte does not further extend any match, and (2) outputting, as part of the compressed data stream, a flag indicating string-substitution compression and a representation of the location within the compressor window where the match was found and a representation of the number of bytes in the match;

(g) repeating steps (b) through (f) to receive each byte of the data stream subsequent to the first byte.

2. The method of claim 1 further comprising the steps of calculating a parity or checksum for the data stream prior to compressing the data stream and appending the parity or checksum to the compressed data stream, whereby the parity or checksum of the decompressed data stream may be verified upon decompression of the compressed data stream.

3. The method of any of claims 1-2 wherein the maximum number of pointers which may be stored at each reference-table address is two.

4. An adaptive, lossless, single-pass, general-purpose compression apparatus for compressing an input stream of a finite number of K-bit digital bytes, comprising:

window memory means of size M bytes to store the up-to-M most recent bytes of said input stream;

hash means to generate hash values, each based on the H most-recent bytes of said input stream;

reference table means, addressable by said hash values, to hold pointers into said window memory means, each pointer pointing to a sequence of H bytes within said window memory means that generates the hash value that is the reference-table address of that pointer;

comparator means to verify matches between said H most-recent bytes and the window byte sequences pointed to by any pointers having a reference-table address given by the hash value of said H most-recent bytes, longest-match determining means, operable in the case where one or more said matches are verified, to identify which of said window byte sequences results in the longest match between the current input-byte sequence and that window byte sequence, and to determine the length of said longest match;

copy-token encoding means, operable whenever said longest-match determining means has identified said longest match and has determined its length, said copy-token encoding means to output from said compression apparatus a copy token comprising a copy-token identifier field, a displacement field pointing to said longest match within said window memory means and a copy-length field representing the length of said longest match;

alphabet-token encoding means, operable in the case where no matches are verified by said comparator means, to output from said compression apparatus an alphabet token comprising an alphabet-token identifier field and a field of variable length representing the oldest byte within said H most-recent bytes.

5. The adaptive, lossless, single-pass, general-purpose compression apparatus of claim 4 wherein said displacement field of said copy token is of variable length.

6. The adaptive, lossless, single-pass, general-purpose compression apparatus of claim 4 wherein said length field of said copy token is of variable length.

7. The adaptive, lossless, single-pass, general-purpose compression apparatus of claim 4 wherein said displacement field of said copy token is of variable length and said length field of said copy token is of variable length.

8. The adaptive, lossless, single-pass, general-purpose compression apparatus of any of claims 4-7 wherein the maximum number of pointers which may be stored at each said hash-value reference table address is two.

9. The adaptive, lossless, single-pass, general-purpose compression apparatus of any of claims 4-7 wherein the field of variable length to represent the oldest byte within said H most-recent bytes output by said alphabet-token encoding means comprises a prefix code.

10. The adaptive, lossless, single-pass, general-purpose compression apparatus of any of claims 4-7 wherein the field of variable length to represent the oldest byte within said H most-recent bytes output by said alphabet-token encoding means comprises a unary-length code.

11. The adaptive, lossless, single-pass, general-purpose compression apparatus of any of claims 4-7 wherein the field of variable length to represent the oldest byte within said H most-recent bytes output by said alphabet-token encoding means comprises a Huffman code.

12. The adaptive, lossless, single-pass, general-purpose compression apparatus of any of claims 4-7 wherein said alphabet-token encoding means remaps the alphabet to reduce the average length of said alphabet tokens for a predetermined set of typical data.

13. The adaptive, lossless, single-pass, general-purpose compression apparatus of any of claims 4-7 wherein said alphabet-token encoding means remaps the alphabet to reduce the average length of said alphabet tokens for a predetermined set of typical data by remapping the three most-significant bits of each input byte.

14. The adaptive, lossless, single-pass, general-purpose compression apparatus of any of claims 4-7 wherein said reference table means has 256 reference-table addresses.

15. The adaptive, lossless, single-pass, general-purpose compression apparatus of any of claims 4-7 wherein said reference table means has 256 reference-table addresses and K equals 8.

16. In an adaptive, lossless, single-pass, general-purpose compression apparatus for compressing an input stream of a finite number of K-bit digital bytes, an improvement comprising:

window memory means of size M bytes to store up-to-M most recent bytes of said input stream;

hash means to generate hash values, each based on the H most-recent bytes of said input stream;

reference table means, addressable by said hash values, to hold pointers into the window memory means, each pointer pointing to a sequence of H bytes within said window memory means that generates the hash value that is the reference-table address of that pointer;

comparator means to verify matches between said H most-recent bytes and the window byte sequences pointed to by any pointers having a reference-table address given by the hash value of said H most-recent bytes, longest-match determining means, operable in the case where one or more said matches are verified, to identify which of said window byte sequences results in the longest match between the current input-byte sequence and that window byte sequence, and to determine the length of said matches;

copy-token encoding means, operable whenever said longest-match determining means has identified said longest match, has determined its length, and has determined that said longest match either is the only verified match or is the match closest in input sequence to the most-recent byte of said input stream, said copy-token encoding means to output from said compression apparatus a copy token comprising a copy-token identifier field, a displacement field pointing to said longest match within said window memory means and a copy-length field representing the length of said longest match;

differential copy-token encoding means, operable whenever said comparator means verifies more than one match and said longest-match determining means identifies said longest match as a match further in input sequence from the most-recent input byte of said input stream than one or more other verified matches, said differential copy-token encoding means to output from said compression apparatus a copy token comprising a copy-token identifier field, a displacement field pointing to said longest match within said window memory means, and a copy-length field representing the difference between the length of said longest match and the length of the longest of said one or more other verified matches.

17. The adaptive, lossless, single-pass, general-purpose compression apparatus of claim 16 wherein said displacement field of said copy token is of variable length.

18. The adaptive, lossless, single-pass, general-purpose compression apparatus of claim 16 wherein said length field of said copy token is of variable length.

19. The adaptive, lossless, single-pass, general-purpose compression apparatus of claim 16 wherein said displacement field of said copy token is of variable length and said length field of said copy token is of variable length.

20. The adaptive, lossless, single-pass, general-purpose compression apparatus of any of claims 16–19 wherein the maximum number of pointers which may be stored at each said hash-value reference table address is two.

21. The adaptive, lossless, single-pass, general-purpose compression apparatus of any of claims 16–19 wherein the field of variable length to represent the oldest byte within said H most-recent bytes output by said alphabet-token encoding means comprises a prefix code.

22. The adaptive, lossless, single-pass, general-purpose compression apparatus of any of claims 16–19 wherein the field of variable length to represent the oldest byte within said H most-recent bytes output by said alphabet-token encoding means comprises a unary-length code.

23. The adaptive, lossless, single-pass, general-purpose compression apparatus of any of claims 16–19 wherein the field of variable length to represent the oldest byte within said H most-recent bytes output by said alphabet-token encoding means comprises a Huffman code.

24. The adaptive, lossless, single-pass, general-purpose compression apparatus of any of claims 16–19 wherein said alphabet-token encoding means remaps the alphabet to reduce the average length of said alphabet tokens for a predetermined set of input streams.

25. The adaptive, lossless, single-pass, general-purpose compression apparatus of any of claims 16–19 wherein said alphabet-token encoding means remaps the alphabet to reduce the average length of said alphabet tokens for a predetermined set of typical data by remapping the three most-significant bits of each input byte.

26. The adaptive, lossless, single-pass, general-purpose compression apparatus of any of claims 16–19 wherein said reference table means has 256 reference-table addresses.

27. The adaptive, lossless, single-pass, general-purpose compression apparatus of any of claims 16–19 wherein said reference table means has 256 reference-table addresses and K equals 8.

28. The adaptive, lossless, single-pass, general-purpose compression apparatus of any of claims 16–19 wherein said copy token encoding means and said differential copy token encoding means each encode copy-length fields using the same code.

29. The adaptive, lossless, single-pass, general-purpose compression apparatus of any of claims 16–19 wherein said copy token encoding means and said differential copy token encoding means each encode copy-length fields using the same code and said code comprises a prefix code.

30. The adaptive, lossless, single-pass, general-purpose compression apparatus of any of claims 16–19 wherein said copy token encoding means and said differential copy token encoding means each encode copy-length fields using the same code and said code comprises a unary-length code.

31. The adaptive, lossless, single-pass, general-purpose compression apparatus of any of claims 16–19 wherein said copy token encoding means and said differential copy token encoding means each encode copy-length fields using the same code and said code comprises a Huffman code.

32. The adaptive, lossless, single-pass, general-purpose compression apparatus of any of claims 16–19 wherein said copy token encoding means and said differential copy token encoding means each encode copy-length fields using the same code and an offset is applied to the copy lengths within either said copy token encoding means or said differential copy token encoding means.

33. An adaptive, lossless, single-pass, general-purpose compression apparatus for compressing an input stream of a finite number of K-bit digital bytes, comprising:

window memory means of size M bytes to store up-to-M most recent bytes of said input stream;

hash means to generate hash values each based on the H most-recent bytes of said input stream;

reference table means, addressable by said hash values, to hold pointers into said window memory means, each pointer pointing to a sequence of H bytes within said window memory means that generates the hash value that is the reference-table address of that pointer;

comparator means to verify matches between said H most-recent bytes and the window byte sequences pointed to by any pointers having a reference table address given by the hash value of said H most-recent bytes, longest-match determining means, operable in the case where one or more said matches are verified, to identify which of said window byte sequences results in the longest match between the current input-byte sequence and that window byte sequence and to determine the length of said matches;

copy-token encoding means, operable whenever said longest-match determining means has identified said longest match, has determined its length, and has determined that said longest match either is the only verified match or is the match closest in input sequence to the most-recent byte of said input stream, said copy-token encoding means to output from said compression apparatus a copy token comprising a copy-token identifier field, a displacement field pointing to said longest match within said window memory means and a copy-length field representing the length of said longest match;

differential copy-token encoding means, operable whenever said comparator means verifies more than one match and said longest-match determining means identifies said longest match as a match further in input sequence from the most-recent input byte of said input stream than one or more other verified matches, said differential copy-token encoding means to outputs from said compression apparatus a copy token comprising a copy-token identifier field, a displacement field pointing to the longest match within said window, and a copy-length field representing the difference between the length of said longest match and the length of the longest of said one or more other verified matches; and alphabet-token encoding means, operable in the case where no said matches are verified by said comparator means, to output from said compression apparatus an alphabet token comprising an alphabet-token identifier field and a field of variable length representing the oldest byte within said H most-recent bytes.

34. The adaptive, lossless, single-pass, general-purpose compression apparatus of claim 33 wherein the maximum number of pointers which may be stored at each said hash-value reference table address is two.

35. The adaptive, lossless, single-pass, general-purpose compression apparatus of claim 33 wherein said window memory means is a circular buffer.

36. The adaptive, lossless, single-pass, general-purpose compression apparatus of claim 33 wherein said copy-token encoding means outputs from said compression apparatus a copy token comprising in part a displacement field of variable length for pointing to the longest match, and said differential copy-token encoding means outputs from said compression apparatus a copy token comprising in part a displacement field of variable length for pointing to the longest match.

37. The adaptive, lossless, single-pass, general-purpose compression apparatus of claim 33 wherein said reference table means has 256 reference-table addresses.

38. The adaptive, lossless, single-pass, general-purpose compression apparatus of claim 33 wherein said reference table means has 256 reference-table addresses and K equals 8.

39. The adaptive, lossless, single-pass, general-purpose compression apparatus of any of claims 33–38 wherein H is 2 and said hash means generates eight-bit hash values by exclusive ORing the first of the two most-recent bytes received with the second of the two most-recent bytes received after first flipping one of said two bytes end for end to reverse the order of the bits therein.

40. The adaptive, lossless, single-pass, general-purpose compression apparatus of any of claims 33–38 wherein H is 2 and said hash means generates hash values comprising a number of bits between 9 and 15 inclusive by exclusive ORing the first of the two most-recent bytes received with the second of the two most-recent bytes received after first flipping one of the two bytes end for end to reverse the order of the bits therein and next shifting either the resulting flipped byte or the remaining un-flipped byte, said exclusive ORing performed on the bits which align after said shifting.

41. The adaptive, lossless, single-pass, general-purpose compression apparatus of any of claims 33–38 wherein said copy token encoding means and said differential copy token encoding means each encode the copy-length fields of their respective copy tokens using the same code.

42. The adaptive, lossless, single-pass, general-purpose compression apparatus of any of claims 33–38 wherein said copy token encoding means and said differential copy token encoding means each encode the copy-length fields of their respective copy tokens using the same code, said code being a prefix code.

43. The adaptive, lossless, single-pass, general-purpose compression apparatus of any of claims 33–38 wherein said copy token encoding means and said differential copy token encoding means each encode the copy-length fields of their respective copy tokens using the same code, said code being a unary-length code.

44. The adaptive, lossless, single-pass, general-purpose compression apparatus of any of claims 33–38 wherein said copy token encoding means and said differential copy token encoding means each encode the copy-length fields of their respective copy tokens using the same code, said code being a Huffman code.

45. In an adaptive, lossless, single-pass, general-purpose compression apparatus for compressing an input stream of a finite number of K-bit digital bytes, an improvement comprising:

window memory means of size M bytes to store up-to-M most recent bytes of said input stream;

hash means to generate hash values, each based on the H most-recent bytes of said input stream;

reference table means, addressable by said hash values, to hold pointers into the window memory means, each pointer pointing to a sequence of H bytes within said window memory means that generates the hash value that is the reference-table address of that pointer;

comparator means to verify one or more matches between said current input-byte sequence and the window byte sequences pointed to by any pointers having a reference table address given by the hash value of said two most-recent bytes;

said hash means generating hash values having the characteristic that for all possible values of any particular one of the H bytes, every possible value of the remaining bytes generates a unique hash value;

said comparator means verifying matches between said H most-recent bytes and the window byte sequences pointed to by the pointers having a reference-table address given by the hash value of said H most-recent bytes by comparing one less than H bytes.

46. The compression apparatus of claim 45 wherein H is 2 and said particular one of the H bytes is the first in input sequence of said two bytes.

47. The compression apparatus of claim 45 wherein H is 2 and said particular one of the H bytes is the second in input sequence of said two bytes.

48. The adaptive, lossless, single-pass, general-purpose compression apparatus of claim 45 wherein H is 2 and said hash means generates eight bit hash values by exclusive ORing the first of the two most-recent bytes with the second of the two most-recent bytes after first flipping one of the two bytes end for end to reverse the order of the bits therein.

49. The adaptive, lossless, single-pass, general-purpose compression apparatus of any of claims 45–48 wherein said reference table means has 256 reference-table addresses.

50. The adaptive, lossless, single-pass, general-purpose compression apparatus of any of claims 45–48 wherein said reference table means has 256 reference-table addresses and K equals 8.

51. The adaptive, lossless, single-pass, general-purpose compression apparatus of any of claims 45–48 wherein H is 2 and said hash means generates hash values comprising a number of bits between 9 and 15 inclusive by flipping one of the two most-recent bytes end for end to reverse the order of the bits therein, then shifting either the flipped byte or the un-flipped byte, and then exclusive ORing the bits of the flipped byte with those of the unflipped byte that align after said shifting.

52. The adaptive, lossless, single-pass, general-purpose compression apparatus of any of claims 45–48 wherein said window memory means is a circular buffer.

53. In an adaptive, lossless, single-pass, general-purpose compression apparatus for compressing an input stream of a finite number of K-bit digital bytes, an improvement comprising:
window memory means of size M bytes to store up-to-M most recent bytes of said input stream;
hash means to generate hash values, each based on the H most-recent bytes of said input stream;
reference table means, addressable by said hash values, to hold pointers into the window memory means, each pointer pointing to a sequence of H bytes within said window memory means that generates the hash value that is the reference-table address of that pointer, said reference table means holding a predetermined maximum number of said pointers per reference table address;
for each new byte of said input stream, said hash means generates a new hash value to address said reference table and said reference table means is updated to hold a new pointer into said window memory means, and if said predetermined maximum number of pointers per reference-table address is exceeded, then said new pointer overwrites a pointer previously stored at that reference-table address on a first in, first out basis.

54. The adaptive, lossless, single-pass, general-purpose compression apparatus of claim 53 wherein the maximum number of pointers which may be stored at each said hash-value reference table address is two.

55. The adaptive, lossless, single-pass, general-purpose compression apparatus of any of claim 4, claim 16, or claim 33 wherein said reference table means holds a predetermined maximum number of said pointers per reference-table address and for each new byte of said input stream, said hash means generates a new hash value to address said reference table and said reference table means is updated to hold a new pointer into said window memory means, and if said predetermined maximum number of pointers per reference-table address is exceeded, then said new pointer overwrites a pointer previously stored at that reference-table address on a first in, first out basis.

56. The adaptive, lossless, single-pass, general-purpose compression apparatus of any of claim 4, claim 16, claim 33, or claim 53, wherein H is 3 and said hash means generates hash values by splitting each of the three most-recent bytes into a most significant nibble, of K/2 bits, and a least significant nibble, of K/2 bits, flipping one of the two nibbles for each of the three bytes end for end to reverse the order of the bits therein, then exclusive ORing the reversed nibble of each byte with the unreversed nibble of one of the other two bytes to form three new nibbles, and then combining the three new nibbles to form the hash value.

57. A method of decompressing a compressed data stream of alphabet tokens based on a prefix code and copy tokens into an output data stream of uncompressed K-bit bytes, comprising:
parsing the compressed data stream into copy tokens and alphabet tokens;
decompressing each parsed token by:
(i) for each alphabet token, discarding the alphabet-token identifier field, decoding the alphabet token using a prefix-code decoder to obtain an output byte, storing the output byte at the current byte within an output memory means, advancing the current byte, and outputting the output byte to the output data stream;
(ii) for each copy token, discarding its copy-token identifier field, decoding its displacement field and its copy-length field to obtain copy-length and displacement values, generating a sequence of output bytes responsive to the displacement value, the copy-length value, and the contents of the output memory means, storing the sequence of output bytes starting at the current byte within the output memory means, advancing the current byte, and outputting the sequence of output bytes to the output data stream.

58. A method of decompressing a compressed data stream of alphabet tokens based on a unary-length code and copy tokens into an output data stream of uncompressed K-bit bytes, comprising:
parsing the compressed data stream into copy tokens and alphabet tokens;
decompressing each parsed token by:
(i) for each alphabet token, decoding the alphabet token using a unary-length decoder to obtain an output byte, storing the output byte at the current byte within an output memory means, advancing the current byte, and outputting the output byte to the output data stream;
(ii) for each copy token, decoding its displacement field and its copy-length field to obtain copy-length and displacement values, generating a sequence of output bytes responsive to the displacement value, the copy-length value, and the contents of the window memory means, storing the sequence of output bytes starting at the current byte within the output memory means, advancing the current byte, and outputting the sequence of output bytes to the output data stream.

59. A method of decompressing a compressed data stream of alphabet tokens based on a Huffman code and copy tokens into an output data stream of uncompressed K-bit bytes, comprising:

parsing the compressed data stream into copy tokens and alphabet tokens;

decompressing each parsed token by:

(i) for each alphabet token, decoding the alphabet token using a Huffman decoder to obtain an output byte, storing the output byte at the current byte within an output memory means, advancing the current byte, and outputting the output byte to the output data stream;

(ii) for each copy token, decoding its displacement field and its copy-length field to obtain copy-length and displacement values, generating a sequence of output bytes responsive to the displacement value, the copy-length value, and the contents of the window memory means, storing the sequence of output bytes starting at the current byte within the output memory means, advancing the current byte, and outputting the sequence of output bytes to the output data stream.

60. The method of any of claims 57–59 wherein said alphabet-token decoding further comprises remapping the decoded alphabet token to recover the K-bit byte.

61. The method of any of claims 57–59 wherein said alphabet-token decoding further comprises remapping the decoded alphabet token by remapping the three most significant bits of the byte.

62. A method of decompressing a compressed data stream of alphabet tokens, copy tokens, and differential copy tokens into an output data stream of uncompressed K-bit bytes, comprising:

parsing said compressed data stream into copy tokens and alphabet tokens;

decompressing each parsed token by:

(i) for each alphabet token, decoding said alphabet token to obtain an output byte, storing said output byte at a current byte within an output memory means, advancing said current byte, outputting said output byte to said output data stream, hashing the H most-recent bytes of said output stream to generate a hash value, and storing in a reference table means at an address responsive to said hash value a pointer to said H most-recent output bytes within said output memory means;

(ii) for each copy token, decoding its displacement field and its copy-length field to obtain copy-length and displacement values; generating a sequence of output bytes in response to said displacement value, to said copy-length value, to the contents of said output memory means, and to the contents of said reference table means; storing said output-byte sequence starting at said current byte within said output memory means; advancing said current byte; and, for each byte of said output-byte sequence, outputting that byte to said output stream and hashing the H most-recent bytes of said output stream to generate a hash value and storing in said reference table means, at an address responsive to said hash value, a pointer to said H most-recent output bytes within said output memory means;

said output-byte-sequence generating comprising:

(a) locating in said output memory means in response to said displacement value a target sequence of H bytes;

(b) hashing said target sequence to obtain a hash value;

(c) addressing said reference table means using said hash value to obtain any pointers stored at that reference-table address pointing to any sequences of H bytes within said output memory means that are closer to said current byte than is said target sequence;

(d) for each pointer obtained in step (c), comparing the sequence of H bytes pointed to by that pointer with said target sequence;

(e) for each sequence of H bytes found to be identical in step (d), comparing the bytes adjacent to said target sequence with the bytes adjacent to that identical sequence to determine the length of the match and to determine the length of the longest such match;

(f) if said longest match length is determined in step (e), then modifying said copy-length value responsive to said length of said longest such match;

(g) generating a sequence of output bytes that includes said target sequence and that is responsive to said displacement value, said copy-length value, and the contents of said output memory means.

63. The method of claim 62 wherein said comparing in step (d) is performed by comparing one less than H bytes.

64. An adaptive, lossless, single-pass, general-purpose compression method for compressing an input stream of a finite number of K-bit digital bytes, comprising:

storing up-to-M most recent bytes of the input stream in a window memory means;

hashing the H most-recent bytes of the input stream to generate hash values;

holding in a reference table means, addressable by the hash values, pointers into the window memory means, each pointer pointing to a sequence of H bytes within the window memory means that generates the hash value that is the reference-table address of that pointer;

comparing to verify matches between the H most-recent bytes and the window byte sequences pointed to by any pointers having a reference-table address given by the hash value of the H most-recent bytes;

in the case where any matches are verified, identifying which window byte sequence results in the longest match between the current input-byte sequence and that window byte sequence and determining the length of the longest match;

whenever the longest match has been identified and its length determined, outputting a copy token comprising a copy-token identifier field, a displacement field pointing to the longest match, and a copy-length field representing the length of the match;

in the case where no matches are verified, outputting an alphabet token comprising an alphabet-token identifier field and a field of variable length to represent the oldest byte within the H most-recent bytes.

65. The adaptive, lossless, single-pass, general-purpose compression method of claim 64 wherein the maximum number of pointers which may be stored at each reference table address is two.

66. The adaptive, lossless, single-pass, general-purpose compression method of claim 64 wherein the window memory is a circular buffer.

67. In an adaptive, lossless, single-pass, general-purpose compression method for compressing an input stream of a finite number of K-bit digital bytes, an improvement comprising:

storing up-to-M most-recent bytes of the input stream in a window memory;

hashing the H most-recent bytes of the input stream to generate hash values;

holding in a reference table addressable by the hash values, one or more pointers into the window memory for each reference table address, each pointer pointing to a sequence of H bytes within the window memory that generates the hash value that addresses the respective reference table location of said pointers;

comparing to verify one or more matches between the current input-byte sequence and any of the window byte sequences pointed to by a pointer having a reference table address given by the hash value of the H most-recent bytes, in the case where one or more matches are verified, identifying which one of the one or more window byte sequences results in the longest match between the current input-byte sequence and the window byte sequence and determining the length of the longest match;

whenever the comparison verifies more than one match between the current input-byte sequence and the window byte sequences, and the longest match is identified as the match further in input sequence from the most-recent input byte than a second longest match, outputting a copy token comprising a copy-token identifier field, a displacement field for pointing to the longest match and a copy-length field representing the difference between the length of the longest match and the length of the second longest match.

68. The adaptive, lossless, single-pass, general-purpose compression method of claim 67 wherein the maximum number of pointers which may be stored at each reference table address is two.

69. The adaptive, lossless, single-pass, general-purpose compression method of claim 67 wherein the window memory is a circular buffer.

70. An adaptive, lossless, single-pass, general-purpose compression method for compressing an input stream of a finite number of K-bit digital bytes, comprising:

storing up-to-M most recent bytes of the input stream in a window memory;

hashing the H most-recent bytes of the input stream to generate hash values;

holding in a reference table addressable by the hash values, one or more pointers into the window memory for each the reference table address, each pointer pointing to a sequence of H bytes within the window memory that generates the hash value that addresses the respective reference table location of said pointers;

comparing to verify one or more matches between the current input-byte sequence and any of the window byte sequences pointed to by a pointer having a reference table address given by the hash value of the H most-recent bytes, in the case where one or more matches are verified, identifying which one of the one or more window byte .sequences results in the longest match between the current input-byte sequence and the window byte sequence and determining the length of the longest match;

whenever the longest match has been identified and its length determined, and the longest match either is the match closest in input sequence to the most-recent input byte in the event of more than one match or is the only match verified by the comparison of the current input-byte sequence and any of the window byte sequences pointed to by a pointer in the reference table at the hash value address location, outputting a copy-token identifier field, a displacement field for pointing to the longest match and a copy-length field representing the length of the match;

whenever more than one match between the current input-byte sequence and the window byte sequences has been verified and the longest match is further in input sequence from the most-recent input byte than a second longest match, outputting a copy token comprising a copy-token identifier field, a displacement field for pointing to the longest match and a copy-length field representing the difference between the length of the longest match and the length of the second longest match.

when no matches are verified between the H most-recent bytes and any of the window byte sequences, outputting an alphabet token .comprising an alphabet-token identifier field and a field of variable length to represent the oldest byte within the H most-recent bytes.

71. The adaptive, lossless, single-pass, general-purpose compression method of claim 10 wherein the maximum number of pointers which may be stored at each reference table address is two.

72. The adaptive, lossless, single-pass, general-purpose compression method of claim 70 wherein the window memory is used as a circular buffer.

73. In an adaptive, lossless, single-pass, general-purpose compression method for compressing an input stream of a finite number of K-bit digital bytes, an improvement comprising:

storing up-to-M most recent bytes of the input stream in a window memory;

hashing the H most-recent bytes of the input stream to generate hash values;

holding in a reference table addressable by the hash values, multiple pointers into the window memory for each reference table address, each pointer pointing to a sequence of H bytes within the window memory that generate the hash value that addresses the respective reference table location of said pointers;

generating for each new byte of said input stream, a hash value with the immediately previous H bytes of said input stream, and storing in the reference table a pointer to the sequence of the last H bytes hashed after any pointer pointing to a sequence of H bytes for the input stream within the window memory for that hash value is retrieved from the reference table means, the reference table first storing a pointer at a hash value address location not then storing a pointer for the input stream, and thereafter overwriting a previously stored pointer at that hash value address on a first in, first out basis.

74. In an adaptive, lossless, single-pass, general-purpose compression method for compressing input streams, each of finite length, an improvement comprising the steps of:

storing up-to-M most recent bytes of the input stream in a window memory;

hashing the H most-recent bytes of the input stream to generate hash values;

holding in a reference table addressable by the hash values, a row validity flag and one or more pointers into the window memory for each reference table address, each pointer pointing to a sequence of H bytes within the window memory that generates the hash value that addresses the respective reference table location of said pointers; and, after completing the compression of one input stream, resetting in a single reset operation, the row validity flags for each reference table address to invalidate pointers stored therein prior to the compression of the next input stream.

75. The method of claim 74 wherein, as pointers into the window memory are stored in the reference table in a row having its row validity flag reset, setting the row validity flag for that row and clearing any other reference pointer field for that reference table row.

76. In an adaptive, lossless, single-pass, general-purpose compression method for compressing input streams, each of finite length, an improvement comprising the steps of:

storing up-to-M most recent bytes of the input stream in a window memory;

hashing the H most-recent bytes of the input stream to generate hash values;

holding in a reference rabid addressable by the hash values, a module count field and one or more pointers into the window memory for each reference table address, each pointer pointing to a sequence of H bytes within the window memory that generates the hash value that addresses the respective reference table of said pointers, the module count field holding the count of the input streams of finite length compressed; and, during the compression of successive input streams, addressing successive reference table addresses to determine whether the respective modulo count field is equal to the current modulo count, and when the respective modulo count field is not equal to the current modulo count, clearing each pointer at that reference table address and updating the respective modulo count field to be equal to the current modulo count;

the addressing of successive reference table addresses to determine whether the respective modulo count field is equal to the current modulo count occurring sufficiently frequent so that the pointers at all reference table addresses having a non-current modulo count in the modulo count field therein are cleared and the modulo count field thereof is updated before the modulo count returns to any of such non-current modulo counts.

77. The method of claim 76 wherein, as pointers into the window, memory are stored in the reference table in a row having its modulo count field non-current, updating the modulo count field for that row to the current modulo count and clearing any other reference pointer field for that reference table row.

78. An adaptive, lossless, single-pass, general-purpose compression apparatus for compressing an input stream of a finite number of K-bit digital bytes, comprising:

current input-byte register means of K-bits to receive the most-recent byte of said input stream, and to store and output the same as a current input byte;

previous input-byte register means of K-bits to store the next most-recent byte of said input stream and to output the same as a previous input byte;

window memory means of size M bytes to store the up-to-M most recent bytes of said input stream;

hash means to generate hash values, based on said current input byte and said previous input byte;

reference table means, addressable by said hash values, able to hold at each address an old pointer and a new pointer into said window memory means, each pointer pointing to a sequence of two bytes within said window memory means that generates the hash value that is the reference-table address of that pointer;

comparator means to verify matches between said current input byte, said previous input byte, and the window byte sequences pointed to by any pointers having a reference-table address given by the hash value of said current input byte and said previous input byte;

byte counter means to generate a count responsive to the number of input bytes received from said input stream and to output said count;

old-pointer search counter means to address the match based on said old pointer;

new-pointer search counter means to address the match based on said new pointer;

longest-match determining means to determine when each of the matches addressed by said new-pointer search counter means and by said old-pointer search counter means miscompare with said input stream;

copy-length counter means, responsive to said longest-match determining means, to count the number of input bytes received from said input stream that match these stored in said window memory means to determine the length of the longest match;

length encoding means to encode said longest-match length into a copy-length field;

displacement encoding means to determine a displacement value responsive to said old-pointer search counter means, to said new-pointer search counter means, and to said byte counter means, and to encode said value into a displacement field pointing to said longest match within said window memory means;

alphabet encoding means, responsive to the absence of a match addressed either by said new-pointer search counter means or said old-pointer seach counter means, to generate an alphabet field of variable length from said previous input byte;

packing means to generate an alphabet token from said alphabet field, to generate a copy token responsive to said displacement field and said copy-length field, and to pack said copy tokens and said alphabet tokens into compressed N-bit bytes.

79. The compression apparatus of claim 78 wherein said alphabet encoding means uses Huffman encoding.

80. The compression apparatus of claim 78 wherein said alphabet encoding means uses prefix encoding.

81. The compression apparatus of claim 78 wherein said alphabet encoding means uses unary-length encoding.

82. An adaptive, lossless, single-pass, general-purpose, differential copy-length compression apparatus for compressing an input stream of a finite number of K-bit digital bytes, comprising:

current input-byte register means of K-bits to receive the most-recent byte of said input stream, and to store and output the same as a current input byte;

previous input-byte register means of K-bits to store the next most-recent byte of said input stream and to output the same as a previous input byte;

window memory means of size M bytes to store the up-to-M most recent bytes of said input stream;

hash means to generate hash values, based on said current input byte and said previous input byte;

reference table means, addressable by said hash values, able to hold at each address an old pointer and a new pointer into said window memory means, each pointer pointing to a sequence of two bytes within said window memory means that generates the hash value that is the reference-table address of that pointer;

comparator means to verify matches between said current input byte, said previous input byte, and the window byte sequences pointed to by any pointers having a reference-table address given by the hash value of said current input byte and said previous input byte;

byte counter means to generate a count responsive to the number of input bytes received from said input stream and to output said count;

old-pointer search counter means to address the match based on said old pointer;

new-pointer search counter means to address the match based on said new pointer;

differential longest-match determining means to determine when each of the matches addressed by said new-pointer search counter means and by aid old-pointer search counter means miscompare with said input stream;

copy-length counter means, responsive to said differential longest-match determining means, to determine the differential length of the longest match (i) by counting the number of input bytes received from said input stream that match these stored in said window memory means, and (ii) in the case where each of said old-pointer search counter means and said new-pointer search counter means contains an address to a match, by setting itself to an initial value when the match addressed by said new-pointer search counter means miscompares prior to the time when the match addressed by said old-pointer search counter means miscompares;

length encoding means to encode said differential longest-match length into a copy-length field;

displacement encoding means to determine a displacement value responsive to said old-pointer search counter means, to said new-pointer search counter means, and to said byte counter means, and to encode said value into a displacement field pointing to said longest match within said window memory means;

alphabet encoding means, responsive to the absence of a match addressed either by said new-pointer search counter means or said old-pointer seach counter means, to generate an alphabet field of variable length from said previous input byte;

packing means to generate an alphabet token from said alphabet field, to generate a copy token responsive to said displacement field and said copy-length field, and to pack said copy tokens and said alphabet tokens into compressed N-bit bytes.

83. The compression apparatus of claim 82 wherein said alphabet encoding means uses Huffman encoding.

84. The compression apparatus of claim 82 wherein said alphabet encoding means uses prefix encoding.

85. The compression apparatus of claim 82 wherein said alphabet encoding means uses unary-length encoding.

86. The compression apparatus of any of claims 75–85 wherein said alphabet encoding means generates a remapped alphabet byte from said previous input byte and generates said alphabet field from said remapped alphabet byte so as to reduce the average length of said alphabet tokens for a predetermined set of typical data.

87. The compression apparatus of any of claims 78–85 wherein said alphabet encoding means remaps the three most-significant bits of each previous input byte prior to generating said alphabet field so as so as to reduce the average length of said alphabet tokens for a predetermined set of typical data.

88. An apparatus for decompressing a compressed data stream of alphabet tokens and copy tokens into an output data stream of decompressed K-bit bytes, comprising:

unpacking means to receive said compressed data stream, to parse the same into copy tokens and variable length alphabet tokens, to generate displacement fields and copy-length fields responsive to said copy tokens, and to generate alphabet fields responsive to said alphabet tokens;

length decoding means to decode said copy-length field into a copy-length value;

displacement decoding means to decode said displacement field into a displacement value;

alphabet decoding means to decode said alphabet field into a decompressed alphabet byte;

output register means of K-bits to read and to store said decompressed alphabet bytes and to output the same within said output data stream;

byte counter means to generate a count responsive to the output of said output data stream and to output said count;

copy-length counter means, responsive to said copy-length value, to control the number of bytes in copied output sequences;

address counter means, responsive to said byte counter means and to said displacement value, to generate the address within said window memory means used in generating said copied output sequences, and to output said address;

window memory means of size M bytes to store the up-to-M most recent bytes of said output data stream and to generate said copied output sequences responsive to said address counter means and to said copy-length counter means;

said output register means further to read and to store said copied output sequences and to output the same within said output data stream.

89. An apparatus for decompressing a compressed data stream of alphabet tokens and copy tokens, including differential copy tokens, into an output data stream of decompressed K-bit bytes, comprising:

unpacking means to receive said compressed data stream, to parse the same into copy tokens and variable length alphabet tokens, to generate displacement fields and copy-length fields responsive to said copy tokens, and to generate alphabet fields responsive to said alphabet tokens;

length decoding means to decode said copy-length field into a copy-length value;

displacement decoding means to decode said displacement field into a displacement value;

alphabet decoding means to decode said alphabet field into a decompressed alphabet byte;

output register means of K-bits to read and to store said decompressed alphabet bytes and to output the same as a current output byte within said output data stream;

byte counter means to generate a count responsive to the output of said output data stream and to output said count;

address counter means, responsive to said byte counter means and to said displacement value, to generate the address within said window memory means used in generating copied output sequences, and to output said address;

window memory means of size M bytes to store the up-to-M most recent bytes of said output data stream;

previous output register means of K-bits to store the previous contents of said output register means and to output the same as a previous output byte;

hash function means to generate hash values based on said current output byte and said previous output byte;

reference table means, addressable by said hash values, able to hold at each address an old pointer and a new pointer into said window memory means, each pointer pointing to a sequence of two bytes within said window memory means that generates the hash value that is the reference-table address of that pointer;

second-match counter means to address the match based on said new pointer;

differential copy length detection means first to compare the contents of said second-match counter means with said address counter means and second to compare the contents of said window memory means with said current output byte to detect the presence of a differential copy length by a match of said first comparison and a mismatch of said second comparison means;

differential length determining means, operative in the case where a differential copy length is present, to determine when the match addressed by second-match counter means miscompares with the match addressed by said address counter means, whereby the difference between the actual and differential copy lengths is determined;

copy-length counter means, responsive to said copy-length value and to said differential length determining means, to control the number of bytes in said copied output sequences;

said window memory means further to generate said copied output sequences responsive to said address counter means and to said copy-length counter means.

90. The decompression apparatus of claim 88 or 89 wherein said alphabet decoding means uses Huffman decoding.

91. The decompression apparatus of claim 88 or 89 wherein said alphabet decoding means uses prefix decoding.

92. The decompression apparatus of claim 88 or 89 wherein said alphabet decoding means uses unary-length decoding.

93. In an apparatus for hash-based data compression/decompression, an improvement wherein said apparatus includes:

reference table means having more than one row, each said row being addressable by a particular hash value, each said row including a used flag of a single bit, and each said row being able to store one or more window-memory pointers;

reference-table clearing means, operable prior to each operation of said compression/decompression apparatus, to initialize said used bit of every reference-table row to a first predetermined value;

reference-table updating means, operable when storing one or more window-memory pointers into a particular row of said reference table, including means to set the used bit of said particular row to a second predetermined value;

row validity determining means, operable when reading a particular row of said reference table, including means to determine whether or not the window-memory pointers of said particular row are valid based on the value of the used bit of said particular row;

whereby every window-memory pointer need not be cleared to an otherwise illegal value prior ro each operation of said compression/decompression apparatus.

94. In an apparatus for hash-based data compression/decompression, an improvement wherein said apparatus includes:

reference table means having more than one row, each said row being addressable by a particular hash value, each said row including a modulo count field of M bits, M being greater than one, and each said row being able to store one or more window-memory pointers;

reference-table clearing means, operable prior to the first operation of said compression/decompression apparatus, to initialize said modulo count field of every reference-table row to a first predetermined value;

modulo operation counter means of M bits, to generate and output a modulo operation count responsive to the number of operations of said compression/decompression apparatus;

reference-table updating means, operable when storing one or more window-memory pointers into a particular row of said reference table, including means to set the modulo operation field of said particular row to said modulo operation count;

row validity determining means, operable when reading a particular row of said reference table, including means to determine that the window-memory pointers of said particular row are valid based on the value of the modulo operation field of said particular row matching said modulo operation count;

whereby every window-memory pointer need not be cleared to an otherwise illegal value prior ro each operation of said compression/decompression apparatus.

95. In an adaptive, lossless, single-pass, general-purpose compression method for compressing an input stream of a finite number of K-bit digital bytes, an improvement comprising:

storing up-to-M most recent bytes of the input stream in a window memory;

hashing the most-recent two bytes of the input stream to generate hash values;

holding in a reference table addressable by the hash values, at least one pointer for the input stream for each reference table address, each pointer pointing to a sequence of two bytes within the window memory that generates the hash value that addresses the respective reference table location of said pointers;

the hash values having the characteristic that for any possible value of a first of the two bytes, every possible value of the second of the two bytes will hash to a unique table address;

comparing to verify one or more matches between the current input-byte sequence and any of the window byte sequences pointed to by a pointer having a reference table address given by the hash value of the most recent two bytes by comparing the first of the two bytes with the corresponding byte of each byte sequence pointed to by a pointer having a reference table address given by the hash value.

96. In an adaptive, lossless, single-pass, general-purpose compression method for compressing an input stream of a finite number of K-bit digital bytes, an improvement comprising:

storing up-to-M most recent bytes of the input stream in a window memory;

hashing the most-recent two bytes of the input stream to generate hash values;

holding in a reference table addressable by the hash values, at least one pointer for the input stream for each reference table address, each pointer pointing to a sequence of two bytes within the window memory that generates the hash value that addresses the respective reference table location of said pointers;

the hash values having the characteristic that for any possible value of a first of the two bytes, every possible value of the second of the two bytes will hash to a unique table address;

comparing to verify one or more matches between the current input-byte sequence and any of the window byte sequences pointed to by a pointer having a reference table address given by the hash value of the most recent two bytes by comparing the second of the two bytes of the input stream to be be received with the corresponding byte of each byte sequence pointed to by a pointer having a reference table address given by the hash value.

* * * * *